(12) United States Patent
Kim et al.

(10) Patent No.: US 11,621,307 B2
(45) Date of Patent: Apr. 4, 2023

(54) FLEXIBLE ORGANIC LIGHT EMITTING DISPLAY DEVICE INCLUDING A CONNECTION STRUCTURE DISPOSED IN A PAD REGION

(71) Applicant: SAMSUNG DISPLAY CO., LTD., Yongin-si (KR)

(72) Inventors: Kiwook Kim, Hwaseong-si (KR); Wonkyu Kwak, Seongnam-si (KR); Kwang-Min Kim, Seoul (KR); Joong-Soo Moon, Hwaseong-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 5 days.

(21) Appl. No.: 17/140,284

(22) Filed: Jan. 4, 2021

(65) Prior Publication Data

US 2021/0126058 A1 Apr. 29, 2021

Related U.S. Application Data

(62) Division of application No. 15/982,526, filed on May 17, 2018, now Pat. No. 10,937,842.

(30) Foreign Application Priority Data

Nov. 29, 2017 (KR) .......................... 10-2017-0161861

(51) Int. Cl.
*G06F 3/047* (2006.01)
*H01L 27/32* (2006.01)
(Continued)

(52) U.S. Cl.
CPC ............ *H01L 27/323* (2013.01); *G06F 3/047* (2013.01); *G06F 3/0412* (2013.01);
(Continued)

(58) Field of Classification Search
CPC . G06F 2203/04102; G06F 2203/04103; G06F 3/0412; G06F 3/04164;
(Continued)

(56) References Cited

U.S. PATENT DOCUMENTS 5,717,556 A * 2/1998 Yanagida ............... H05K 1/028
174/254
9,626,027 B2 4/2017 Han et al.
(Continued)

FOREIGN PATENT DOCUMENTS

KR 10-2015-0033165 4/2014
KR 10-2014-0129498 11/2014
(Continued)

OTHER PUBLICATIONS

Korean Office Action dated Apr. 6, 2022 from the Korean Intellectual Property Office (KIPO) issued in corresponding Korean Patent Application No. 10-2017-0161861.

*Primary Examiner* — Ram A Mistry
(74) *Attorney, Agent, or Firm* — F. Chau & Associates, LLC

(57) ABSTRACT

An OLED device includes a substrate including a display region including a pixel region and a peripheral region surrounding the pixel region. A pad region is spaced apart from the display region, and a bending region is disposed between the display region and the pad region. A plurality of pixel structures are disposed in the pixel region on the substrate. A touch screen structure is disposed on the pixel structures. A plurality of touch screen wirings are disposed in the bending region on the substrate. The touch screen wirings are electrically connected the touch screen structure. A connection structure is in the pad region. The connection structure electrically connects touch screen wirings to each
(Continued)

other. A same touch sensing signal is applied to touch screen wirings that are connected to each other.

11 Claims, 35 Drawing Sheets

(51) Int. Cl.
  *H01L 51/56* (2006.01)
  *H01L 51/52* (2006.01)
  *H01L 51/00* (2006.01)
  *G06F 3/041* (2006.01)
  *G06F 3/044* (2006.01)

(52) U.S. Cl.
  CPC ........ *G06F 3/0443* (2019.05); *G06F 3/04164* (2019.05); *H01L 27/3246* (2013.01); *H01L 51/0097* (2013.01); *H01L 51/5203* (2013.01); *H01L 51/5237* (2013.01); *H01L 51/56* (2013.01); *G06F 2203/04102* (2013.01); *G06F 2203/04103* (2013.01); *H01L 27/3276* (2013.01)

(58) Field of Classification Search
  CPC ..... G06F 3/0443; G06F 3/047; H01L 27/323; H01L 27/3246; H01L 27/3276; H01L 51/0097; H01L 51/5203; H01L 51/5237; H01L 51/56
  See application file for complete search history.

(56) References Cited

U.S. PATENT DOCUMENTS

| | | |
|---|---|---|
| 9,711,570 B1 | 7/2017 | Lee et al. |
| 10,268,296 B2 | 4/2019 | Choi et al. |
| 2007/0074914 A1 | 4/2007 | Geaghan et al. |
| 2009/0102774 A1 | 4/2009 | Hattori |
| 2014/0145979 A1 | 5/2014 | Lee |
| 2018/0182838 A1* | 6/2018 | Yeo ..................... H01L 51/5253 |
| 2019/0165048 A1 | 5/2019 | Kim et al. |

FOREIGN PATENT DOCUMENTS

| | | |
|---|---|---|
| KR | 10-2015-0077205 | 7/2015 |
| KR | 10-2017-0106621 | 9/2017 |

* cited by examiner

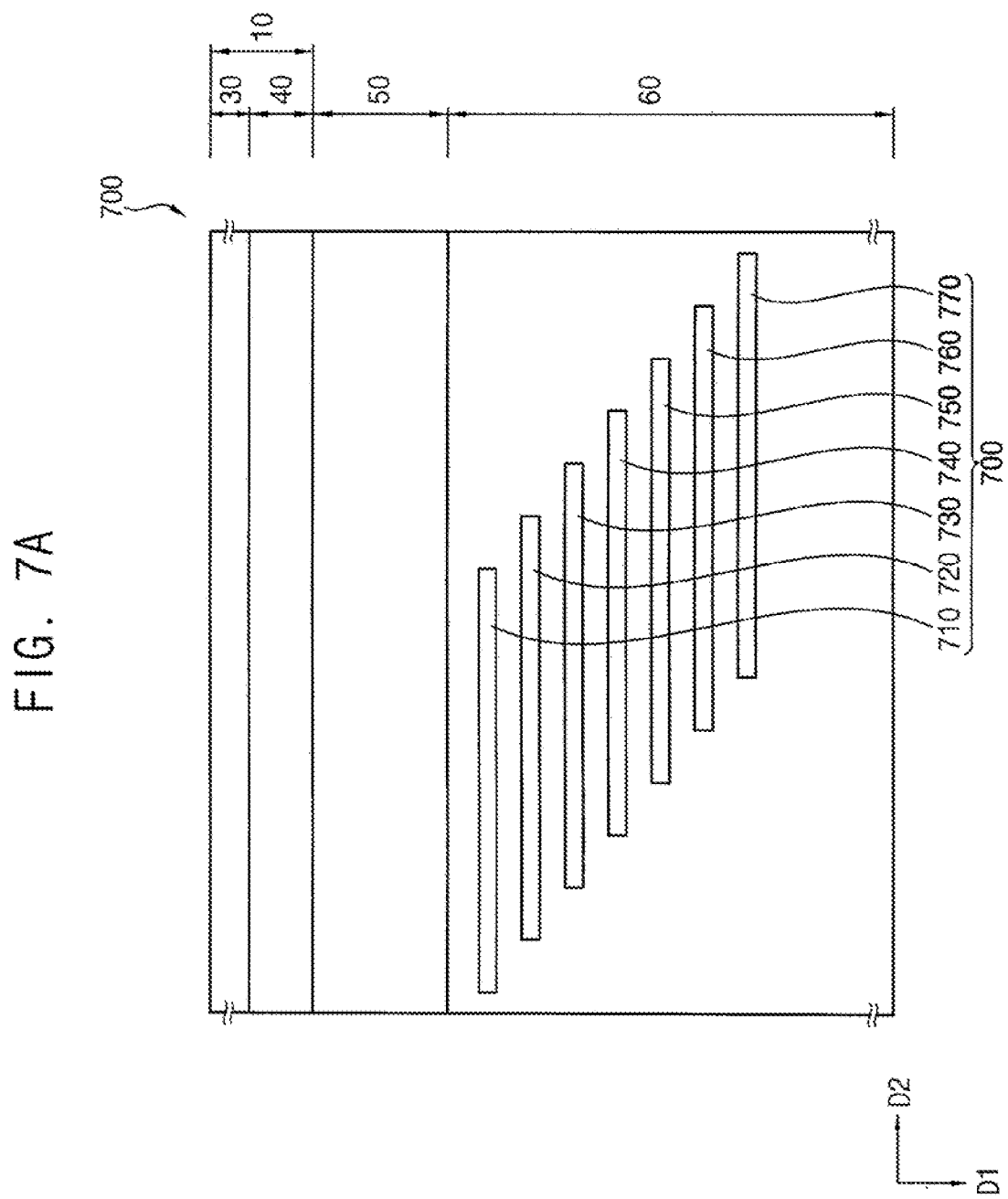

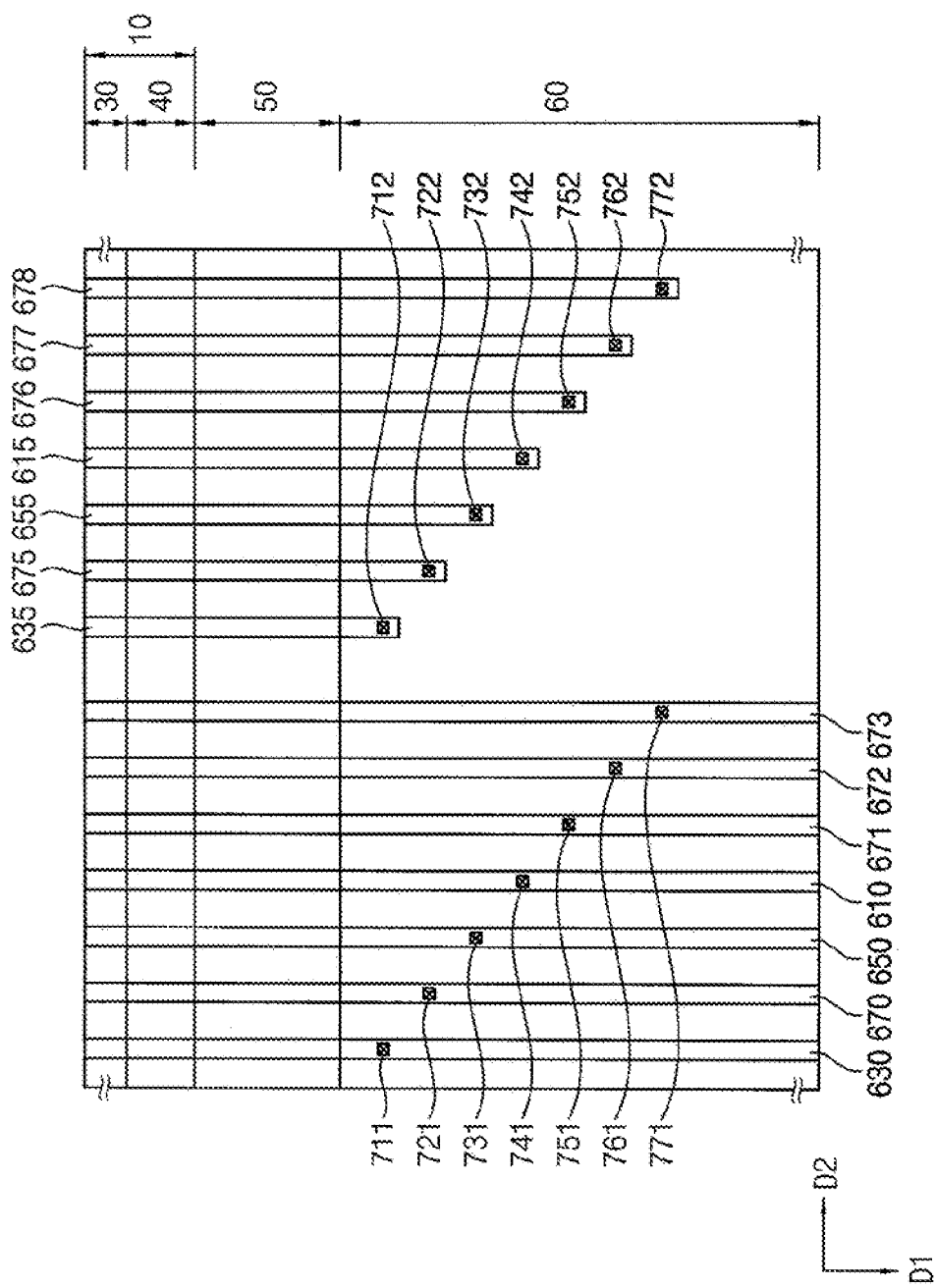

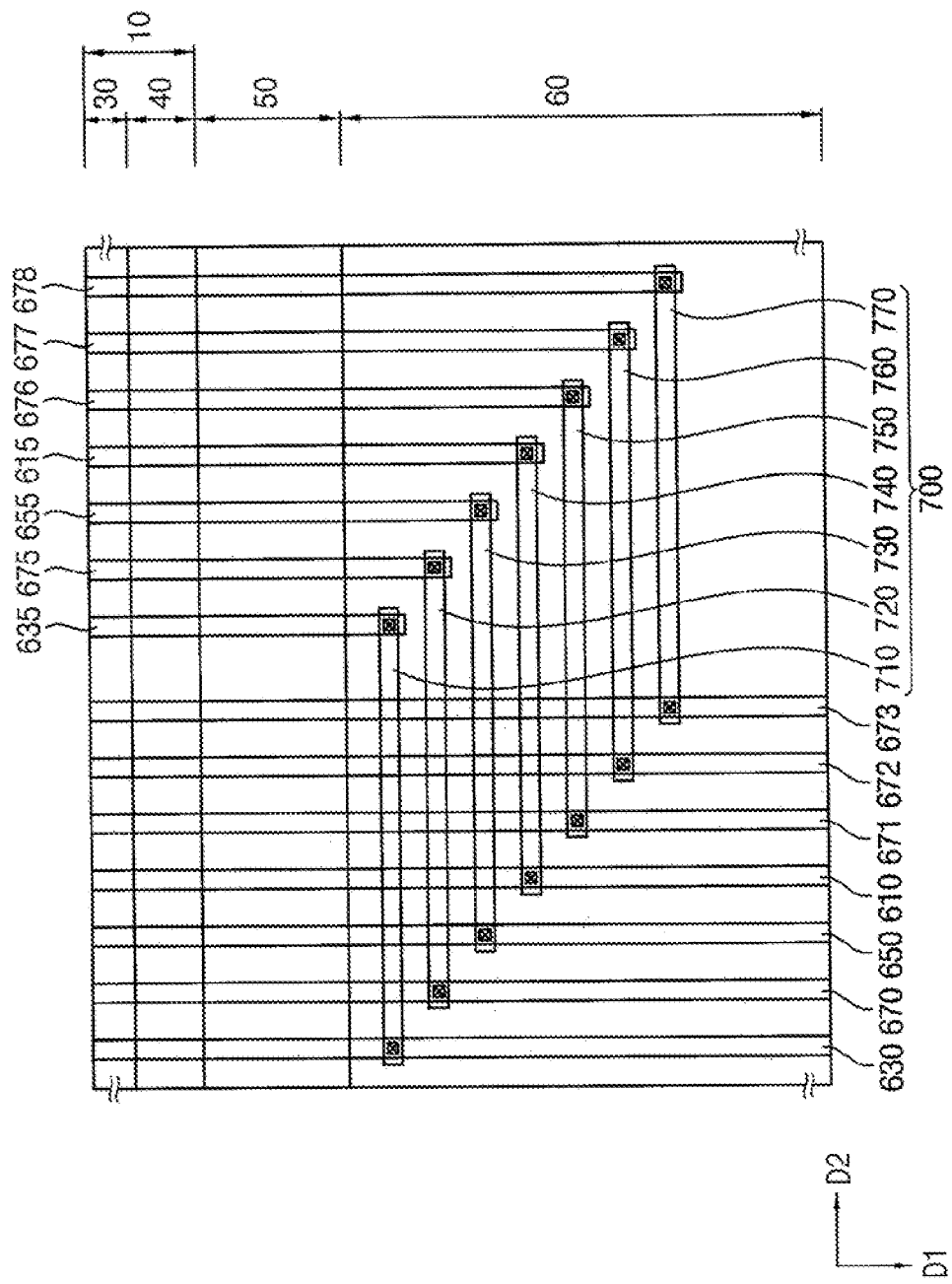

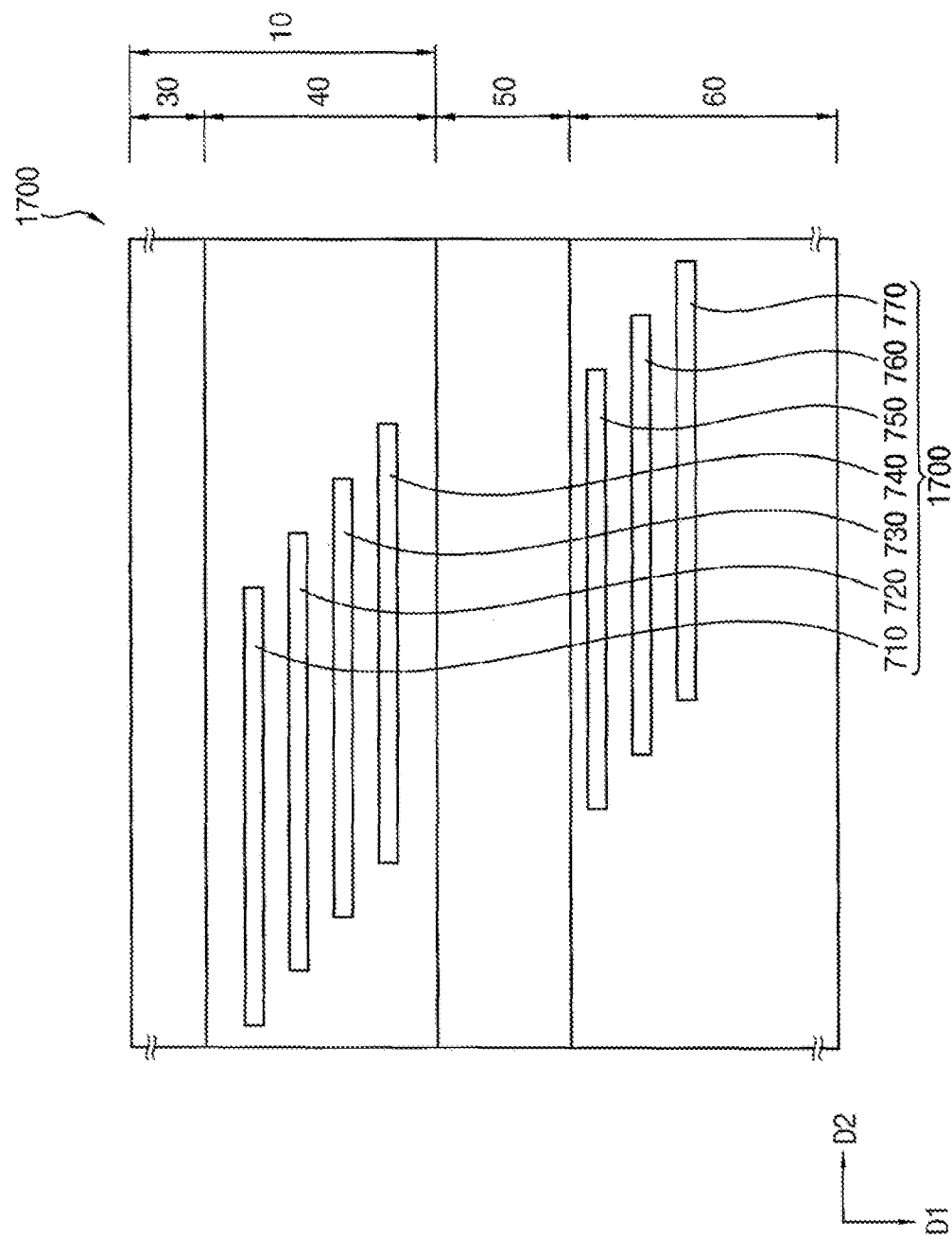

FLEXIBLE ORGANIC LIGHT EMITTING DISPLAY DEVICE INCLUDING A CONNECTION STRUCTURE DISPOSED IN A PAD REGION

CROSS-REFERENCE TO RELATED APPLICATIONS

This application is a Divisional of U.S. patent application Ser. No. 15/982,526 filed on May 17, 2018, which claims priority under 35 USC § 119 to Korean Patent Applications No. 10-2017-0161861, filed on Nov. 29, 2017 in the Korean Intellectual Property Office (KIPO), the disclosures of which are incorporated by reference herein in their entireties.

TECHNICAL FIELD

Exemplary embodiments of the present invention relate to an organic light emitting display device, and more particularly to a flexible organic light emitting display device.

DISCUSSION OF RELATED ART

A flat panel display (FPD) device may be included in an electronic device. The FPD device may be relatively lightweight and relatively thin compared to a cathode-ray tube (CRT) display device. Examples of the FPD device include a liquid crystal display (LCD) device and an organic light emitting display (OLED) device.

A flexible OLED device may be capable of bending or folding a portion of the OLED device by including lower and upper substrates, which have flexible materials, in the OLED device. For example, the lower substrate may be a flexible substrate, and the upper substrate may have a thin film encapsulation structure. The OLED device may further include a touch screen structure disposed on the thin film encapsulation structure. The touch screen structure may include sensing electrodes to detect a contact (e.g., a finger of a user, or a touch pen) of the user of the OLED device. For example, the touch screen structure may detect the contact (or an input) of the user by using a detection method using a self-capacitance, or a detection method using a mutual-capacitance. Accordingly, when the user is in contact with the front of the OLED device, the OLED device may detect the contact of the user. The touch screen structure employing mutual-capacitance may be relatively thin and touch sensitivity of the screen structure may be relatively high in a touch screen of an OLED having a single layer. When the touch screen structure includes a single layer, the number of touch screen wirings connected to the sensing electrodes may be relatively high.

SUMMARY

An exemplary embodiment of the present invention provides a flexible organic light emitting display (OLED) device.

According to an exemplary embodiment of the present invention, an OLED device includes a substrate including a display region including a pixel region and a peripheral region surrounding the pixel region. A pad region is spaced apart from the display region, and a bending region is disposed between the display region and the pad region. A plurality of pixel structures are disposed in the pixel region on the substrate. A touch screen structure is disposed on the plurality of pixel structures. A plurality of touch screen wirings are disposed in the bending region on the substrate. The touch screen wirings of the plurality of touch screen wirings are electrically connected the touch screen structure. A connection structure is in the pad region on the substrate. The connection structure electrically connects touch screen wirings of the plurality of touch screen wirings to each other. A same touch sensing signal among a plurality of touch sensing signals is applied to touch screen wirings of the plurality of touch screen wirings that are connected to each other.

In an exemplary embodiment of the present invention, when the OLED device is bent, the bending region may have a round shape.

In an exemplary embodiment of the present invention, when the OLED device is bent, the connection structure disposed in the pad region may overlap the display region.

In an exemplary embodiment of the present invention, the OLED device may include pad electrodes disposed in the pad region. The pad electrodes may be spaced apart from the connection structure in a first direction. The pad electrodes may be electrically connected to an external device.

In an exemplary embodiment of the present invention, the external device may provide the touch sensing signals to the touch screen structure through the pad electrodes.

In an exemplary embodiment of the present invention, the connection structure may include a plurality of connection electrodes. The connection electrodes of the plurality of connection electrodes may extend in a second direction that is perpendicular to the first direction, and may be spaced apart from each other in the first direction.

In an exemplary embodiment of the present invention, a connection electrode among the plurality of connection electrodes may electrically connect touch screen wirings of the plurality of touch screen wirings to each other. The same touch sensing signal among the plurality of touch screen wirings applied to the touch screen wirings that are connected to each other may be applied via contact holes.

In an exemplary embodiment of the present invention, one touch screen wiring among the plurality of touch screen wirings, to which the same touch sensing signal is applied, may cross the connection electrode among the plurality of connection electrodes. The one touch screen wiring may extend in the first direction, and may be in direct contact with a pad electrode of the pad electrodes.

In an exemplary embodiment of the present invention, the connection electrode may be in direct contact with touch screen wirings of the plurality of touch screen wirings that are connected to each other, to which the same touch sensing signal is applied. The same touch sensing signal may be applied via at least two contact holes.

In an exemplary embodiment of the present invention, the connection electrode may be disposed under the plurality of touch screen wiring.

In an exemplary embodiment of the present invention, the plurality of touch screen wirings may include first through (N)th touch screen wirings, where N is an integer greater than 1. The first through (N)th touch screen wirings may extend in the first direction, and may be spaced apart from each other at the bending region in a second direction that is perpendicular to the first direction.

In an exemplary embodiment of the present invention, the connection structure may include first through (M)th connection electrodes, where M is an integer greater than 1. The first through (M)th connection electrodes may extend in the second direction, and may be spaced apart from each other in the first direction.

In an exemplary embodiment of the present invention, (K)th and (J)th touch screen wirings, to which the same touch sensing signal is applied, among the first through (N)th touch screen wirings may be electrically connected to an (L)th connection electrode among the first through (M)th connection electrodes via contact holes, where K and J are different integers between 1 and N, and L is integer between 1 and M.

In an exemplary embodiment of the present invention, the (K)th touch screen wiring may cross the (L)th connection electrode. The (K)th touch screen wiring may extend in the first direction, and may be in direct contact with a pad electrode of the pad electrodes. The (J)th touch screen wiring need not be in direct contact with the pad electrode of the pad electrodes.

In an exemplary embodiment of the present invention, the OLED device may include a plurality of semiconductor elements disposed between the substrate and the plurality of pixel structures. A semiconductor element of the plurality of semiconductor elements may be electrically connected to a pixel structure of the plurality of pixel structures.

In an exemplary embodiment of the present invention, each of the semiconductor elements may include an active layer disposed in the pixel region on the substrate. A gate insulation layer may be disposed on the active layer. A gate electrode may be disposed on the gate insulation layer. An insulating interlayer may be disposed on the gate electrode. Source and drain electrodes may be disposed on the insulating interlayer.

In an exemplary embodiment of the present invention, the gate insulation layer and the insulating interlayer may have an opening located in the bending region.

In an exemplary embodiment of the present invention, the connection structure and the source and drain electrodes may be located at a same layer as each other.

In an exemplary embodiment of the present invention, the OLED device may include a planarization layer disposed between the plurality of semiconductor elements and the plurality of pixel structures.

In an exemplary embodiment of the present invention, the planarization layer may have a first contact hole exposing a first region of the connection structure in the pad region and a second contact hole exposing a second region of the connection structure.

In an exemplary embodiment of the present invention, a first touch screen wiring among the plurality of touch screen wirings, to which the same touch sensing signal among the plurality of touch sensing signals is applied, may be in direct contact with the first region of the connection structure via the first contact hole. A second touch screen wiring among the plurality of touch screen wirings, to which the same touch sensing signal among the plurality of touch sensing signals is applied, may be in direct contact with the second region of the connection structure via the second contact hole.

In an exemplary embodiment of the present invention, the first touch screen wiring among the plurality of touch screen wirings may substantially fill the first contact hole and extend in the first direction, and the first touch screen wiring among the plurality of touch screen wirings may cross the connection electrode. The second touch screen wiring among the plurality of touch screen wirings may substantially fill the second contact hole. An extending distance of the first touch among the plurality of touch screen wirings screen wiring may be greater than a distance of the second touch screen wiring among the plurality of touch screen wirings in the pad region.

In an exemplary embodiment of the present invention, the OLED device may include pad electrodes disposed in the pad region on the substrate. The pad electrodes may be located at a same layer with the source and drain electrodes and the connection structure, and may be spaced apart from the connection structure.

In an exemplary embodiment of the present invention, the first touch screen wiring among the plurality of touch screen wirings may cross the connection structure, and may be in direct contact with a pad electrode of the pad electrodes. The second touch screen wiring among the plurality of touch screen wirings need not be in direct contact with the pad electrode of the pad electrodes.

In an exemplary embodiment of the present invention, the OLED device may further include a thin film encapsulation structure disposed between the pixel structure and the touch screen structure.

In an exemplary embodiment of the present invention, the thin film encapsulation structure may include a first thin film encapsulation layer disposed on the pixel structure. The first thin film encapsulation layer may include inorganic materials having flexibility. A second thin film encapsulation layer may be disposed on the first thin film encapsulation layer. The second thin film encapsulation layer may include organic materials having flexibility. A third thin film encapsulation layer may be disposed on the second thin film encapsulation layer. The third thin film encapsulation layer may include the inorganic materials having flexibility.

In an exemplary embodiment of the present invention, the touch screen structure may include a sensing electrode and at least two sub-sensing electrodes. The sensing electrode may be disposed on the thin film encapsulation structure. The at least two sub-sensing electrodes may be disposed at a same layer with the sensing electrode, and may be located adjacent to the sensing electrode.

In an exemplary embodiment of the present invention, the touch screen structure may include first through (N)th sensing electrodes and first through (M)th sub-sensing electrodes. The first through (N)th sensing electrodes may be disposed on the thin film encapsulation structure, where N is an integer greater than 1. The first through (M)th sub-sensing electrodes may be disposed at a same layer with the first through (N)th sensing electrodes, and may be located adjacent to the first through (N)th sensing electrodes, where N is an integer greater than 1.

In an exemplary embodiment of the present invention, a (K)th sensing electrode among the first through (N)th sensing electrodes together with (D)th, (E)th, and (F)th sub-sensing electrodes among the first through (M)th sub-sensing electrodes, where K is an integer between 1 and N, and D, E, and F are different integers between 1 and M, may be defined as an (S)th sensing electrode group among first through (R)th sensing electrode groups, where R is an integer greater than 1, and S is an integer between 1 an R. The first through (R)th sensing electrode groups may be arranged in X rows and Y columns, where X and Y are integers greater than 1.

In an exemplary embodiment of the present invention, the touch screen wirings may include first through (P)th touch screen wirings electrically connecting each of the first through (N)th sensing electrodes and the first through (M)th sub-sensing electrodes to each other, where P is an integer greater than 1.

In an exemplary embodiment of the present invention, the first through (R)th sensing electrode groups may include (W)th, (W+1)th. (W+2)th and (W+3)th sensing electrode groups, which are located at a same column, among the first through (R)th sensing electrode groups, where W is integer between 1 and R. The (W)th sensing electrode group may include the (K)th sensing electrode and the (D)th, (E)th, and (F)th sub-sensing electrodes. The (W+1)th sensing electrode group may include a (K+1)th sensing electrode and (D+1)th, (E+1)th, and (F+1)th sub-sensing electrodes. The (W+2)th sensing electrode group may include a (K+2)th sensing electrode and (D+2)th, (E+2)th, and (F+2)th sub-sensing electrodes. The (W+3)th sensing electrode group may include the (K+3)th sensing electrode and (D+3)th, (E+3)th, and (F+3)th sub-sensing electrodes.

In an exemplary embodiment of the present invention, an (A)th touch screen wiring among the first through (P)th touch screen wirings may electrically connect i) the (D)th sub-sensing electrode of the (W)th sensing electrode group and the (F+1)th sub-sensing electrode of the (W+1)th sensing electrode group, ii) the (F+1)th sub-sensing electrode of the (W+1)th sensing electrode group and the (D+2)th sub-sensing electrode of the (W+2)th sensing electrode group, and iii) the (D+2)th sub-sensing electrode of the (W+2)th sensing electrode group and the (F+3)th sub-sensing electrode of the (W+3)th sensing electrode group, where A is an integer between 1 and P. The (A)th touch screen wiring may extend from the display region into the pad region.

In an exemplary embodiment of the present invention, a (B)th touch screen wiring among the first through (P)th touch screen wirings may electrically connect i) the (E)th sub-sensing electrode of the (W)th sensing electrode group and the (E+1)th sub-sensing electrode of the (W+1)th sensing electrode group, ii) the (E+1)th sub-sensing electrode of the (W+)th sensing electrode group and the (E+2)th sub-sensing electrode of the (W+2)th sensing electrode group, and iii) the (E+2)th sub-sensing electrode of the (W+2)th sensing electrode group and the (E+3)th sub-sensing electrode of the (W+3)th sensing electrode group, where B is an integer between 1 and P. The (B)th touch screen wiring may extend from the display region into the pad region.

In an exemplary embodiment of the present invention, a (C)th touch screen wiring among the first through (P)th touch screen wirings may electrically connect i) the (F)th sub-sensing electrode of the (W)th sensing electrode group and the (D+1)th sub-sensing electrode of the (W+1)th sensing electrode group, ii) the (D+1)th sub-sensing electrode of the (W+1)th sensing electrode group and the (F+2)th sub-sensing electrode of the (W+2)th sensing electrode group, and iii) the (F+2)th sub-sensing electrode of the (W+2)th sensing electrode group and the (D+3)th sub-sensing electrode of the (W+3)th sensing electrode group, where C is an integer between 1 and P. The (C)th touch screen wiring may extend from the display region into the pad region.

In an exemplary embodiment of the present invention, each of the (A), (B), and (C) touch screen wirings may be electrically connected to each of the touch screen wirings to which a same touch sensing signal of the plurality of touch sensing signals is applied as a touch sensing signal applied to each of the (A), (B), and (C) touch screen wirings. The touch sensing signal applied to each of the (A), (B), and (C) touch screen wirings may be applied in the pad region through the connection structure.

In an exemplary embodiment of the present invention, the first through (R)th sensing electrode groups may include the (W)th and a (Q)th sensing electrode groups, which are located at the same row, among the first through (R)th sensing electrode groups, where Q is integer greater than 1. The (Q)th sensing electrode group may include a (K+4) sensing electrode and the (D+4)th, (E+4)th, and (F+4)th sub-sensing electrodes.

In an exemplary embodiment of the present invention, a (G)th touch screen wiring among the first through (P)th touch screen wirings may be electrically connected to the (K)th sensing electrode of the (W)th sensing electrode group, where G is integer between 1 and P. The (G)th touch screen wiring may extend from the display region into the pad region.

In an exemplary embodiment of the present invention, a (H)th touch screen wiring among the first through (P)th touch screen wirings may be electrically connected to the (K+3)th sensing electrode of the (W+3)th sensing electrode group, where H is integer between 1 and P. The (G)th touch screen wiring may extend from the display region into the pad region.

In an exemplary embodiment of the present invention, the (G)th and (H)th touch screen wirings may be electrically connected in the pad region through the connection structure. The same touch sensing signal may be applied to the (G)th and (H)th touch screen wirings.

In an exemplary embodiment of the present invention, the OLED device may further include pad electrodes disposed in the pad region on the substrate. The pad electrodes may be located at a same layer with the connection structure, and may be spaced apart from the connection structure.

In an exemplary embodiment of the present invention, the (G)th touch screen wiring may cross the connection structure, and may be in direct contact with a pad electrode of the pad electrodes. The (H)th touch screen wiring need not be in contact with the pad electrode of the pad electrodes.

In an exemplary embodiment of the present invention, the connection structure may include a first connection structure and a second connection structure. The first connection structure may be disposed in the pad region, and the second connection structure may be disposed in the peripheral region.

According to an exemplary embodiment of the present invention, an OLED device includes a substrate having a display region including a pixel region and a peripheral region surrounding the pixel region. A pad region is spaced apart from the display region. A bending region is disposed between the display region and the pad region. A plurality of pixel structures are disposed in the pixel region on the substrate. A touch screen structure is disposed on the plurality of pixel structures. A plurality of touch screen wirings are in the pixel region and the peripheral region on the substrate. The touch screen wirings of the plurality of touch screen wirings are electrically connected to the touch screen structure. The plurality of connection wirings are in the peripheral region, the bending region, and the pad region on the substrate. The connection wirings of the plurality of connection wirings electrically connect the touch screen wirings of the plurality of touch screen wirings to each other. The connection structure is disposed in the pad region on the substrate. The connection structure electrically connects connection wirings of the plurality of connection wirings to each other. A same touch sensing signal among a plurality of touch sensing signals is applied to connection wirings of the plurality of connection wirings that are connected to each other.

In an exemplary embodiment of the present invention, the OLED device may include pad electrodes disposed in the pad region. The pad electrodes may be spaced apart from the connection structure in a first direction. The pad electrodes may be electrically connected to an external device.

In an exemplary embodiment of the present invention, the external device may provide touch sensing signals to the touch screen structure through the pad electrodes.

In an exemplary embodiment of the present invention, each of the connection wirings of the plurality of connection wirings may overlap a portion of each of the plurality of touch screen wirings in the peripheral region located adjacent to the bending region.

In an exemplary embodiment of the present invention, each of the connection wirings of the plurality of connection wirings may connect touch screen wirings of the plurality of touch screen wirings to each other through a contact hole.

In an exemplary embodiment of the present invention, touch screen wirings of the plurality of touch screen wirings may be disposed directly on connection wirings of the plurality of connection wirings.

In an exemplary embodiment of the present invention, the connection structure may include a plurality of connection electrodes. Each of the connection electrodes of the plurality of connection electrodes may include a first extension extending in a first direction from the display region into the pad region and a second extension extending in a second direction that is perpendicular to the first direction.

In an exemplary embodiment of the present invention, each of the connection wirings of the plurality of connection wirings may overlap a portion of each of the connection electrodes of the plurality of connection electrodes the in the pad region.

In an exemplary embodiment of the present invention, one connection electrode among the plurality of connection electrodes electrically may connect connection wirings among the plurality of connection wirings to which the same touch sensing signal among the plurality of touch sensing signals is applied to each other. The connection wirings among the plurality of connection wirings to which the same touch sensing signal among the plurality of touch sensing signals is applied may be connected to each other via contact holes.

In an exemplary embodiment of the present invention, the one connection electrode may be in direct contact with the connection wirings among the plurality of connection wirings to which the same touch sensing signal among the plurality of touch sensing signals is applied via at least two contact holes.

In an exemplary embodiment of the present invention, connection electrodes of the plurality of connection electrodes may be disposed on connection wirings of the plurality of connection wirings.

In an exemplary embodiment of the present invention, the first extension of a connection electrode of the plurality of connection electrodes to which the same touch sensing signal among the plurality of touch sensing signals is applied may extend in the first direction, and may be in direct contact with a pad electrode of the pad electrodes.

The OLED device according to an exemplary embodiment of the present invention may include the connection structure disposed in the pad region, and thus a size of the peripheral region may be reduced to be relatively small. Accordingly, a dead space of the OLED device may be reduced, and the OLED device may serve as a touch display device including the touch screen structure.

BRIEF DESCRIPTION OF THE DRAWINGS

A more complete appreciation of the present invention will become more apparent by describing in detail exemplary embodiments thereof with reference to the accompanying drawings, in which:

FIGS. 7A, 7B, and 8 are plan views of a connection structure and touch screen wirings included in the OLED device of FIG. 1;

FIGS. 11, 12, 13A, 13B, 14, 15A, 15B, 15C, 16, 17A, 17B, 17C, 17D and 17E are cross-sectional views of a method of manufacturing an OLED device in accordance with an exemplary embodiment of the present invention;

FIGS. 19A, 19B, and 20 are plan views of a connection structure and touch screen wirings included in the OLED device of FIG. 18;

DETAILED DESCRIPTION OF THE EMBODIMENTS

Figure 1:
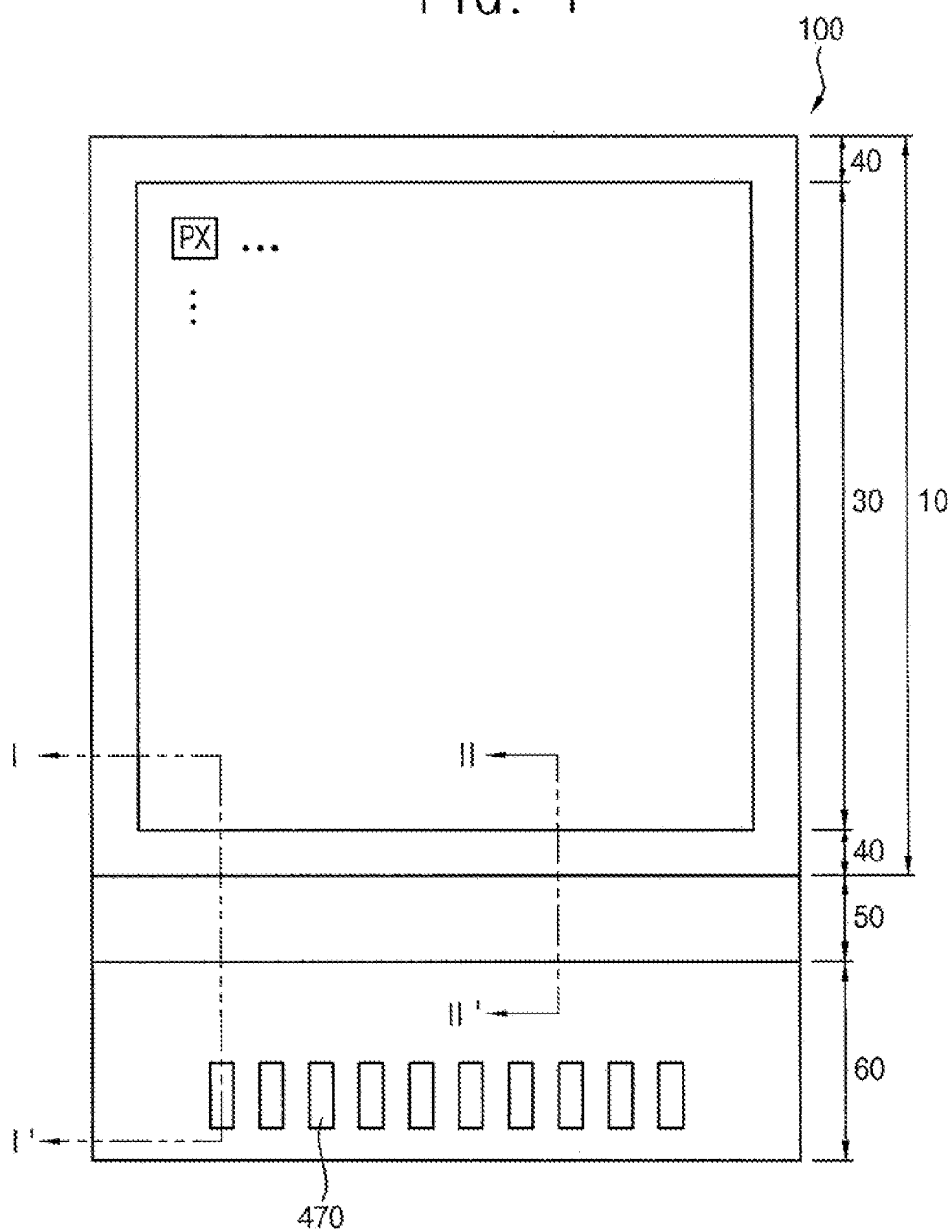
FIG. 1 is a plan view of an organic light emitting display (OLED) device in accordance with an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

Figure 2:
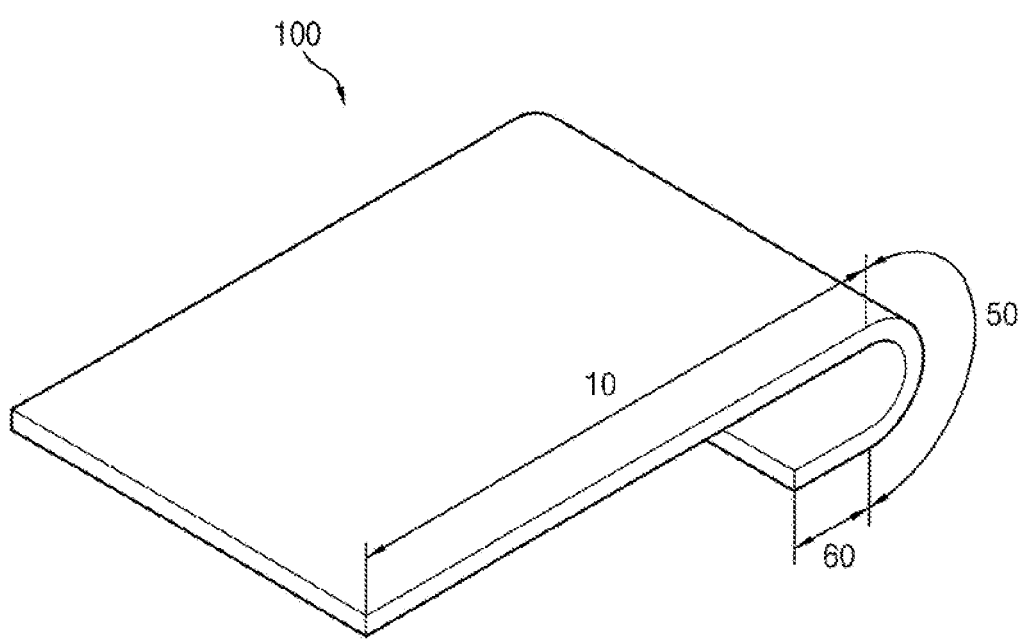
FIG. 2 is a perspective view of a bent shape of the OLED device of FIG. 1.
Figure 3:
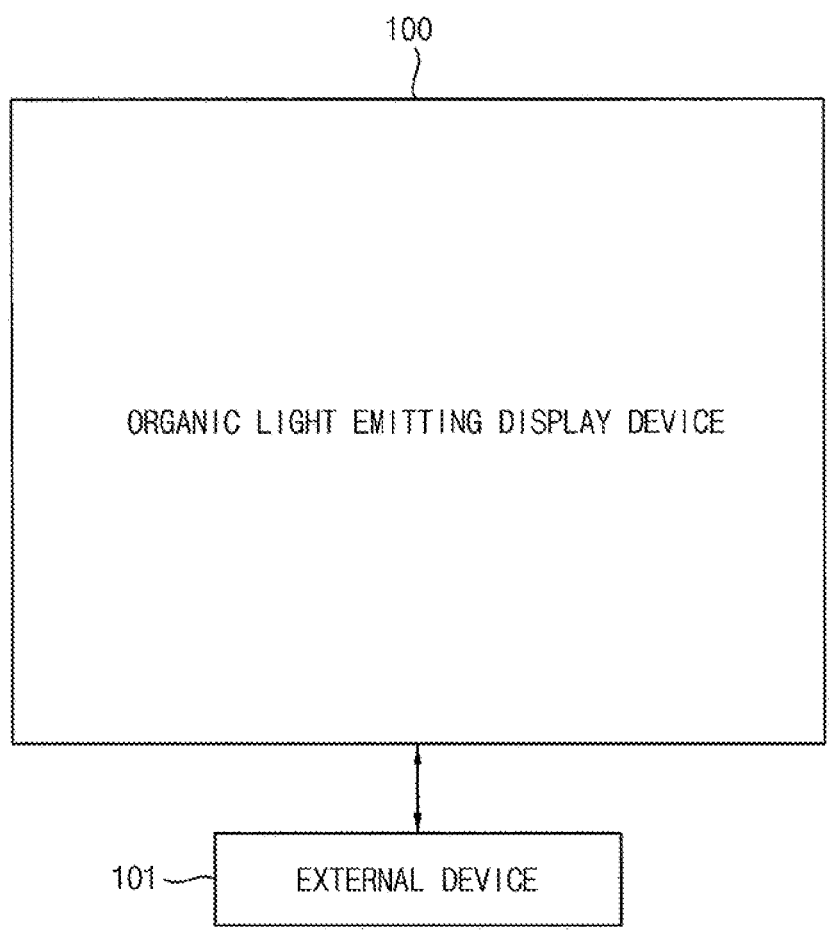
FIG. 3 is a block diagram of an external device electrically connected to the OLED device of FIG. 1.

FIG. 1 is a plan view of an organic light emitting display (OLED) device in accordance with an exemplary embodiment of the present invention. FIG. 2 is a perspective view of a bent shape of the OLED device of FIG. 1. FIG. 3 is a block diagram of an external device electrically connected to the OLED device of FIG. 1.

Referring to FIGS. 1, 2, and 3, an OLED device 100 may have a display region 10, a bending region 50, and a pad region 60. The display region 10 may include a pixel region 30 and a peripheral region 40 surrounding the pixel region 30. A plurality of pixels PX may be disposed in the display region 10, and the pad region 60 may be spaced apart from the display region 10. Pad electrodes 470 that are electrically connected to an external device 101 may be disposed in the pad region 60. The bending region 50 may be disposed between the display region 10 and the pad region 60. The display region 10, the bending region 50, and the pad region 60 may be sequentially continuously arranged.

In an exemplary embodiment of the present invention, the pixels PX (e.g., pixel structures) emitting a light may be disposed in the pixel region 30, and a plurality of wirings may be disposed in the peripheral region 40. The wirings may electrically connect the pad electrodes 470 and the pixels PX. For example, the wirings may include data signal wirings, scan signal wirings, light emission signal wirings, power supply voltage wirings, or touch screen wirings. A scan driver or a data driver may be disposed in the peripheral region 40. At least a portion of the peripheral region 40 may be disposed between the pixel region 30 and the bending region 50. Alternatively, a portion of the peripheral region 40 may overlap a portion of the bending region 50. The peripheral region 40 may occupy a relatively small area around the display region 10, as described below in more detail. Thus, a dead space of the OLED device 100 may be reduced according to an exemplary embodiment of the present invention.

In an exemplary embodiment of the present invention, a width of the peripheral region 40 surrounding the pixel region 30 may be substantially the same on each side of the pixel region 30, but exemplary embodiments of the present invention are not limited thereto. For example, a portion of the peripheral region 40 adjacent to or overlapping the bending region 50 may have a different size (e.g., may be smaller) than other portions of the peripheral region 40 around other sides of the pixel region 30.

Referring to FIG. 2, the bending region 50 may be bent on an axis along a second direction D2. The pad region 60 may be located on a lower surface of the OLED device 100. The second direction D2 may be perpendicular to a first direction D1. Each of the first and second directions D1 and D2 may be parallel to an upper surface of the OLED device 100. As an example, when the pad region 60 is located on the lower surface of the OLED device 100, the bending region 50 may have a round shape (or a bended or curved shape). In an exemplary embodiment of the present invention, the OLED device 100 may include a touch screen structure and touch screen wirings. The touch screen wiring may be electrically connected to the touch screen structure, and may overlap the touch screen structure in the bending region 50. The touch screen wirings may electrically connect sensing electrodes included in the touch screen structure and the pad electrodes 470. The sensing electrodes disposed in the display region 10 may be electrically connected to the external device 101 electrically connected to the pad electrodes 470 through the touch screen wirings disposed in the bending region 50. The OLED device 100 may include pixel structures and connection wirings. The pixel structure may be disposed in the pixel region 30, and the connection wirings may be disposed in bending region 50. The connection wirings may be electrically connected to the pixel structures. The connection wirings may electrically connect the data signal wirings, the scan signal wirings, the light emission signal wirings, the power supply voltage wirings, and the touch screen wiring to the pad electrodes 470. The pixels PX disposed in the pixel region 30 may be electrically connected to the external device 101 electrically connected to the pad electrodes 470 through the connection wirings disposed in the bending region 50 and wirings disposed in the peripheral region 40. For example, the external device 101 may be electrically connected to the OLED device 100 through a flexible printed circuit board (FPCB). The external device 101 may provide a data signal, a scan signal, a light emission signal, a power supply voltage, or touch sensing signal to the OLED device 100. A driving integrated circuit may be mounted (e.g., installed) on the FPCB. In an exemplary embodiment of the present invention, the driving integrated circuit may be mounted in the OLED device 100 that is located adjacent to the pad electrodes 470.

Figure 4:
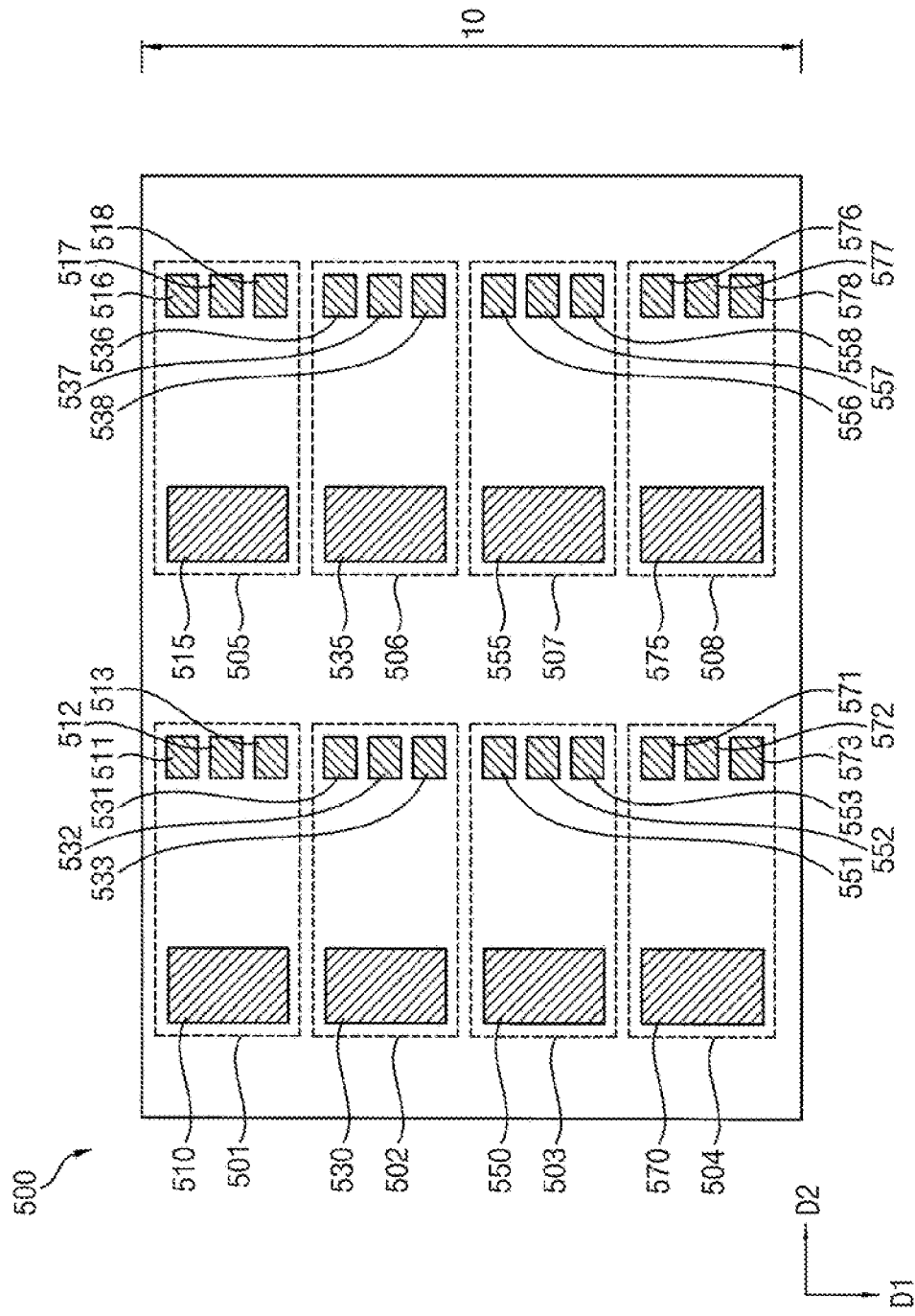
FIGS. 4, 5, and 6 are plan views of a touch screen structure and touch screen wirings included in the OLED device of FIG. 1.
Figure 5:
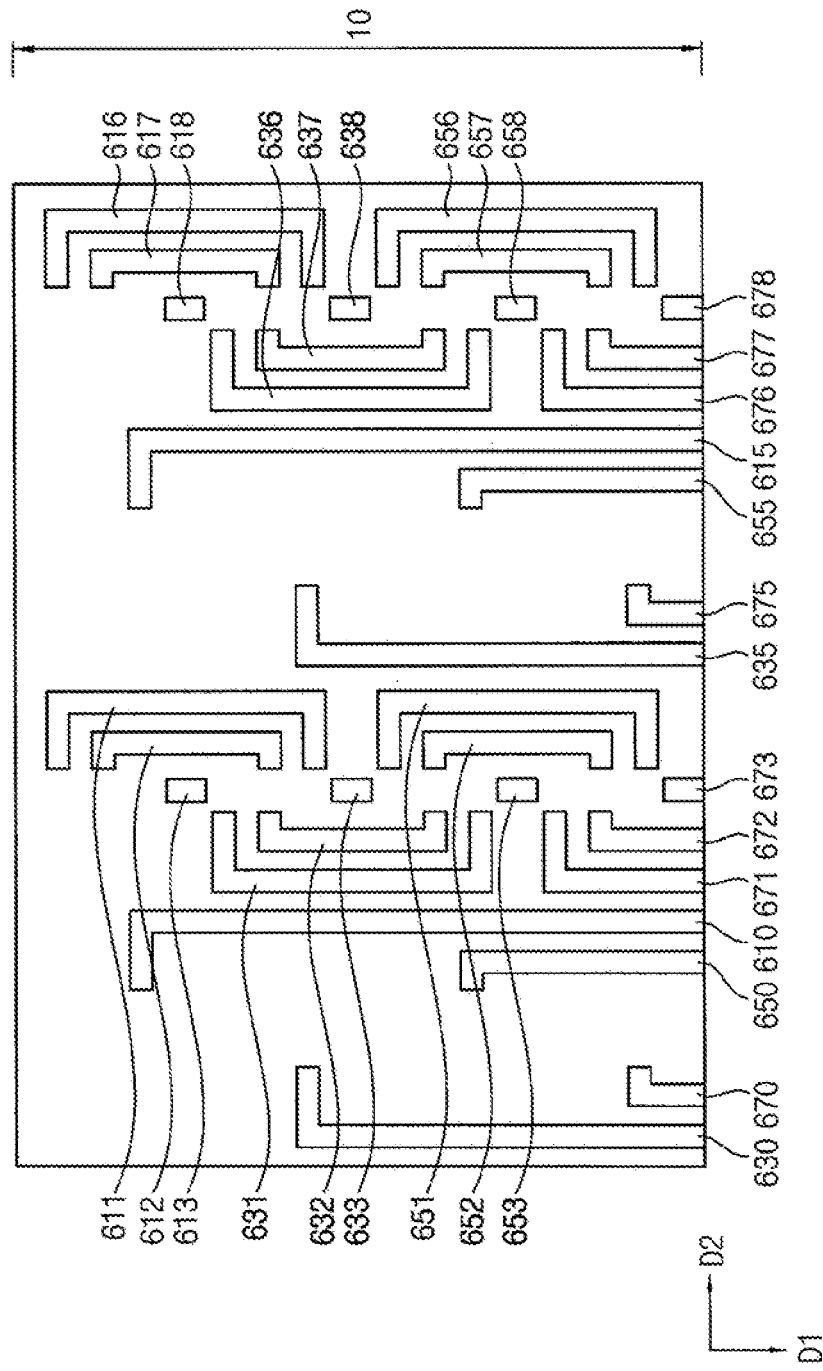
Figure 6:
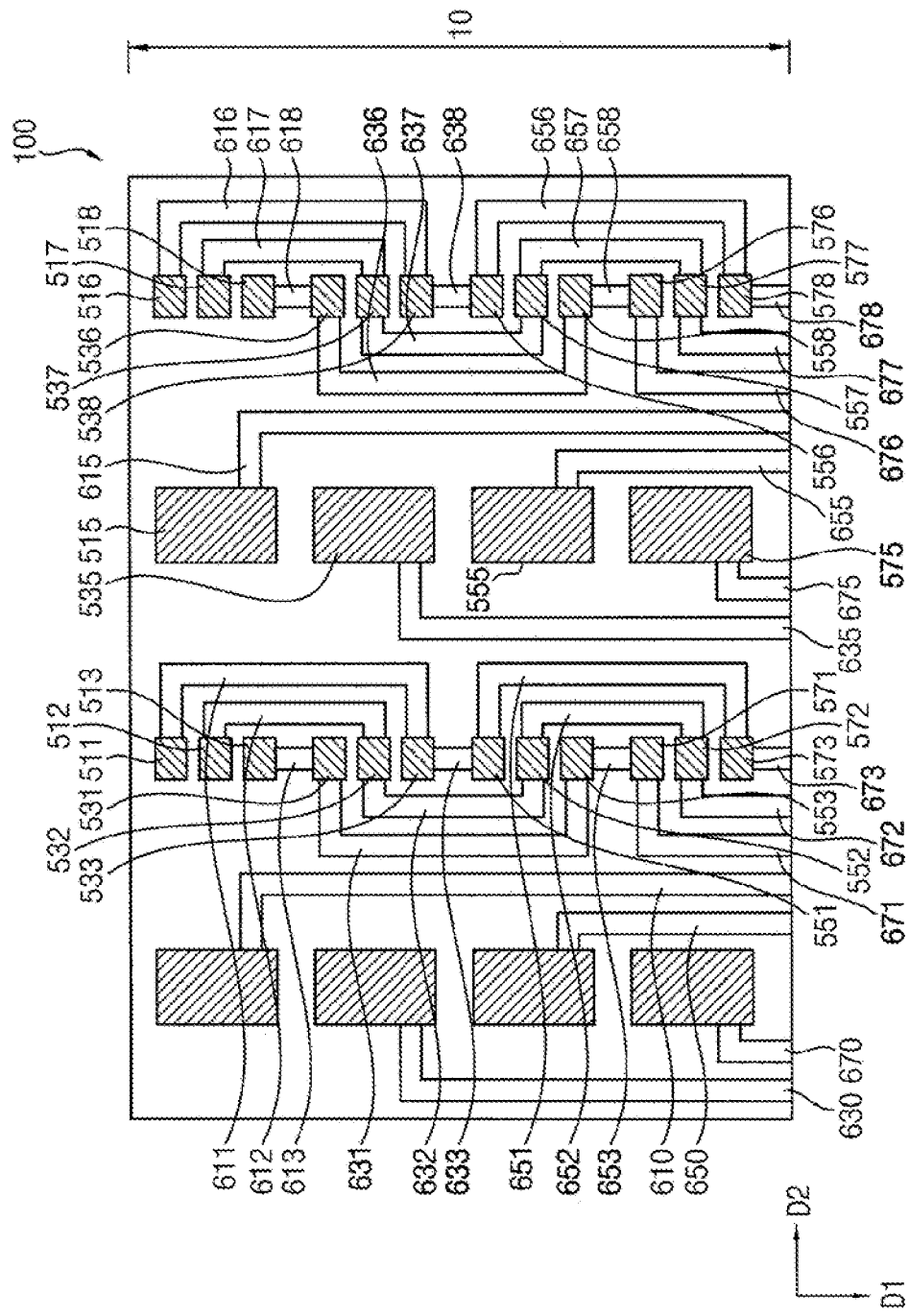

FIGS. 4, 5, and 6 are plan views of a touch screen structure and touch screen wirings included in the OLED device of FIG. 1. For example, FIG. 4 is a plan view illustrating sensing electrodes and sub-sensing electrodes included in a touch screen structure, and FIG. 5 is a plan view illustrating touch screen wirings connected to the sensing electrodes and the sub-sensing electrodes. FIG. 6 is a plan view simultaneously illustrating the touch screen structure and the touch screen wirings included in the OED device. Thus, FIG. 6 illustrates exemplary connectivity between the sensing electrodes and the sub-sensing electrodes by the touch screen wirings.

Referring to FIG. 4, a touch screen structure 500 may be disposed in the display region 10 on the pixel structure. The touch screen structure 500 may include first through eighth sensing electrodes 510, 530, 550, 570, 515, 535, 555, and 575 and first through twenty-fourth sub-sensing electrodes 511, 512, 513, 531, 532, 533, 551, 552, 553, 571, 572, 573, 516, 517, 518, 536, 537, 538, 556, 557, 558, 576, 577, and 578.

In an exemplary embodiment of the present invention, the touch screen structure 500 may include eight of sensing electrodes and twenty four of sub-sensing electrodes, but exemplary embodiments of the present invention are not limited thereto. For example, the touch screen structure 500 may include a configuration having at least two sensing electrodes and a configuration having at least one sensing electrode and at least one sub-sensing electrode.

In an exemplary embodiment of the present invention, the first through eighth sensing electrode and the first through twenty-fourth sub-sensing electrodes may be located at a same layer as each other (e.g., at a same level as each other). For example, the sensing electrodes and the sub-sensing electrodes may each be positioned at a same depth as each other with respect to an upper surface of the OLED device 100. The first sensing electrode 510 and the first, second, and third sub-sensing electrodes 511, 512, and 513 may be defined as a first sensing electrode group 501, and The second sensing electrode 523 and the fourth, fifth, and sixth sub-sensing electrodes 531, 532, and 533 may be defined as a second sensing electrode group 502. The third sensing electrode 550 and the seventh, eighth, and ninth sub-sensing electrodes 551, 552, and 553 may be defined as a third sensing electrode group 503, and the fourth sensing electrode 570 and the tenth, eleventh, and twelfth sub-sensing electrodes 571, 572, and 573 may be defined as a fourth sensing electrode group 504. Fifth, sixth, seventh, and eighth sensing electrode groups 505, 506, 507, and 508 may be defined. The first through fourth sensing electrode groups 501, 502, 503, and 504 may be sequentially arranged in the first direction D1 (e.g., a column direction) that is parallel to an upper surface of the OLED device 100, and the fifth through eighth sensing electrode groups 505, 506, 507, and 508 may be spaced apart from the first through fourth sensing electrode groups 501, 502, 503, and 504 in the second direction D2 that is perpendicular to the first direction D1. The fifth through eighth sensing electrode groups 505, 506, 507, and 508 may be sequentially arranged in a first direction D1.

As an example, a (K)th sensing electrode among the first through eighth sensing electrodes together with (D)th, (E)th, and (F)th sub-sensing electrodes among the first through twenty-fourth sub-sensing electrodes may be defined as an (S)th sensing electrode group among first through (R) sensing electrode groups. K may be an integer between 1 and 8, and D, E, and F may be different integers between 1 and 24. R may be 8, and S is an integer between 1 and 8.

The touch screen structure 500 may operate in a mutual-capacitance manner. For example, an extern device (see, e.g., FIG. 3) may provide touch sensing signals to the sensing electrodes and the sub-sensing electrodes. When a user of the OLED device 100 contacts a portion corresponding to the first sensing electrode group 501, a capacitance between the first sensing electrode 510 and the first, second, and third sub-sensing electrodes may be changed, and the external device may detect the changed capacitance. That is, the OLED device 100 may detect the contact of the user of the OLED device 100. For example, a capacitance of less than all of the sensing and sub-sensing electrodes may be changed through contact by the user.

In an exemplary embodiment of the present invention, one sensing electrode may correspond to three of sub-sensing electrodes (e.g., FIG. 4), and eight sensing electrode groups may be defined, but exemplary embodiments of the present invention are not limited thereto. For example, in an exemplary embodiment of the present invention, sensing electrodes may include first through (N)th sensing electrodes, and sub-sensing electrodes may include first through (M)th sub-sensing electrodes. The first through (N)th sensing electrodes may be located at a same layer with the first through (M)th sub-sensing electrodes, and may be located adjacent to the first through (M)th sub-sensing electrodes. A (K)th sensing electrode among the first through (N)th sensing electrodes together with (D)th, (E)th, and (F)th sub-sensing electrodes among the first through (M)th sub-sensing electrodes may be defined as an (S)th sensing electrode group among first through (R)th sensing electrode groups. In an exemplary embodiment of the present invention, one sensing electrode together with one sub-sensing electrode or two of sensing electrodes may be defined as one sensing electrode group. For example, N may be an integer greater than 1, and N may be an integer greater than 1. K may be an integer between 1 and N, and D, E, and F may be different integers between 1 and M. R may be an integer greater than 1, and S may be an integer between 1 and R.

Referring to FIGS. 5 and 6, touch screen wirings 610, 611, 612, 613, 630, 631, 632, 633, 650, 651, 652, 653, 670, 671, 672, 673, 615, 616, 617, 635, 636, 637, 638, 655, 656, 657, 658, 675, 676, 677, and 678 may be located at a same layer with the sensing electrodes and the sub-sensing electrodes. For example, the first touch screen wiring 610 may be electrically connected to the first sensing electrode 510, may extend in the first direction D1 (e.g., in the pad region 60). The second touch screen wiring 630 may be electrically connected to the second sensing electrode 530, and may extend in the first direction D1 (e.g., in the pad region 60). The third touch screen wiring 650 may be electrically connected to the third sensing electrode 550, and may extend in the first direction D1 (e.g., in the pad region 60), and the fourth touch screen wiring 670 may be electrically connected to the fourth sensing electrode 570, and may extend in the first direction D1 (e.g., in the pad region 60). Fifth through eighth touch screen wirings 615, 635, 655, and 675 may be disposed (e.g., in the display region 10).

A ninth touch screen wiring 611, 633, 651, and 673 may electrically connect i) the first sub-sensing electrode 511 and the sixth sub-sensing electrode 533, ii) the sixth sub-sensing electrode 533 and the seventh sub-sensing electrode 551, and iii) the seventh sub-sensing electrode 551 and the twelfth sub-sensing electrode 573, and may extend in the first direction D1 (e.g., in the pad region 60). In an exemplary embodiment of the present invention, the same touch screen sensing signal from the external device 101 may be provided to the first sub-sensing electrode 511, the sixth sub-sensing electrode 533, the seventh sub-sensing electrode 551, and the twelfth sub-sensing electrode 573 through the ninth touch screen wiring 611, 633, 651, and 673. A tenth touch screen wiring 612, 632, 652, and 672 may electrically connect i) the second sub-sensing electrode 512 and the fifth sub-sensing electrode 532, ii) the fifth sub-sensing electrode 532 and the eighth sub-sensing electrode 552, and iii) the eight sub-sensing electrode 552 and the eleventh sub-sensing electrode 572, and may extend in the first direction D1 (e.g., in the pad region 60). In an exemplary embodiment of the present invention, the same touch screen sensing signal from the external device 101 may be provided to the second sub-sensing electrode 512, the fifth sub-sensing electrode 532, the eighth sub-sensing electrode 552, and the eleventh sub-sensing electrode 572 through the tenth touch screen wiring 612, 632, 652, and 672. A eleventh touch screen wiring 613, 631, 653, and 671 may electrically connect i) the third sub-sensing electrode 513 and the fourth sub-sensing electrode 531, ii) the fourth sub-sensing electrode 531 and the ninth sub-sensing electrode 553, and iii) the ninth sub-sensing electrode 553 and the tenth sub-sensing electrode 571, and may extend in the first direction D1 (e.g., in the pad region 60). In an exemplary embodiment of the present invention, the same touch screen sensing signal from the external device 101 may be provided to the third sub-sensing electrode 513, the fourth sub-sensing electrode 531, the ninth sub-sensing electrode 553, and the tenth sub-sensing electrode 571 through the eleventh touch screen wiring 613, 631, 653, and 671. Twelfth touch screen wiring 616, 638, 656, and 678, a thirteenth touch screen wiring 617, 637, 657, and 677, and a fourteenth touch screen wiring 618, 636, 658, and 676 may be disposed (e.g., in the display region 10).

As an example, the touch screen wirings may include first through fourteenth touch screen wirings electrically connected to each of the first through eighth sensing electrodes and the first through twenty-fourth sub-sensing electrodes. The first through eighth sensing electrode groups may be arranged in 2 rows and 4 columns. The first through fourth sensing electrode groups 501, 502, 503, and 504 may be located at a same column as each other, and the fifth through eighth sensing electrode groups 505, 506, 507, and 508 may be located at a same column as each other. The first sensing electrode group 501 and the fifth sensing electrode group 505 may be located at a same row as each other, and the second sensing electrode group 502 and the sixth sensing electrode group 506 may be located at a same row as each other. The third sensing electrode group 503 and the seventh sensing electrode group 507 may be located at a same row as each other, and the fourth sensing electrode group 504 and the eighth sensing electrode group 508 may be located at a same row as each other.

Ninth touch screen wiring 611, 633, 651, and 673 among the first through fourteenth touch screen wirings may electrically connect the first sub-sensing electrode 511 of the first sensing electrode group 501, the sixth sub-sensing electrode 533 of the second sensing electrode group 502, the seventh sub-sensing electrode 551 of the third sensing electrode group 503, and the twelfth sub-sensing electrode 573 of the fourth sensing electrode group 504, and may extend in a direction (e.g., the first direction D1) from the display region 10 into the pad region 60.

Tenth touch screen wiring 612, 632, 652, and 672 among the first through fourteenth touch screen wirings may electrically connect the second sub-sensing electrode 512 of the first sensing electrode group 501, the fifth sub-sensing electrode 532 of the second sensing electrode group 502, the eighth sub-sensing electrode 552 of the third sensing electrode group 503, and the eleventh sub-sensing electrode 572 of the fourth sensing electrode group 504, and may extend in a direction (e.g., the first direction D1) from the display region 10 into the pad region 60.

Eleventh touch screen wiring 613, 631, 653, and 671 among the first through fourteenth touch screen wirings may electrically connect the third sub-sensing electrode 513 of the first sensing electrode group 501, the fourth sub-sensing electrode 531 of the second sensing electrode group 502, the ninth sub-sensing electrode 553 of the third sensing electrode group 503, and the tenth sub-sensing electrode 571 of the fourth sensing electrode group 504, and may extend in a direction (e.g., the first direction D) from the display region 10 into the pad region 60. Accordingly, as one touch screen wiring connects the sub-sensing electrodes where the same touch sensing signal is provided, the total number of the touch screen wirings may be minimized. In addition, the first through eighth sensing electrodes, the first through twenty-fourth sub-sensing electrodes, and the first through fourteenth touch screen wirings may be located at a same layer as each other. The first through eighth sensing electrodes, the first through twenty-fourth sub-sensing electrodes, and the first through fourteenth touch screen wirings may be substantially simultaneously formed by a same manufacturing process. Further, the first through eighth sensing electrodes, the first through twenty-fourth sub-sensing electrodes, and the first through fourteenth touch screen wirings may include a same material as each other. Accordingly, a manufacturing cost may be relatively reduced.

In an exemplary embodiment of the present invention, touch screen wirings may include first through (P)th touch screen wirings electrically connecting each of the first through (N)th sensing electrodes and the first through (M)th sub-sensing electrodes. P may be an integer greater than 1. A (K)th sensing electrode among the first through (N)th sensing electrodes together with (D)th, (E)th, and (F)th sub-sensing electrodes among the first through (M)th sub-sensing electrodes may be defined as an (S)th sensing electrode group among first through (R)th sensing electrode groups. The first through (R)th sensing electrode groups may be arranged in X rows and Y columns. For example, K may be an integer between 1 and N, and D, E, and F may be different integers between 1 and M. R may be an integer greater than 1 and S may be an integer between 1 and R. X and Y may be integers greater than 1. The first through (R)th sensing electrode groups may include (W)th, (W+1)th, (W+2)th and (W+3)th sensing electrode groups, which are located at a same column as each other, among the first through (R)th sensing electrode groups. W may be an integer between 1 and R. The (W)th sensing electrode group may include the (K)th sensing electrode and the (D)th, (E)th, and (F)th sub-sensing electrodes, and the (W+1)th sensing electrode group may include a (K+1)th sensing electrode and (D+1)th, (E+1)th, and (F+1)th sub-sensing electrodes. The (W+2)th sensing electrode group may include a (K+2)th sensing electrode and (D+2)th, (E+2)th, and (F+2)th sub-sensing electrodes, and the (W+3)th sensing electrode group may include the (K+3)th sensing electrode and (D+3)th, (E+3)th, and (F+3)th sub-sensing electrodes.

An (A)th touch screen wiring among the first through (P)th touch screen wirings may electrically connect i) the (D)th sub-sensing electrode of the (W)th sensing electrode group and the (F+1)th sub-sensing electrode of the (W+1)th sensing electrode group, ii) the (F+1)th sub-sensing electrode of the (W+1)th sensing electrode group and the (D+2)th sub-sensing electrode of the (W+2)th sensing electrode group, and iii) the (D+2)th sub-sensing electrode of the (W+2)th sensing electrode group and the (F+3)th sub-sensing electrode of the (W+3)th sensing electrode group, and the (A)th touch screen wiring may extend from the display region 10 into the pad region 60 (e.g., along the first direction D1). For example, A may be an integer between 1 and P. A (B)th touch screen wiring among the first through (P)th touch screen wirings may electrically connect i) the (E)th sub-sensing electrode of the (W)th sensing electrode group and the (E+1)th sub-sensing electrode of the (W+1)th sensing electrode group, ii) the (E+1)th sub-sensing electrode of the (W+1)th sensing electrode group and the (E+2)th sub-sensing electrode of the (W+2)th sensing electrode group, and iii) the (E+2)th sub-sensing electrode of the (W+2)th sensing electrode group and the (E+3)th sub-sensing electrode of the (W+3)th sensing electrode group, and the (B)th touch screen wiring may extend from the display region 10 into the pad region 60 (e.g., along the first direction D1). For example, B may be an integer between 1 and P.

A (C)th touch screen wiring among the first through (P)th touch screen wirings may electrically connect i) the (F)th sub-sensing electrode of the (W)th sensing electrode group and the (D+1)th sub-sensing electrode of the (W+1)th sensing electrode group, ii) the (D+1)th sub-sensing electrode of the (W+1)th sensing electrode group and the (F+2)th sub-sensing electrode of the (W+2)th sensing electrode group, and iii) the (F+2)th sub-sensing electrode of the (W+2)th sensing electrode group and the (D+3)th sub-sensing electrode of the (W+3)th sensing electrode group, and the (C)th touch screen wiring may extend from the display region 10 into the pad region 60 (e.g., along the first direction D1). For example, C may be an integer between 1 and P.

In an exemplary embodiment of the present invention, the OLED device 100 may include dummy patterns in a space (e.g., in an empty space) within the display region 10 where the first through eighth sensing electrodes, the first through twenty-fourth sub-sensing electrodes, and the first through fourteenth touch screen wirings are not disposed. The dummy patterns may compensate for an optical variance (e.g., a refractive index or reflectivity) of the OLED device 100.

Figure 8:
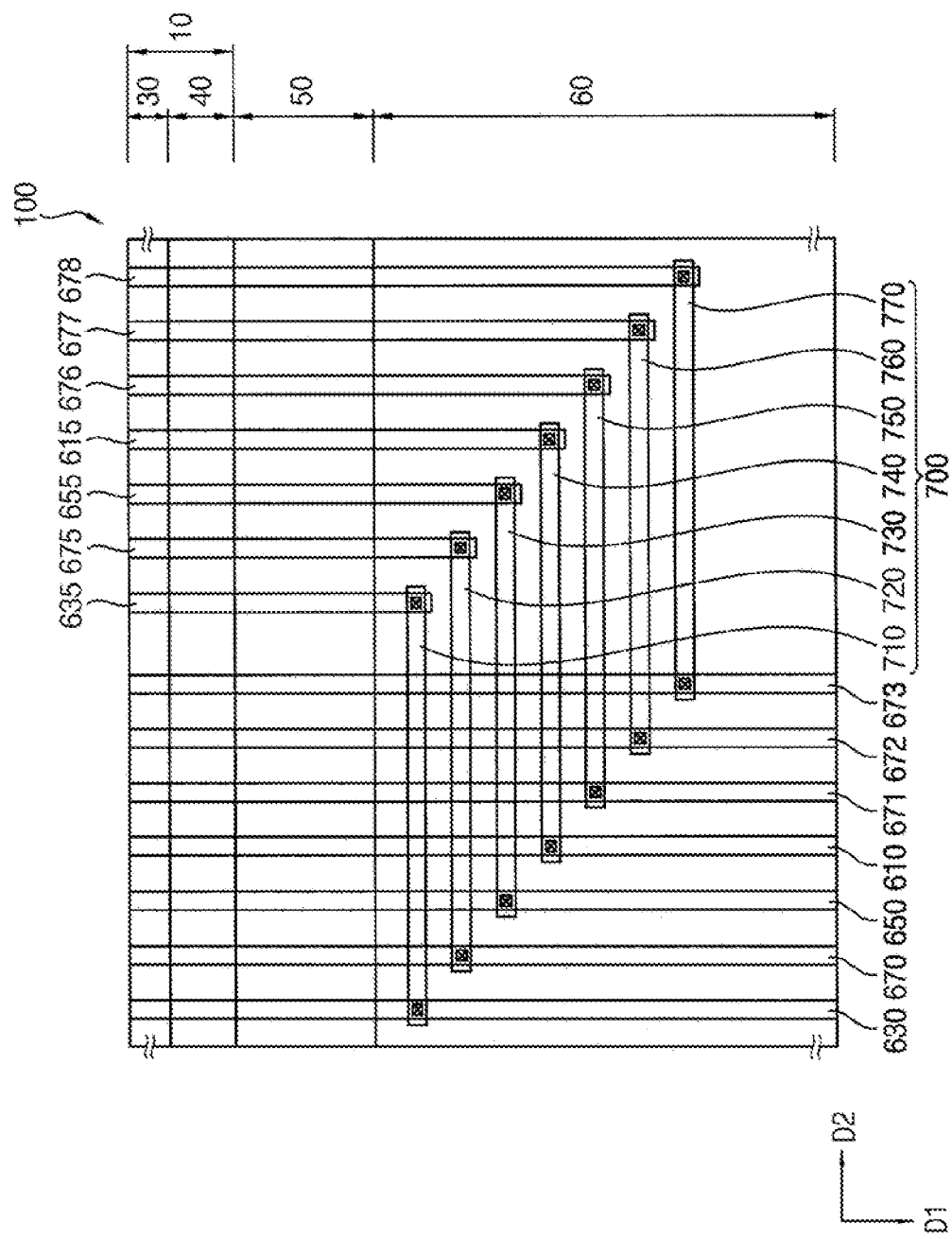

FIGS. 7A, 7B, and 8 are plan views of a connection structure and touch screen wirings included in the OLED device of FIG. 1. For example, FIG. 8 is a plan view of a connection structure, and FIG. 7B is a plan view of touch screen wirings. FIG. 8 is a plan view of the connection structure and the touch screen wirings included in the OLED device (e.g., the OLED device 100).

Referring to FIGS. 7A, 7B, and 8, a connection structure 700 may include a first connection electrode 710, a second connection electrode 720, a third connection electrode 730, a fourth connection electrode 740, a fifth connection electrode 750, a sixth connection electrode 760, and a seventh connection electrode 770. In an exemplary embodiment of the present invention, the first through seventh connection electrodes 710, 720, 730, 740, 750, 760, and 770 may be disposed under the first through fourteenth touch screen wirings 630, 635, 670, 675, 650, 655, 610, 615, 671, 676, 672, 677, 673, and 678, and the first through seventh connection electrodes may be connected to the first through fourteenth touch screen wirings via first through fourteenth contact holes 711, 712, 721, 722, 731, 732, 741, 742, 751, 752, 761, 762, 771, and 772. Each of the connection electrodes in the pad region 60 may extend in the second direction D2, and may be spaced apart from each other in the first direction D1. Additionally, ends of the connection electrodes extending along the second direction D2 may be positioned at different locations along the second direction D2 from each other. For example, an end of the first connection electrode 710 may end at a different position along the second direction D2 compared with an end of the second connection electrode 720. Thus, ends of the connection electrodes may be spaced apart from each other in each of the first and second direction D1 and D2. One connection electrode among the first through seventh connection electrodes may electrically connect two of touch screen wirings, to which the same touch sensing signal is applied, among the first through fourteenth touch screen wirings via two of the contact holes. In addition, one touch screen wiring among the touch screen wirings, to which the same touch sensing signal is applied, may cross the connection electrode, and may extend in the first direction D1 and may be in contact with a pad electrode (see, e.g., pad electrode 470 described in more detail above with reference to FIG. 1).

For example, the touch screen wirings 630, 635, 670, 675, 650, 655, 610, 615, 671, 676, 672, 677, 673, and 678 may correspond to the second touch screen wiring 630, the sixth touch screen wiring 635, the fourth touch screen wiring 670, the eighth touch screen wiring 675, the third touch screen wiring 650, the seventh touch screen wiring 655, the first touch screen wiring 610, the fifth touch screen wiring 615, the eleventh touch screen wiring 671, the fourteenth touch screen wiring 676, the tenth touch screen wiring 672, the thirteenth touch screen wiring 677, the ninth touch screen wiring 673, and the twelfth touch screen wiring 678. The first through fourteenth touch screen wirings in the pixel region 30, the peripheral region 40, and the bending region 50 may be extend in the first direction D1, and may be spaced apart from each other in the second direction D2. Each of the sixth touch screen wiring 635, the eighth touch screen wiring 675, the seventh touch screen wiring 655, the fifth touch screen wiring 615, the fourteenth touch screen wiring 676, the thirteenth touch screen wiring 677, and the twelfth touch screen wiring 678 may be disposed in a portion of the pad region 60. The second touch screen wiring 630, the fourth touch screen wiring 670, the third touch screen wiring 650, the first touch screen wiring 610, the eleventh touch screen wiring 671, the tenth touch screen wiring 672, and the ninth touch screen wiring 673 may cross the connection electrode, may extend in the first direction D1 and may be in direct contact with the pad electrode (e.g., pad electrode 470).

As an example, a plurality of touch screen wirings may include first through (N)th touch screen wirings. The first through (N)th touch screen wirings may extend in the first direction D1, and may be spaced apart from each other at the bending region in the second direction D2 that is perpendicular to the first direction D1. For example, N may be an integer greater than 1. (K)th and (J)th touch screen wirings, to which the same touch sensing signal is applied, among the first through (N)th touch screen wirings may be electrically connected to an (L)th connection electrode among the first through (M)th connection electrodes via contact holes. K and J may be different integers between 1 and N, and L may be integer between 1 and M. The (K)th touch screen wiring may cross the (L)th connection electrode. The (K)th touch screen wiring may extend in the first direction D1, and may be in direct contact with the pad electrode. The (J)th touch screen wiring might not be in direct contact with the pad electrode (e.g., pad electrode 470).

In an exemplary embodiment of the present invention, the first connection electrode 710 may be connected to the second touch screen wiring 630 and the sixth touch screen wiring 635 in the pad region 60 through the first contact hole 711 and the second contact hole 712, and the second touch screen wiring 630 may cross the first connection electrode 710 and may extend in the first direction D1. For example, an extending distance of the second touch screen wiring 630 may be relatively greater than an extending distance of the sixth touch screen wiring 635 in the pad region 60 (e.g., along the first direction D1). As the second touch screen wiring 630 and the sixth touch screen wiring 635 are electrically connected through the first connection electrode 710, the same touch sensing signal from an external device (see, e.g., FIG. 3) may be provided in the second touch screen wiring 630 and the sixth touch screen wiring 635.

The second connection electrode 720 may be connected to the fourth touch screen wiring 670 and the eighth touch screen wiring 675 in the pad region 60 through the third contact hole 721 and the fourth contact hole 722, and the fourth touch screen wiring 670 may cross the second connection electrode 720 and may extend in the first direction D1. An extending distance of the fourth touch screen wiring 670 may be relatively greater than an extending distance of the eighth touch screen wiring 675 in the pad region 60. As the fourth touch screen wiring 670 and the eighth touch screen wiring 675 are electrically connected through the second connection electrode 720, the same touch sensing signal from the external device may be provided in the fourth touch screen wiring 670 and the eighth touch screen wiring 675.

The third connection electrode 730 may be connected to the third touch screen wiring 650 and the seventh touch screen wiring 655 in the pad region 60 through the fifth contact hole 731 and the sixth contact hole 732, and the third touch screen wiring 650 may cross the third connection electrode 730 and may extend in the first direction D1. An extending distance of the third touch screen wiring 650 may be relatively greater than an extending distance of the seventh touch screen wiring 655 in the pad region 60. As the third touch screen wiring 650 and the seventh touch screen wiring 655 are electrically connected through the third connection electrode 730, the same touch sensing signal from the external device may be provided in the third touch screen wiring 650 and the seventh touch screen wiring 655.

The fourth connection electrode 740 may be connected to the first touch screen wiring 610 and the fifth touch screen wiring 615 in the pad region 60 through the seventh contact hole 741 and the eighth contact hole 742, and the first touch screen wiring 610 may cross the fourth connection electrode 740 and may extend in the first direction D1. An extending distance of the first touch screen wiring 610 may be relatively greater than an extending distance of the fifth touch screen wiring 615 in the pad region 60. As the first touch screen wiring 610 and the fifth touch screen wiring 615 are electrically connected through the fourth connection electrode 740, the same touch sensing signal from the external device may be provided in the first touch screen wiring 610 and the fifth touch screen wiring 615.

The fifth connection electrode 750 may be connected to the eleventh touch screen wiring 671 and the fourteenth touch screen wiring 676 in the pad region 60 through the ninth contact hole 751 and the tenth contact hole 752, and the eleventh touch screen wiring 671 may cross the fifth connection electrode 750 and may extend in the first direction D1. An extending distance of the eleventh touch screen wiring 671 may be relatively greater than an extending distance of the fourteenth touch screen wiring 676 in the pad region 60. As the eleventh touch screen wiring 671 and the fourteenth touch screen wiring 676 are electrically connected through the fifth connection electrode 750, the same touch sensing signal from the external device may be provided in the eleventh touch screen wiring 671 and the fourteenth touch screen wiring 676.

The sixth connection electrode 760 may be connected to the tenth touch screen wiring 672 and the thirteenth touch screen wiring 677 in the pad region 60 through the eleventh contact hole 761 and the twelfth contact hole 762, and the tenth touch screen wiring 672 may cross the sixth connection electrode 760 and may extend in the first direction D1. An extending distance of the tenth touch screen wiring 672 may be relatively greater than an extending distance of the thirteenth touch screen wiring 677 in the pad region 60. As the tenth touch screen wiring 672 and the thirteenth touch screen wiring 677 are electrically connected through the sixth connection electrode 760, the same touch sensing signal from the external device may be provided in the tenth touch screen wiring 672 and the thirteenth touch screen wiring 677.

The seventh connection electrode 770 may be connected to the ninth touch screen wiring 673 and the twelfth touch screen wiring 678 in the pad region 60 through the thirteenth contact hole 771 and the fourteenth contact hole 772, and the ninth touch screen wiring 673 may cross the seventh connection electrode 770 and may extend in the first direction D1. An extending distance of the ninth touch screen wiring 673 may be relatively greater than an extending distance of the twelfth touch screen wiring 678 in the pad region 60. As the ninth touch screen wiring 673 and the twelfth touch screen wiring 678 are electrically connected through the seventh connection electrode 770, the same touch sensing signal from the external device may be provided in the ninth touch screen wiring 673 and the twelfth touch screen wiring 678.

In an exemplary embodiment of the present invention, when the OLED device 100 is bent, the bending region 50 may have round or curved shape, and the connection structure 700 disposed in the pad region 60 may be located on a lower surface of the OLED device 100. As an example, when the OLED device 100 is bent, the connection structure 700 disposed in the pad region 60 may overlap the display region 10. For example, a display image may be displayed in an upper surface of the OLED device 100, and a lower surface of the OLED device 100 may be opposite to the upper surface of the OLED device 100. The lower surface of the OLED device 100 may correspond to a lower surface of the substrate 110 (see, e.g., FIG. 9).

For example, when the connection structure 700 is disposed in the peripheral region 40, a size of the peripheral region 40 may be relatively increased. In this case, a dead space of the OLED device 100 may be increased.

As the connection structure 700 in accordance with an exemplary embodiment of the present invention is disposed in the pad region 60, a size of the peripheral region 40 may be relatively decreased. Accordingly, the dead space of the OLED device 100 may be reduced, and the OLED device 100 may serve as a touch display device including the touch screen structure 500.

Figure 9:
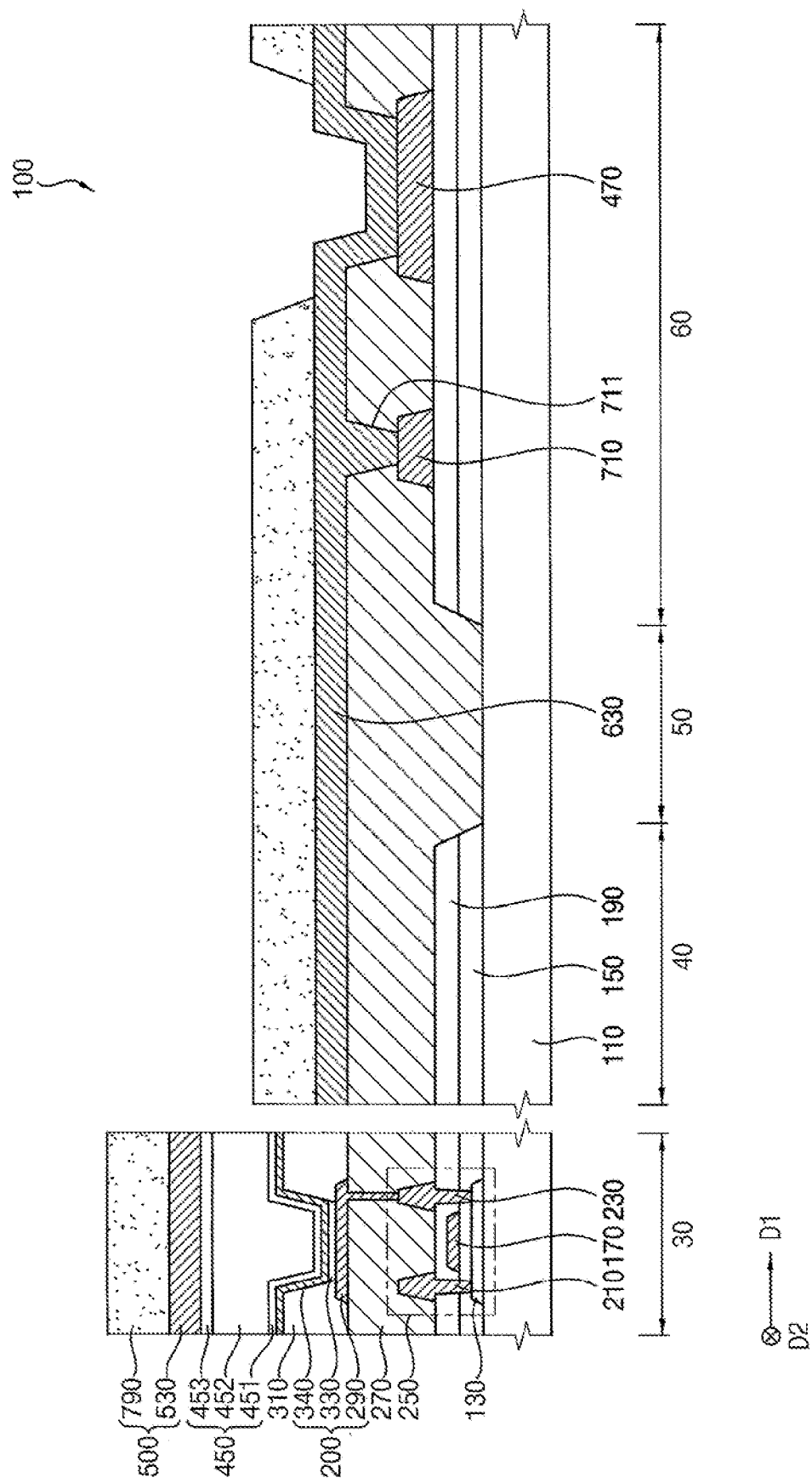
FIG. 9 is a cross-sectional view taken along a line I-I' of FIG. 1.
Figure 10:
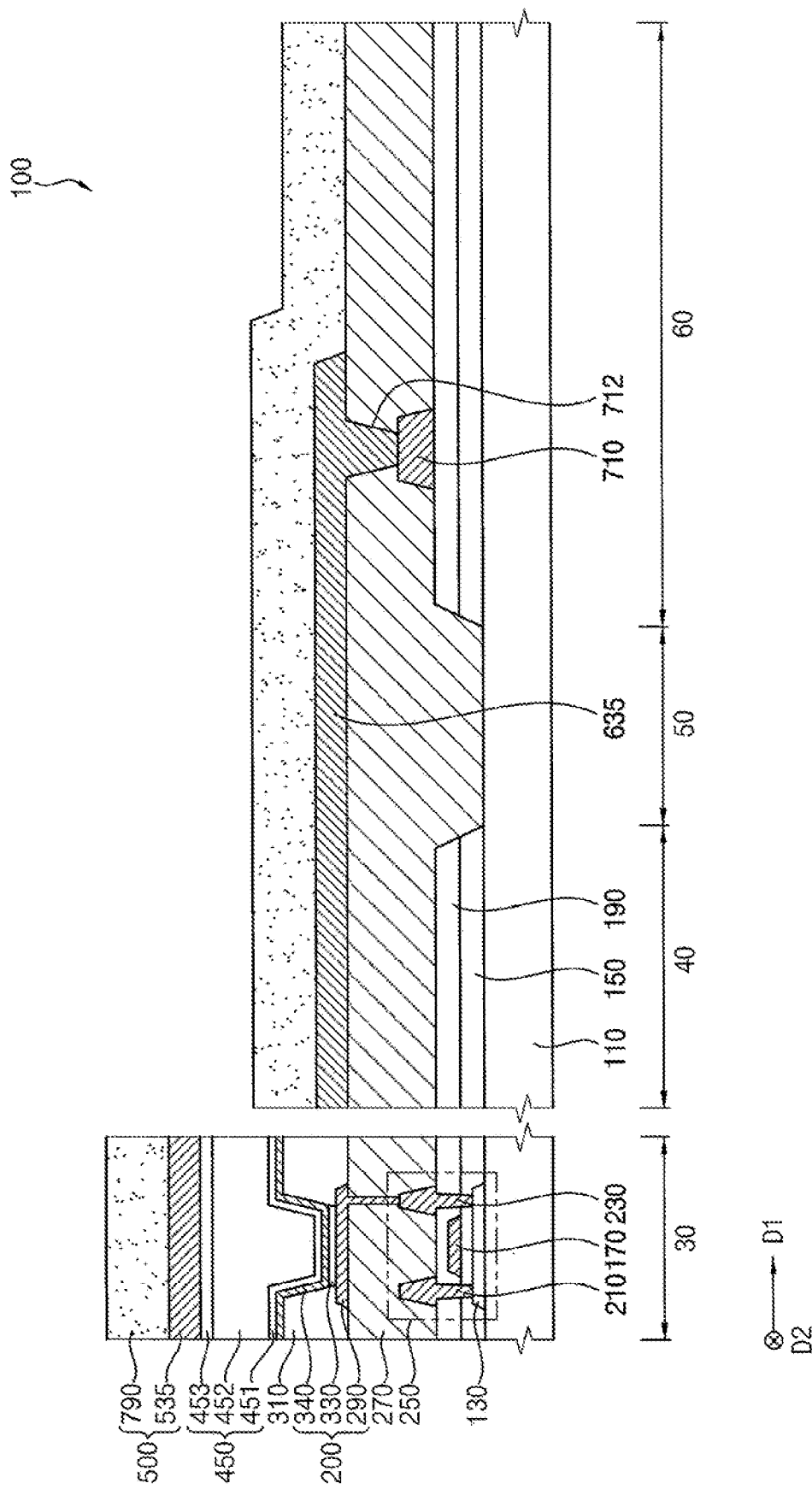
FIG. 10 is a cross-sectional view taken along a line II-II' of FIG. 1.

FIG. 9 is a cross-sectional view taken along a line I-I' of FIG. 1. FIG. 10 is a cross-sectional view taken along a line II-II' of FIG. 1.

Referring to FIGS. 9 and 10, the OLED device 100 may include a substrate 110, a semiconductor element 250, a planarization layer 270, a pad electrode 470, a pixel structure 200, a pixel defining layer 310, a thin film encapsulation (TFE) structure 450, the touch screen structure 500, the first touch screen wiring 630, the second touch screen wiring 635, and the connection structure 700. The substrate 110 may include the pixel region 30, the bending region 50, the peripheral region 40 (e.g., the peripheral region 40 disposed between the pixel region 30 and the bending region 50), and the pad region 60 (see, e.g., FIG. 1). The semiconductor element 250 may include an active layer 130, a gate insulation layer 150, a gate electrode 170, an insulating interlayer 190, a source electrode 210, and a drain electrode 230. The connection structure 700 may include a connection electrode 710. The pixel structure 200 may include a lower electrode 290, a light emitting layer 330, and an upper electrode 340. The TFE structure 450 may include a first TFE layer 451, a second TFE layer 452, and a third TFE layer 453. The touch screen structure 500 may include a first sensing electrode 530, a second sensing electrode 535, and a protective insulation layer 790. In an exemplary embodiment of the present invention, the first sensing electrode 530 described with reference to FIG. 9 may correspond to the second sensing electrode 530 described with reference to FIG. 6. The second sensing electrode 535 described with reference to FIG. 10 may correspond to the sixth sensing electrode 535 described with reference to FIG. 6. In addition, the first touch screen wiring 630 described with reference to FIG. 9 may correspond to the second touch screen wiring 630 described with reference to FIG. 6, and the second touch screen wiring 635 described with reference to FIG. 10 may correspond to the sixth touch screen wiring 635 described with reference to FIG. 6. The connection electrode 710 described with reference to FIGS. 9 and 10 may correspond to a first connection electrode 710 described with reference to FIG. 8, and first and second contact holes 711 and 712 described with reference to FIGS. 9 and 10 may correspond to first and second contact holes 711 and 712 described with reference to FIG. 7B.

The OLED device 100 may include the flexible substrate 110 and the TFE structure 450. The bending region 50 may be bent on an axis with respect to the second direction D2. Thus the OLED device 100 may be a flexible OLED device having a shape in which the OLED device 100 is bent in the bending region 50. The OLED device 100 may be permanently bent, or the OLED device 100 may be bendable (e.g., in the bending region) and may be bent at some times, while not being bent at other times.

The substrate 110 may include transparent or opaque insulation materials. The substrate 110 may include a flexible transparent resin substrate. In an exemplary embodiment of the present invention, the substrate 110 may have a configuration in which a first organic layer, a first barrier layer, a second organic layer, and a second barrier layer are sequentially stacked. The first barrier layer and the second barrier layer each may include inorganic materials such as silicon compound, or a metal oxide. The first organic layer and the second organic layer each may include organic materials such as a polyimide-based resin. Each of the first and second barrier layers may block moisture or water that is permeated through the first and second organic layers.

Since the substrate 110 is relatively thin and flexible, the substrate 110 may be disposed on a rigid glass substrate to help support the formation of the semiconductor element 250 and the pixel structure 200. Ina manufacturing the OLED device 100, after a buffer layer is provided on the second barrier layer of the substrate 110, the semiconductor element 250 and the pixel structure 200 may be disposed on the buffer layer. After the semiconductor element 250 and the pixel structure 200 are formed on the buffer layer, the rigid glass substrate on which the substrate 110 is disposed may be removed. The semiconductor element 250 and the pixel structure 200 may be formed on the substrate 110 and the rigid glass substrate, and then the substrate 110 including the first organic layer, the first barrier layer, the second organic layer, and the second barrier layer may serve as the substrate 110 of the OLED device 100 after the removal of the rigid glass substrate. As an example, the substrate 110 may include a quartz substrate, a synthetic quartz substrate, a calcium fluoride substrate, a fluoride-doped quartz substrate, a sodalime glass substrate, or a non-alkali glass substrate.

In an exemplary embodiment of the present invention, the substrate 110 may include four-layers, but exemplary embodiments of the present invention are not limited thereto. For example, in an exemplary embodiment of the present invention, the substrate 110 may include a single layer or a plurality of layers.

A buffer layer may be disposed on the substrate 110. The buffer layer may be entirely disposed in the pixel region 30, the peripheral region 40, and the pad region 60 on the substrate 110, and may have an opening exposing an upper surface of the substrate 110 located in the bending region 50. Alternatively, the buffer layer need not expose an upper surface of the substrate 110 located in the bending region 50. The buffer layer may prevent the diffusion of metal atoms and/or impurities from the substrate 110 into the semiconductor element 250. In addition, the buffer layer may control a rate of a heat transfer in a crystallization process for forming the active layer 130, thus obtaining a substantially uniform active layer. Further, the buffer layer may increase a surface flatness of the substrate 110 when a surface of the substrate 110 is relatively irregular. In an exemplary embodiment of the present invention, according to a type of (e.g., or materials included in) the substrate 110, at least two buffer layers may be provided on the substrate 110, or the buffer layer need not be disposed. For example, the buffer layer may include a silicon compound, or a metal oxide.

The active layer 130 may be disposed in the pixel region 30 on the substrate 110. The active layer 130 may include an oxide semiconductor, an inorganic semiconductor (e.g., amorphous silicon, polysilicon, etc.), or an organic semiconductor.

The gate insulation layer 150 may be disposed on the active layer 130. The gate insulation layer 150 may cover the active layer 130 in the pixel region 30 on the substrate 110, and may extend in a first direction D1 from the pixel region 30 into the pad region 60. For example, the gate insulation layer 150 may at least partially cover the active layer 130 on the substrate 110, and may have a substantially flat upper surface without a step around the active layer 130. Alternatively, the gate insulation layer 150 may substantially cover the active layer 130 on the substrate 110, and may be disposed as a substantially uniform thickness along a profile of the active layer 130. In an exemplary embodiment of the present invention, the gate insulation layer 150 may be disposed in the pixel region 30, the peripheral region 40, and the pad region 60 on the substrate 110, and may have an opening located in the bending region 50. Alternatively, the gate insulation layer 150 need not be expose an upper surface of the substrate 110 located in the bending region 50. The gate insulation layer 150 may include a silicon compound, or a metal oxide. For example, the gate insulation layer 150 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), or titanium oxide (TiOx).

The gate electrode 170 may be disposed on a portion of the gate insulation layer 150 under which the active layer 130 is located. The gate electrode 170 may include a metal, a metal alloy, metal nitride, conductive metal oxide, or transparent conductive materials. These may be used alone or in a combination thereof. In an exemplary embodiment of the present invention, the gate electrode 170 may have a multi-layered structure.

The insulating interlayer 190 may be disposed on the gate electrode 170. The insulating interlayer 190 may at least partially cover the gate electrode 170 in the pixel region 30 on the gate insulation layer 150, and may extend in the first direction D1. For example, the insulating interlayer 190 may at least partially cover the gate electrode 170 on the gate insulation layer 150, and may have a substantially flat upper surface without a step around the gate electrode 170. Alternatively, the insulating interlayer 190 may substantially cover the gate electrode 170 on the gate insulation layer 150, and may be disposed as a substantially uniform thickness along a profile of the gate electrode 170. In an exemplary embodiment of the present invention, the insulating interlayer 190 may be disposed in the pixel region 30, the peripheral region 40, and the pad region 60 on the gate insulation layer 150, and may have an opening located in the bending region 50. Alternatively, the insulating interlayer 190 need not expose an upper surface of the substrate 110 located in the bending region 50. The insulating interlayer 190 may include a silicon compound, or a metal oxide.

The source electrode 210 and the drain electrode 230 may be disposed in the pixel region 30 on the insulating interlayer 190. The source electrode 210 may be in direct contact with a source region of the active layer 130 via a contact hole formed by removing a portion of the gate insulation layer 150 and the insulating interlayer 190. The drain electrode 230 may be in direct contact with a drain region of the active layer 130 via a contact hole formed by removing another portion of the gate insulation layer 150 and the insulating interlayer 190. Each of the source electrode 210 and the drain electrode 230 may include a metal, an alloy, metal nitride, conductive metal oxide, or transparent conductive materials. These may be used alone or in a combination thereof. In an exemplary embodiment of the present invention, each of the source and drain electrodes 210 and 230 may have a multi-layered structure. Accordingly, the semiconductor element 250 including the active layer 130, the gate insulation layer ISO, the gate electrode 170, the insulating interlayer 190, the source electrode 210, and the drain electrode 230 may be disposed.

In an exemplary embodiment of the present invention, the semiconductor element 250 has a top gate structure, but exemplary embodiments of the present invention are not limited thereto. For example, in an exemplary embodiment of the present invention, the semiconductor element 250 may have a bottom gate structure or a double gate structure.

The connection electrode 710 may be disposed in the pad region 60 on the insulating interlayer 190. In an exemplary embodiment of the present invention, referring to FIG. 7A, the connection electrode 710 may be one of a plurality of connection electrodes included in the connection structure 700. The connection electrode 710 in the pad region 60 may extend in the second direction D2. The connection electrode 710 (e.g., and each of the other connection electrodes of the plurality of connection electrodes) may be positioned entirely in the pad region 60 without overlapping other regions (e.g., without overlapping the bending region). The connection electrode 710 may connect (e.g., may electrically connect) touch screen wirings of the plurality of touch screen wirings to each other. A same touch sensing signal among a plurality of touch sensing signals is applied to touch screen wirings of the plurality of touch screen wirings that are connected to each other. The connection electrode 710 (e.g., and each of the other connection electrodes of the plurality of connection electrodes) may include a metal, an alloy of a metal, a metal nitride, a conductive metal oxide, or transparent conductive materials. For example, the connection electrode 710 may include gold (Au), silver (Ag), aluminum (Al), platinum (Pt), nickel (Ni), titanium (Ti), palladium (Pd), magnesium (Mg), calcium (Ca), lithium (Li), chrome (Cr), tantalum (Ta), tungsten (W), copper (Cu), molybdenum (Mo), scandium (Sc), neodymium (Nd), iridium (Ir), an alloy of aluminum, aluminum nitride (AlNx), an alloy of silver, tungsten nitride (WNx), an alloy of copper, an alloy of molybdenum, titanium nitride (TiNx), chrome nitride (CrNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), or indium zinc oxide (IZO). These may be used alone or in a combination thereof. In an exemplary embodiment of the present invention, the connection electrode 710 (e.g., and each of the other connection electrodes of the plurality of connection electrodes) may have a multi-layered structure. Alternatively, the connection electrode 710 (e.g., and each of the other connection electrodes of the plurality of connection electrodes) may have a single layer structure.

The pad electrodes 470 may be disposed in the pad region 60 on the insulating interlayer 190, and may be spaced apart from the connection electrode 710. The pad electrode 470 may be electrically connected to an external device 101 (see, e.g., FIG. 3), and may provide a plurality of signals (e.g., scan signals, data signals, light emission signals, or touch sensing signals) provided from the external device 101 to the OLED device 100. In an exemplary embodiment of the present invention, the pad electrode 470 (see, e.g., FIG. 9) may receive the touch sensing signal from the external device 101. The pad electrode 470 may include a metal, an alloy of a metal, a metal nitride, a conductive metal oxide, or transparent conductive materials. There may be used alone or in a combination thereof. In an exemplary embodiment of the present invention, the pad electrode 470 may have a multi-layered structure. Alternatively, the pad electrode 470 may have a single layer structure.

In an exemplary embodiment of the present invention, the source electrode 210, the drain electrode 230, the connection electrode 710, and the pad electrode 470 may be located at a same layer as each other, and may be substantially simultaneously formed using the same materials as each other.

The planarization layer 270 may be disposed on the source electrode 210, the drain electrode 230, the connection electrode 710, and the pad electrode 470. The planarization layer 270 may substantially cover the source electrode 210 and the drain electrode 230 in the pixel region 30 on the insulating interlayer 190, and may substantially cover the connection electrode 710 and the pad electrode 470 in the pixel region 30 on the insulating interlayer 190. The planarization layer 270 may be in direct contact with an upper surface of the substrate 110 located in the bending region 50. As an example, the planarization layer 270 may substantially fill an opening of the gate insulation layer 150 and the insulating interlayer 190 located in the bending region 50. In an exemplary embodiment of the present invention, the planarization layer 270 may include the first contact hole 711 and the second contact hole 712. The first contact hole 711 may expose a first portion of the connection electrode 710 (see, e.g., FIG. 9), and the second contact hole 712 may expose a second portion of the connection electrode 710 (see, e.g., FIG. 10). The planarization layer 270 may include a contact hole exposing a portion of an upper surface of the pad electrode 470 and a contact hole exposing a portion of an upper surface of the drain electrode 230. The planarization layer 270 may be relatively thick. For example, the planarization layer 270 may be relatively thick compared with the substrate 110. The planarization layer 270 may have a substantially flat upper surface, and a planarization process may be further performed on the planarization layer 270 to implement the flat upper surface of the planarization layer 270. The planarization layer 270 may be conformally formed on underlying layers. The planarization layer 270 may have a substantially uniform thickness along a profile of (e.g., above) the source electrode 210, the drain electrode 230, the connection electrode 710, and the pad electrode 470. The planarization layer 270 may include organic materials or inorganic materials. In an exemplary embodiment of the present invention, the planarization layer 270 may include organic materials such as a photoresist, a polyacryl-based resin, a polyimide-based resin, a poyamide-based resin, a siloxane-based resin, an acryl-based resin, or an epoxy-based resin.

The OLED device 100 may further include a block region extending along the second direction D2 in a portion of the peripheral region 40 that is located between the pixel region 30 and the bending region 50 (see, e.g., FIG. 1). The block region may be located in parallel to the bending region 50, and the planarization layer 270 and the pixel defining layer 310 need not be disposed in the block region. Thus, the planarization layer 270 and the pixel defining layer 310 need not be disposed in the peripheral region 40. Thus, the planarization layer 270 and the pixel defining layer 310 need not be disposed in the block region which may prevent water or moisture permeated into the pixel region 30 from permeating through the planarization layer 270 and the pixel defining layer 310 and into the pad region 60 and/or the bending region 50.

The lower electrode 290 may be disposed in the pixel region 30 on the planarization layer 270. The lower electrode 290 may be in direct contact with the drain electrode 230 via a contact hole formed by removing a portion of the planarization layer 270. The lower electrode 290 may be electrically connected to the semiconductor element 250. The lower electrode 290 may include a metal, a metal alloy, a metal nitride, a conductive metal oxide, or transparent conductive materials. These may be used alone or in a combination thereof. In an exemplary embodiment of the present invention, the lower electrode 290 may have a multi-layered structure. Alternatively, the lower electrode 290 may have a single layer structure.

The pixel defining layer 310 may be disposed in the pixel region 30 on the planarization layer 270, and may expose a portion of the lower electrode 290. As an example, the pixel defining layer 310 may cover both lateral portions of the lower electrode 290. Alternatively, the pixel defining layer 310 may be disposed in the peripheral region 40. The pixel defining layer 310 may include organic materials or inorganic materials. In an exemplary embodiment of the present invention, the pixel defining layer 310 may include organic materials.

The light emitting layer 330 may be disposed on a portion of the lower electrode 290 exposed by the pixel defining layer 310. Thus, the light emitting layer 330 may be in direct contact with the lower electrode 290. The lower electrode 290 may have a wider width than a width of the light emitting layer 330 (e.g., in the first direction D1). The light emitting layer 330 may be formed using at least one of light emitting materials capable of generating different colors of light (e.g., a red color of light, a blue color of light, or a green color of light) according to sub-pixels. Alternatively, the light emitting layer 330 may generally generate a white color of light by stacking a plurality of light emitting materials capable of generating different colors of light such as a red color of light, a green color of light, or a blue color of light. Thus, a color filter may be disposed on the light emitting layer 330. The color filter may include at least one selected from a red color filter, a green color filter, or a blue color filter. Alternatively, the color filter may include a yellow color filter, a cyan color filter, or a magenta color filter. The color filter may include a photosensitive resin (or color photoresist).

The upper electrode 340 may be disposed in the pixel region 30 on the pixel defining layer 310 and the light emitting layer 330. The upper electrode 340 may include a metal, a metal alloy, a metal nitride, a conductive metal oxide, or transparent conductive materials. These may be used alone or in a combination thereof. In an exemplary embodiment of the present invention, the upper electrode 340 may have a multi-layered structure. Alternatively, the upper electrode 340 may have a single layer structure. Thus, the OLED device 100 may include the pixel structure 200 including the lower electrode 290, the light emitting layer 330, and the upper electrode 340.

The first TFE layer 451 may be disposed in the pixel region 30 on the upper electrode 340. The first TFE layer 451 may cover the upper electrode 340, and may have a substantially uniform thickness along a profile of the upper electrode 340. The first TFE layer 451 may prevent the pixel structure 200 from being deteriorated by the permeation of moisture, water, or oxygen. In addition, the first TFE layer 451 may protect the pixel structure 200 from external impacts. The first TFE layer 451 may include inorganic materials having flexibility.

The second TFE layer 452 may be disposed on the first TFE layer 451. The second TFE layer 452 may increase the flatness of the OLED device 100, and may protect the pixel structure 200. The second TFE layer 452 may include organic materials having flexibility.

The third TFE layer 453 may be disposed on the second TFE layer 452. The third TFE layer 453 may cover the second TFE layer 452, and may have a substantially uniform thickness along a profile of the second TFE layer 452. The third TFE layer 453 together with the first TFE layer 451 and the second TFE layer 452 may prevent the pixel structure 200 from being deteriorated by the permeation of moisture, water, or oxygen. In addition, the third TFE layer 453 together with the first TFE layer 451 and the second TFE layer 452 may protect the pixel structure 200 from external impacts. The third TFE layer 453 may include inorganic materials having flexibility. Accordingly, the OLED device 100 may include the TFE structure 450 including the first TFE layer 451, the second TFE layer 452, and the third TFE layer 453.

As an example, the TFE structure 450 may have a five layer structure in which first through fifth TFE layers are stacked or a seven layer structure in which the first through seventh TFE layers are stacked.

A plurality of sensing electrodes may be disposed in the pixel region 30 on the TFE structure 450. The first sensing electrode 530 among the plurality of sensing electrodes is illustrated, for example, in FIG. 9, and the second sensing electrode 535 among the plurality of sensing electrodes is illustrated, for example, in FIG. 10. In an exemplary embodiment of the present invention, a same touch sensing signal from the external device 101 may be applied to the first sensing electrode 530 and the second sensing electrode 535. The first sensing electrode 530 may be spaced apart from the second sensing electrode 535 (e.g., in the first and/or second direction D1 or D2), and sub-sensing electrodes may be disposed between the first sensing electrode 530 and the second sensing electrode 535 (see, e.g., FIG. 4). Each of the first sensing electrode 530 and the second sensing electrode 535 may include carbon nanotube (CNT), transparent conductive oxide (TCO), indium tin oxide (ITO), indium gallium zinc oxide (GZO), zinc oxide (ZnO), graphene, silver nanowire (AgNW), copper (Cu), or chromium (Cr). In an exemplary embodiment of the present invention, each of the first sensing electrode 530 and the second sensing electrode 535 may have a multi-layered structure. As an example, an inorganic insulation layer may be disposed between the first and the second sensing electrodes 530 and 535 and the third TFE layer 453. Alternatively, each of the first sensing electrode 530 and the second sensing electrode 535 may have a single layer structure.

The first touch screen wiring 630 may be disposed in the peripheral region 40, the bending region 50, and the pad region 60 on the planarization layer 270. In an exemplary embodiment of the present invention, referring to FIG. 8, the first touch screen wiring 630 may be one of a plurality of touch screen wirings. Referring to FIG. 6, the first touch screen wiring 630 (e.g., corresponding to the first touch screen wiring 630 described with reference to FIG. 9) may be connected to the first sensing electrode 530 (e.g., corresponding to the first sensing electrode 530 described with reference to FIG. 9) in the display region 10 (e.g., or in the pixel region 30), and may extend in the first direction D1. Referring to FIG. 8, the first touch screen wiring 630 may be disposed in the peripheral region 40, the bending region 50, and the pad region 60. Referring to FIG. 9, the first touch screen wiring 630 may substantially fill the first contact hole 711 in the pad region 60, and may be in direct contact with the connection electrode 710. The first touch screen wiring 630 may be in direct contact with the pad electrode 470 via a contact hole, which exposes a portion of the pad electrode 470, of the planarization layer 270.

The second touch screen wiring 635 may be disposed in the peripheral region 40, the bending region 50, and a portion of the pad region 60 on the planarization layer 270. In an exemplary embodiment of the present invention, referring to FIG. 8, the second touch screen wiring 635 may be one of a plurality of touch screen wirings. Referring to FIG. 6, the fifth touch screen wiring 635 (e.g., corresponding to the second touch screen wiring 635 described with reference to FIG. 10) may be connected to the sixth sensing electrode 535 (e.g., corresponding to the second sensing electrode 535 of FIG. 10) in the display region 10 (or in the pixel region 30), and may extend in the first direction D1. Referring to FIG. 8, the fifth touch screen wiring 635 may be disposed in the peripheral region 40, the bending region 50, and a portion of the pad region 60. Referring to FIG. 10, the second touch screen wiring 635 may substantially fill the second contact hole 712 in the pad region 60, and may be in direct contact with the connection electrode 710. Each of the first touch screen wiring 630 and the second touch screen wiring 635 may include a metal, an alloy of a metal, a metal nitride, a conductive metal oxide, or transparent conductive materials. These may be used alone or in a combination thereof. In an exemplary embodiment of the present invention, each of the first touch screen wiring 630 and the second touch screen wiring 635 may have a multi-layered structure. Alternatively, each of the first touch screen wiring 630 and the second touch screen wiring 635 may have a single layer structure.

In an exemplary embodiment of the present invention, the first sensing electrode 530, the second sensing electrode 535, the first touch screen wiring 630, and the second touch screen wiring 635 may be substantially simultaneously formed using the same materials.

The protective insulation layer 790 may be disposed on the first sensing electrode 530, the second sensing electrode 535, the first touch screen wiring 630, and the second touch screen wiring 635 to protect the first sensing electrode 530, the second sensing electrode 535, the first touch screen wiring 630, and the second touch screen wiring 635.

The protective insulation layer 790 may substantially cover (e.g., may substantially cover an upper surface of) the first sensing electrode 530, the second sensing electrode 535, the first touch screen wiring 630, and the second touch screen wiring 635, and may have a substantially flat upper surface without a step around the first sensing electrode 530, the second sensing electrode 535, the first touch screen wiring 630, and the second touch screen wiring 635. Alternatively, the protective insulation layer 790 may cover the first sensing electrode 530, the second sensing electrode 535, the first touch screen wiring 630, and the second touch screen wiring 635, and may have a substantially uniform thickness along a profile of (e.g., above) the first sensing electrode 530, the second sensing electrode 535, the first touch screen wiring 630, and the second touch screen wiring 635. The protective insulation layer 790 may include organic materials or inorganic materials. Accordingly, the OLED device 100 may include the touch screen structure 500 including the first sensing electrode 530, the second sensing electrode 535, and the protective insulation layer 790.

In an exemplary embodiment of the present invention, when the OLED device 100 is bent, the bending region 50 may have a round (e.g., curved) shape, and the connection structure 700 disposed in the pad region 60 may be disposed on a lower surface of the OLED device 100.

The OLED device 100 in accordance with an exemplary embodiment of the present invention includes the connection structure 700 disposed in the pad region 60, and thus a size of the peripheral region 40 may be relatively reduced. Accordingly, a dead space of the OLED device 100 may be reduced, and the OLED device 100 may serve as a touch display device including the touch screen structure 500.

Figure 17A:
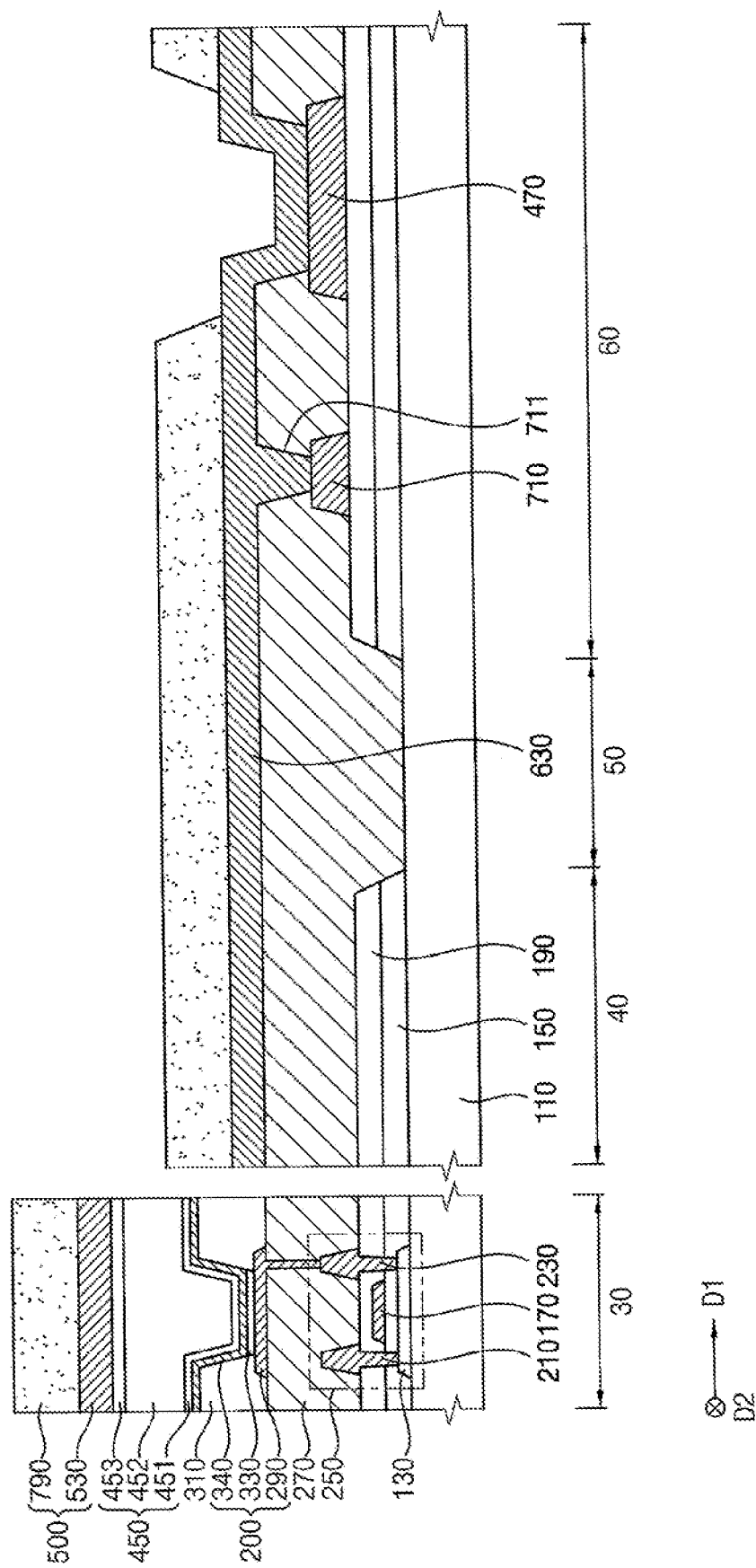
Figure 17B:
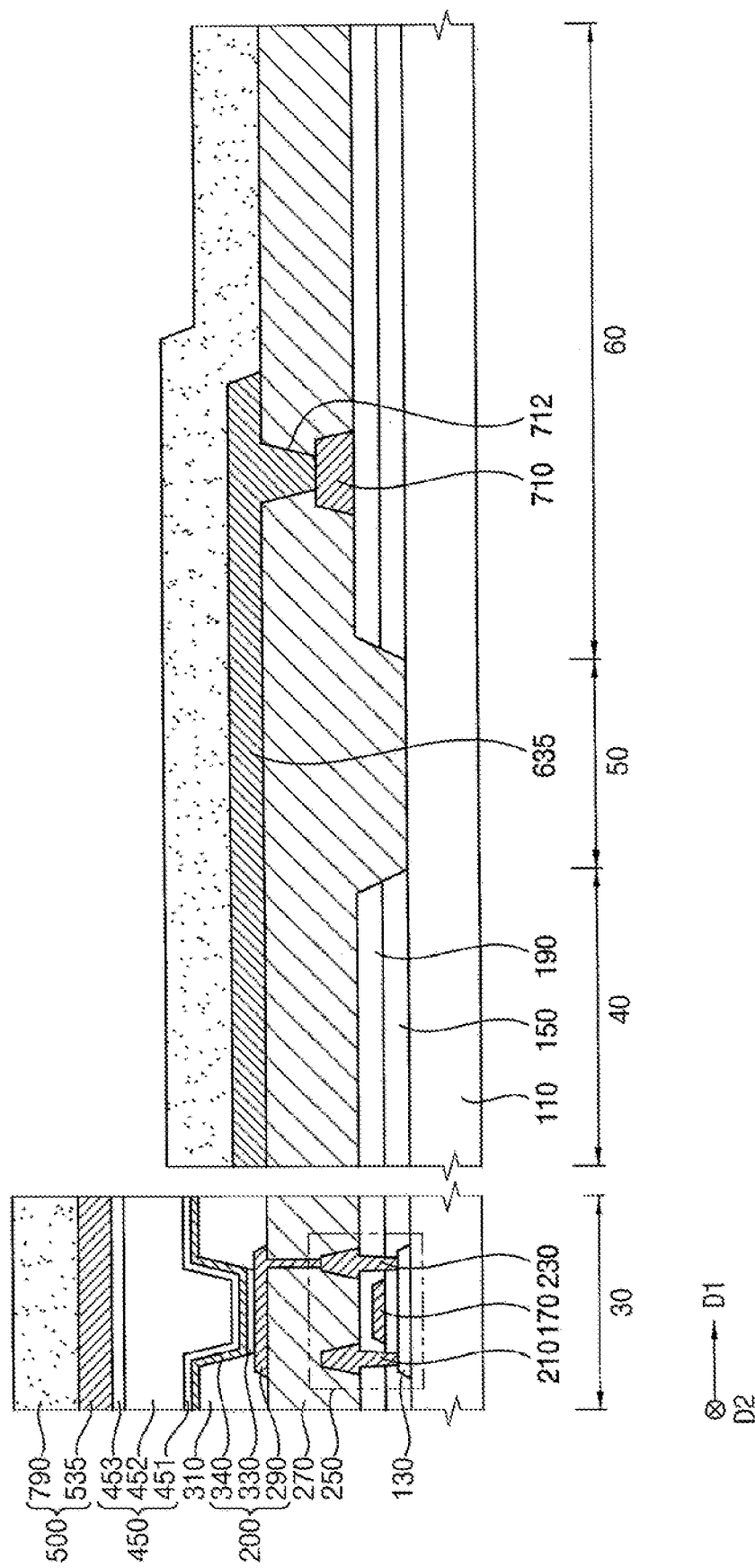
Figure 17C:
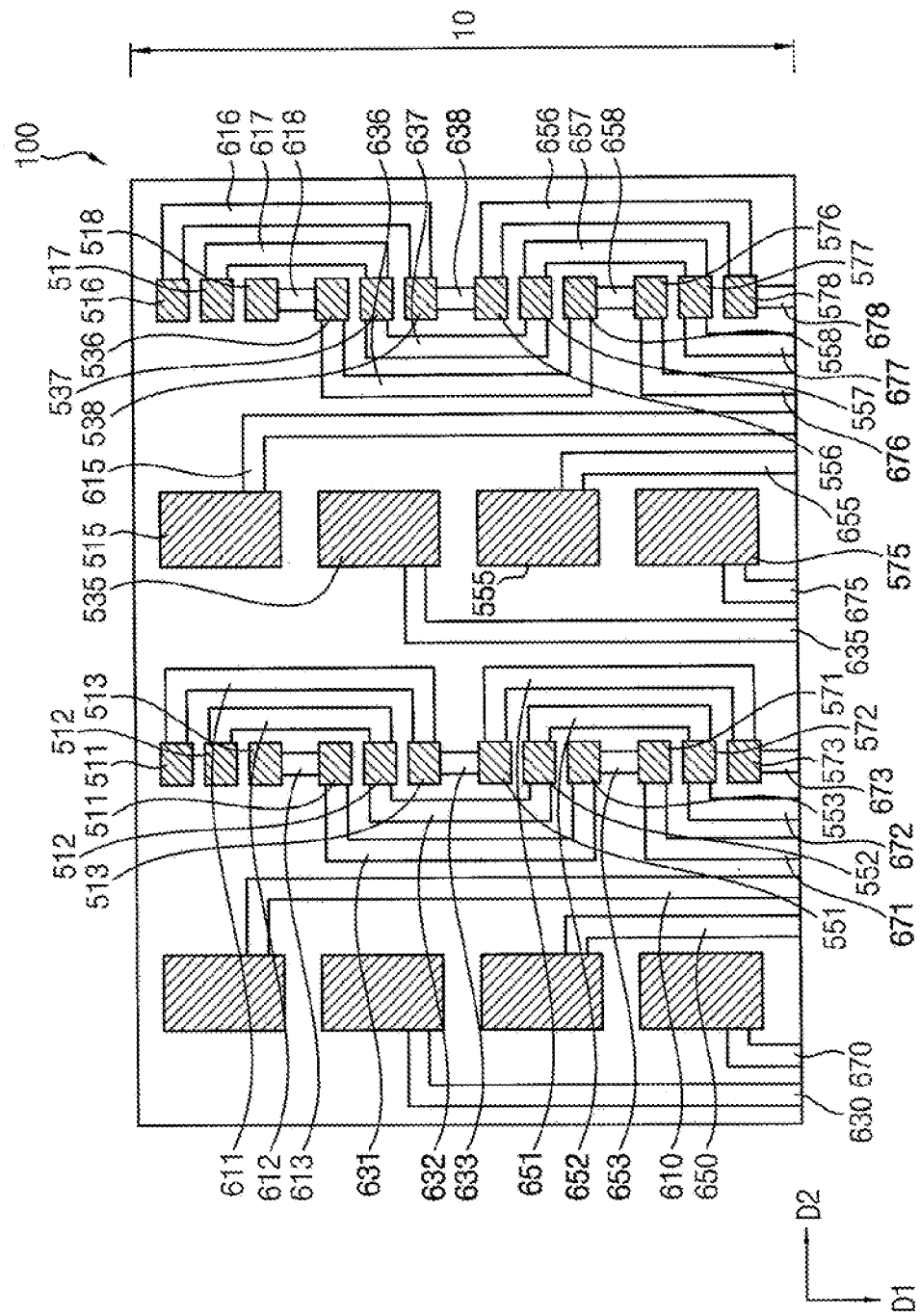
Figure 17D:
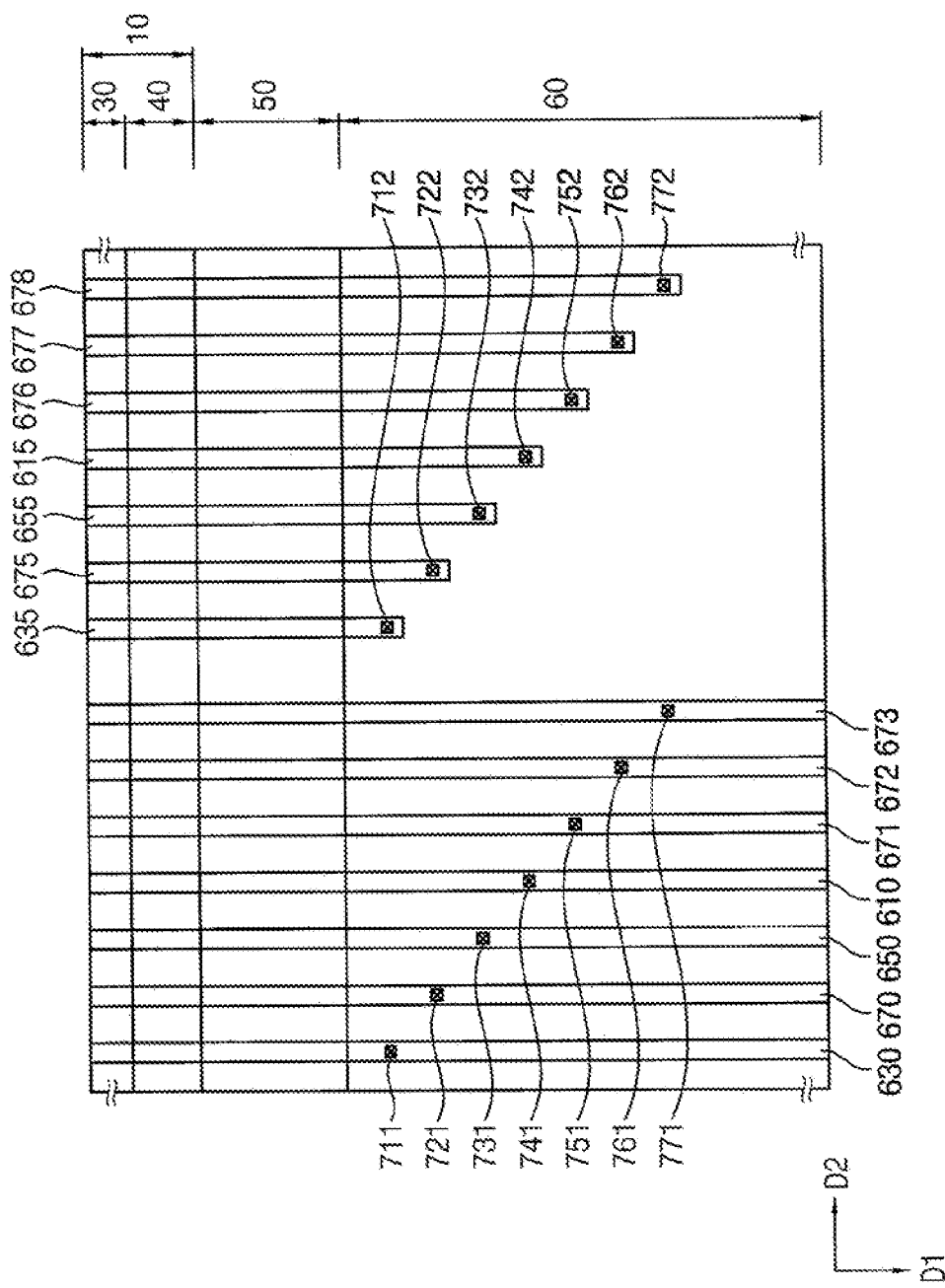

FIGS. 11, 12, 13A, 13B, 14, 15A, 15B, 15C, 16, 17A, 17B, 17C, 17D and 17E are cross-sectional views of a method of manufacturing an OLED device in accordance with an exemplary embodiment of the present invention. For example, FIG. 13A is a plan view of a connection structure included in the OLED device, and FIG. 13B is a cross-sectional view of a connection electrode included in the connection structure of FIG. 13A. FIGS. 15A and 17A are cross-sectional views taken along a line I-I' of FIG. 1, and FIGS. 15B and 17B are cross-sectional views taken along a line II-II' of FIG. 1. FIG. 15C is a plan view of contact holes located on the connection electrode, and FIGS. 17C, 17D, and 17E are plan views of a sensing electrode, a sub-sensing electrode, a touch screen wiring, and a connection structure included in the OLED device.

Figure 11:
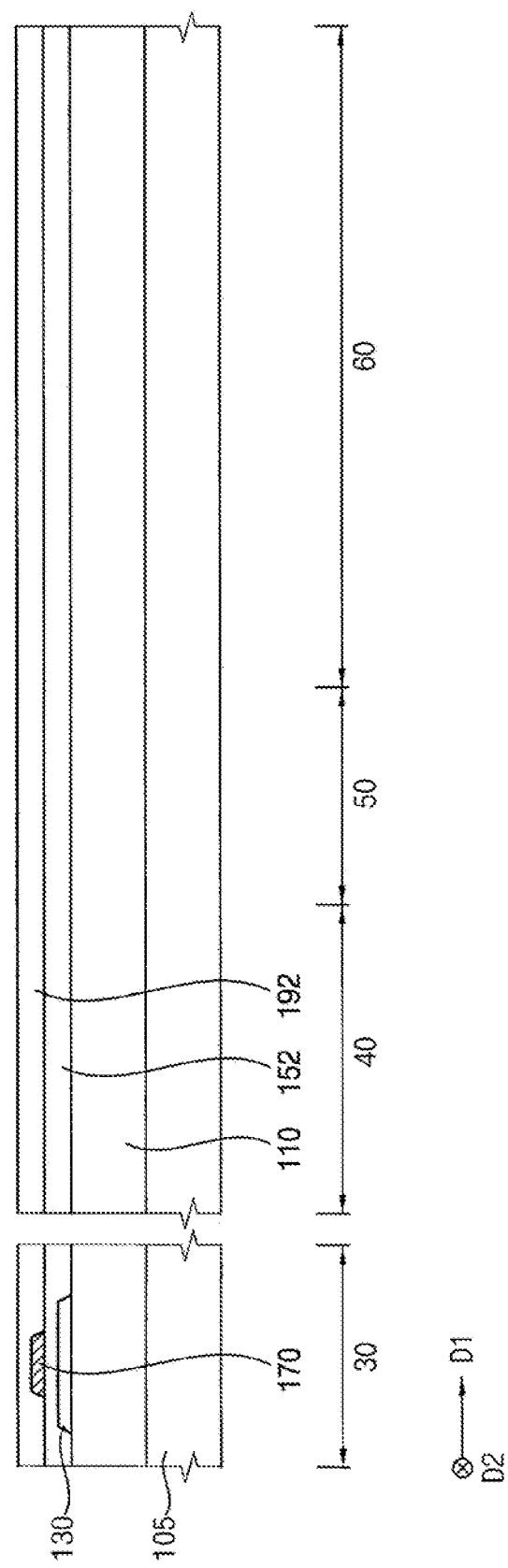

Referring to FIG. 11, a rigid glass substrate 105 may be provided. The substrate 110 including transparent or opaque insulation materials may be formed on the rigid glass substrate 105. The substrate 110 may be formed using a flexible transparent resin substrate. In an exemplary embodiment of the present invention, the substrate 110 may include a first organic layer, a first barrier layer, a second organic layer, and a second barrier layer sequentially stacked. The first barrier layer and the second barrier layer each may be formed using inorganic materials such as silicon compound. The first organic layer and the second organic layer each may be formed using organic materials such as a polyimide-based resin. Each of the first and second barrier layers may block moisture or water that is permeated through the first and second organic layers.

A buffer layer may be formed on the substrate. The buffer layer may be entirely formed in the pixel region 30, the peripheral region 40, and the pad region 60 on the substrate 110, and may have an opening exposing an upper surface of the substrate 110 located in the bending region 50. The buffer layer may reduce or prevent the diffusion of metal atoms and/or impurities from the substrate 110. In addition, the buffer layer may control a rate of a heat transfer in a crystallization process for forming an active layer, thus obtaining a substantially uniform active layer. Further, the buffer layer may increase a surface flatness of the substrate 110 (e.g., when a surface of the substrate 110 is relatively irregular or uneven). The buffer layer may be formed using a silicon compound, or a metal oxide.

The active layer 130 may be formed in the pixel region 30 on the substrate 110. The active layer 130 may be formed using an oxide semiconductor, an inorganic semiconductor, or an organic semiconductor.

A preliminary gate insulation layer 152 may be formed on the active layer 130. The preliminary gate insulation layer 152 may substantially cover (e.g., an upper surface of) the active layer 130 in the pixel region 30 on the substrate 110, and may extend in the first direction D1 from the pixel region 30 into the pad region 60. The preliminary gate insulation layer 152 may be formed on substantially the entire substrate 110 (e.g., on substantially the entire upper surface of the substrate 110). For example, the preliminary gate insulation layer 152 may cover the active layer 130 on the substrate 110, and may have a substantially flat upper surface without a step around the active layer 130. Alternatively, the preliminary gate insulation layer 152 may substantially cover the active layer 130 on the substrate 110, and may be formed as a substantially uniform thickness along a profile of the active layer 130 (e.g., on an upper surface of the active layer 130). The preliminary gate insulation layer 152 may be formed using a silicon compound, or a metal oxide. For example, the preliminary gate insulation layer 152 may include SiOx, SiNx, SiOxNy, SiOxCy, SiCxNy, AlOx, AlNx, TaOx, HfOx, ZrOx, or TiOx.

The gate electrode 170 may be formed on a portion of the preliminary gate insulation layer 152 under which the active layer 130 is located. The gate electrode 170 may be formed using a metal, a metal alloy, a metal nitride, a conductive metal oxide, or transparent conductive materials. These may be used alone or in a combination thereof. In an exemplary embodiment of the present invention, the gate electrode 170 may have a multi-layered structure. Alternatively, the gate electrode 170 may have a single layer structure.

A preliminary insulating interlayer 192 may be formed on the gate electrode 170. The preliminary insulating interlayer 192 may substantially cover (e.g., an upper surface of) the gate electrode 170 in the pixel region 30 on the preliminary gate insulation layer 152, and may extend in the first direction D1. As an example, the preliminary insulating interlayer 192 may be formed on the entire preliminary gate insulation layer 152 (e.g., on substantially an entire upper surface of the preliminary gate insulation layer 152). For example, the first high-k insulation layer pattern 192 may cover the gate electrode 170 on the preliminary gate insulation layer 152, and may have a substantially flat upper surface without a step around the gate electrode 170. Alternatively, the first high-k insulation layer pattern 192 may substantially cover the gate electrode 170 on the preliminary gate insulation layer 152, and may be formed as a substantially uniform thickness along a profile of the gate electrode 170 (e.g., on the upper surface of the gate electrode 170). The preliminary insulating interlayer 192 may be formed using a silicon compound, or a metal oxide.

Figure 12:
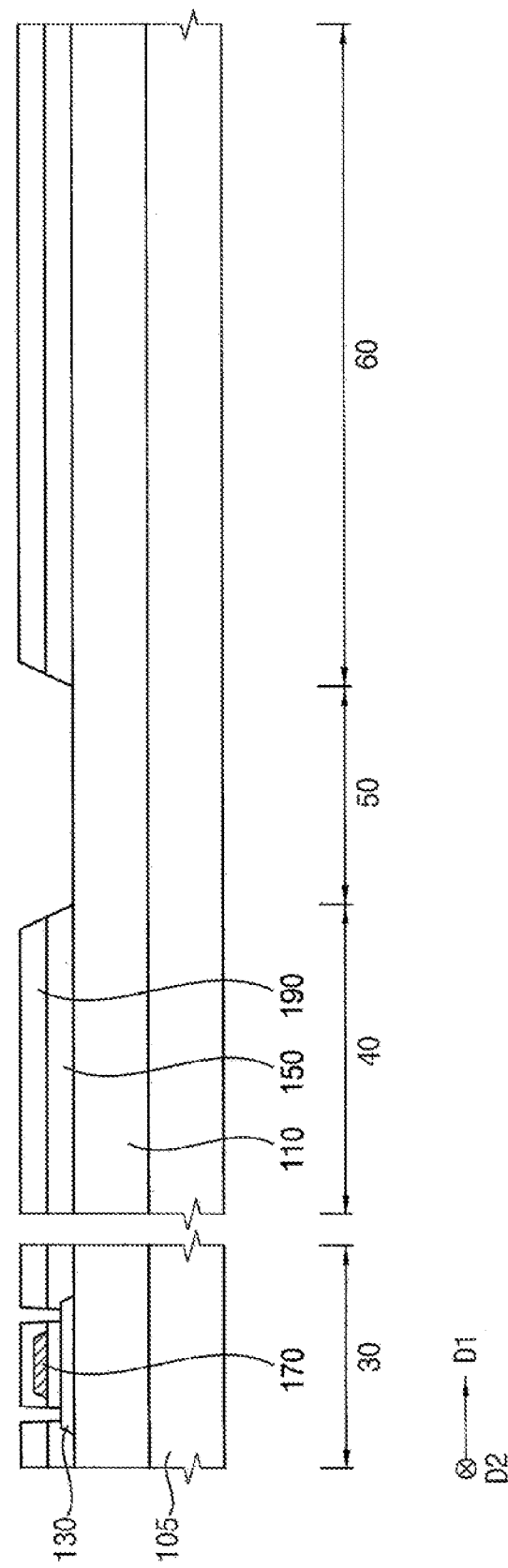
Figure 13A:
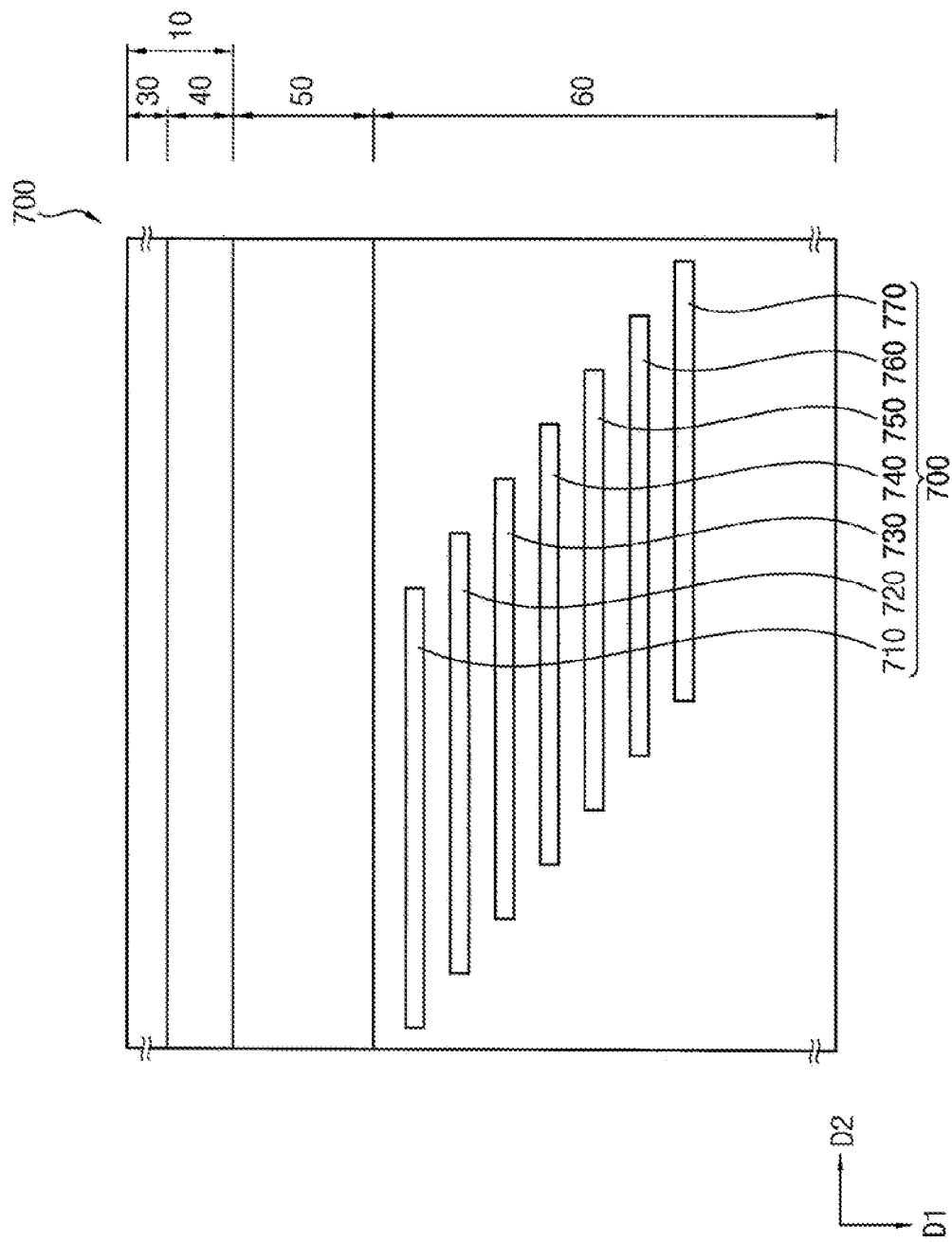
Figure 13B:
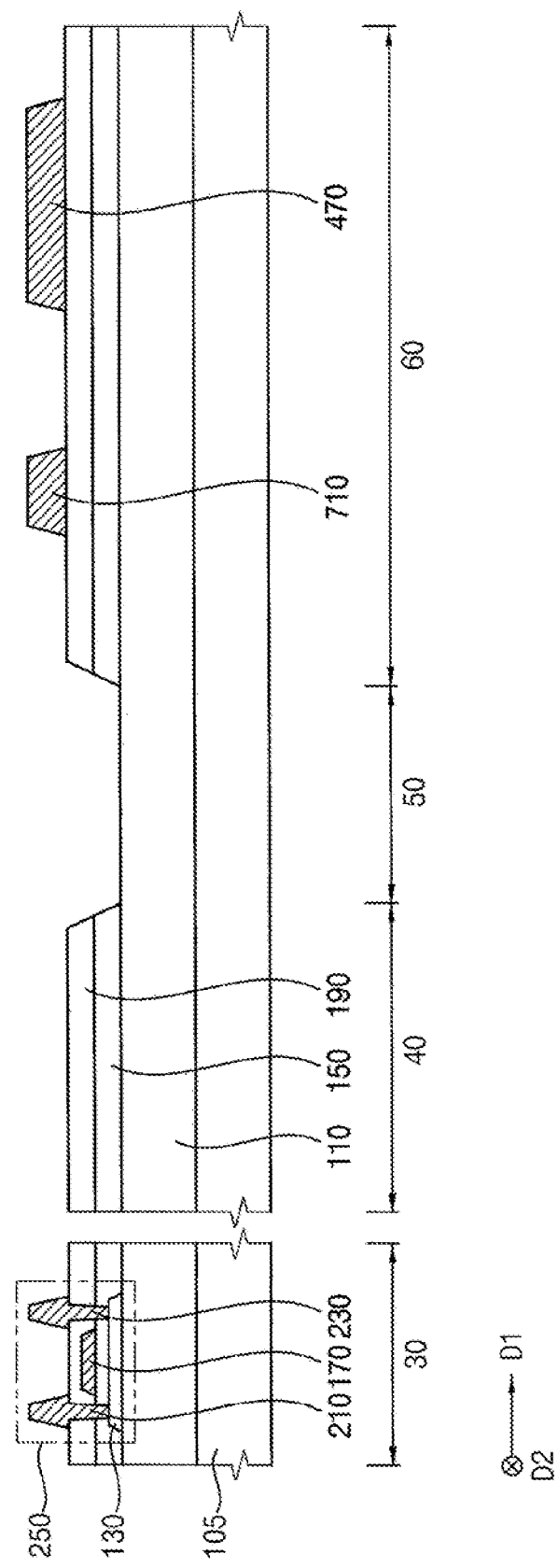

Referring to FIG. 12, in an exemplary embodiment of the present invention, contact holes exposing a first portion (e.g., a source region) of the active layer 130, a second portion (e.g., a drain region) of the active layer 130, and an opening exposing an upper surface of the substrate 110 located in the bending region 50 may be formed by selectively etching the preliminary gate insulation layer 152 and the preliminary insulating interlayer 192. Accordingly, the gate insulation layer 150 and the insulating interlayer 190 may be formed.

Referring to FIGS. 13A and 13B, the source electrode 210 and the drain electrode 230 may be formed in the pixel region 30 on the insulating interlayer 190. The source electrode 210 may be in direct contact with the source region of the active layer 130 via a contact hole formed by removing a portion of the gate insulation layer 150 and the insulating interlayer 190. The drain electrode 230 may be in direct contact with a drain region of the active layer 130 via a contact hole formed by removing another portion of the gate insulation layer 150 and the insulating interlayer 190. Each of the source electrode 210 and the drain electrode 230 may be formed using a metal, an alloy, a metal nitride, a conductive metal oxide, or transparent conductive materials. These may be used alone or in a combination thereof. In an exemplary embodiment of the present invention, each of the source and drain electrodes 210 and 230 may have a multi-layered structure. Alternatively, each of the source and drain electrodes 210 and 230 may have a single layer structure. Accordingly, the semiconductor element 250 including the active layer 130, the gate insulation layer 150, the gate electrode 170, the insulating interlayer 190, the source electrode 210, and the drain electrode 230 may be formed.

Referring to FIG. 13A, the connection structure 700 may be formed in the pad region 60 on the insulating interlayer 190. In an exemplary embodiment of the present invention, the connection electrode 710 (see, e.g., FIG. 13B) may be one of a plurality of connection electrodes included in the connection structure 700. The connection electrode 710 in the pad region 60 may extend in the second direction D2. The connection electrode 710 may be formed using a metal, an alloy of a metal, a metal nitride, a conductive metal oxide, or transparent conductive materials. For example, the connection electrode 710 may include Au, Ag, Al, Pt, Ni, Ti, Pd, Mg, Ca, Li, Cr, Ta, W, Cu, Mo, Sc, Nd, Ir, an alloy of aluminum, AlNx, an alloy of silver, WNx, an alloy of copper, an alloy of molybdenum, TiNx, CrNx, TaNx, SRO, ZnOx, ITO, SnOx, InOx, GaOx, or IZO. These may be used alone or in a combination thereof. In an exemplary embodiment of the present invention, the connection electrode 710 may have a multi-layered structure. Alternatively, the connection electrode 710 may have a single layer structure.

Referring again to FIG. 13B, the pad electrode 470 may be formed in the pad region 60 on the insulating interlayer 190, and may be spaced apart from the connection electrode 710. The pad electrode 470 may be electrically connected to the external device 101 (see, e.g., FIG. 3), and may provide a plurality of signals provided from the external device 101 to the OLED device 100. In an exemplary embodiment of the present invention, the pad electrode 470 (see, e.g., FIG. 13B) may receive the touch sensing signal from the external device 101. The pad electrode 470 may be formed using a metal, an alloy of a metal, a metal nitride, a conductive metal oxide, or transparent conductive materials. These may be used alone or in a combination thereof. In an exemplary embodiment of the present invention, the pad electrode 470 may have a multi-layered structure. Alternatively, the pad electrode 470 may have a single layer structure.

In an exemplary embodiment of the present invention, the source electrode 210, the drain electrode 230, the connection structure 700, and the pad electrode 470 may be located at a same layer as each other, and may be substantially simultaneously formed using the same materials. For example, after a preliminary electrode layer is formed on the entire substrate 110, the source electrode 210, the drain electrode 230, the connection structure 700, and the pad electrode 470 may be formed by selectively etching the preliminary electrode layer.

Figure 14:
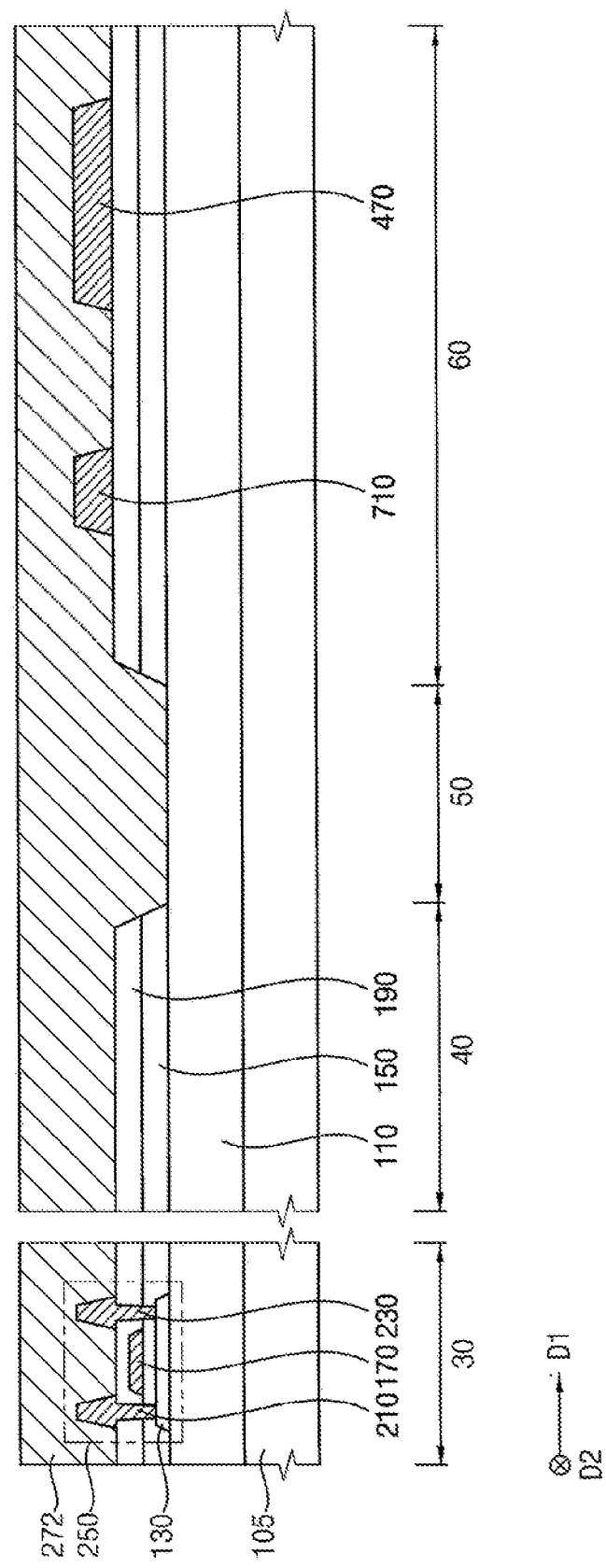
Figure 15A:
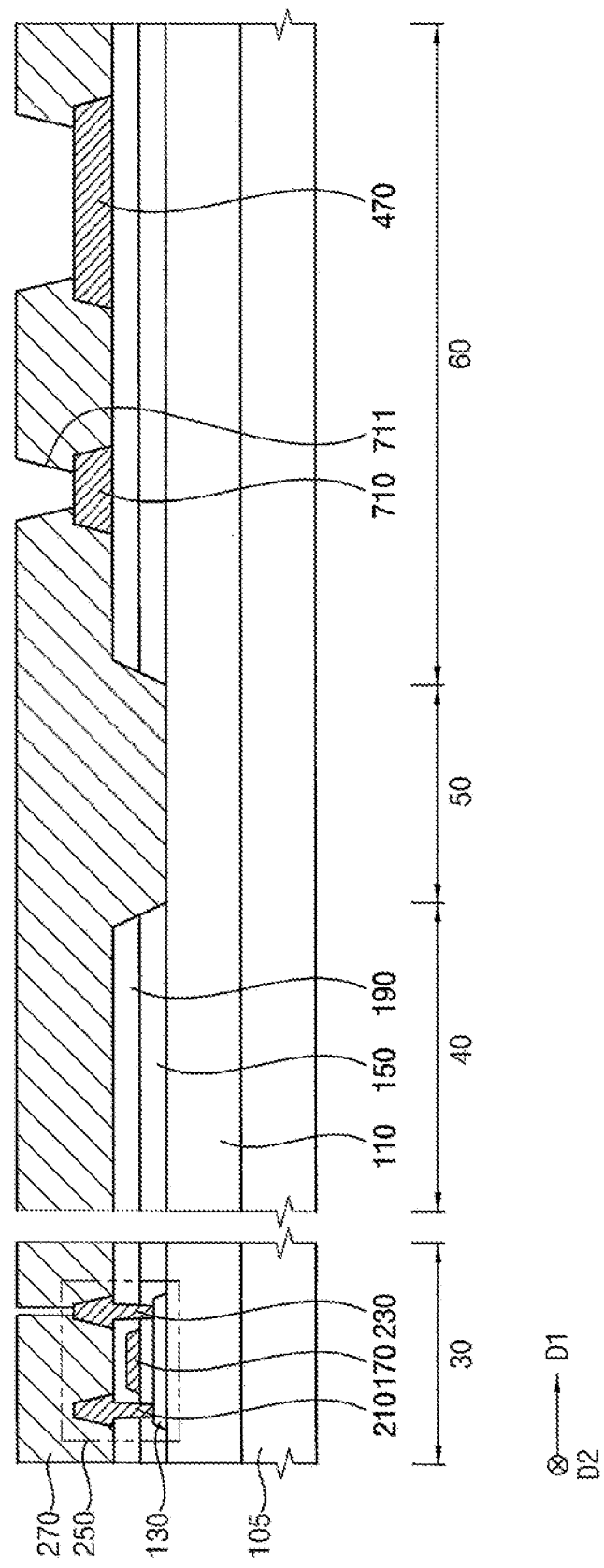
Figure 15B:
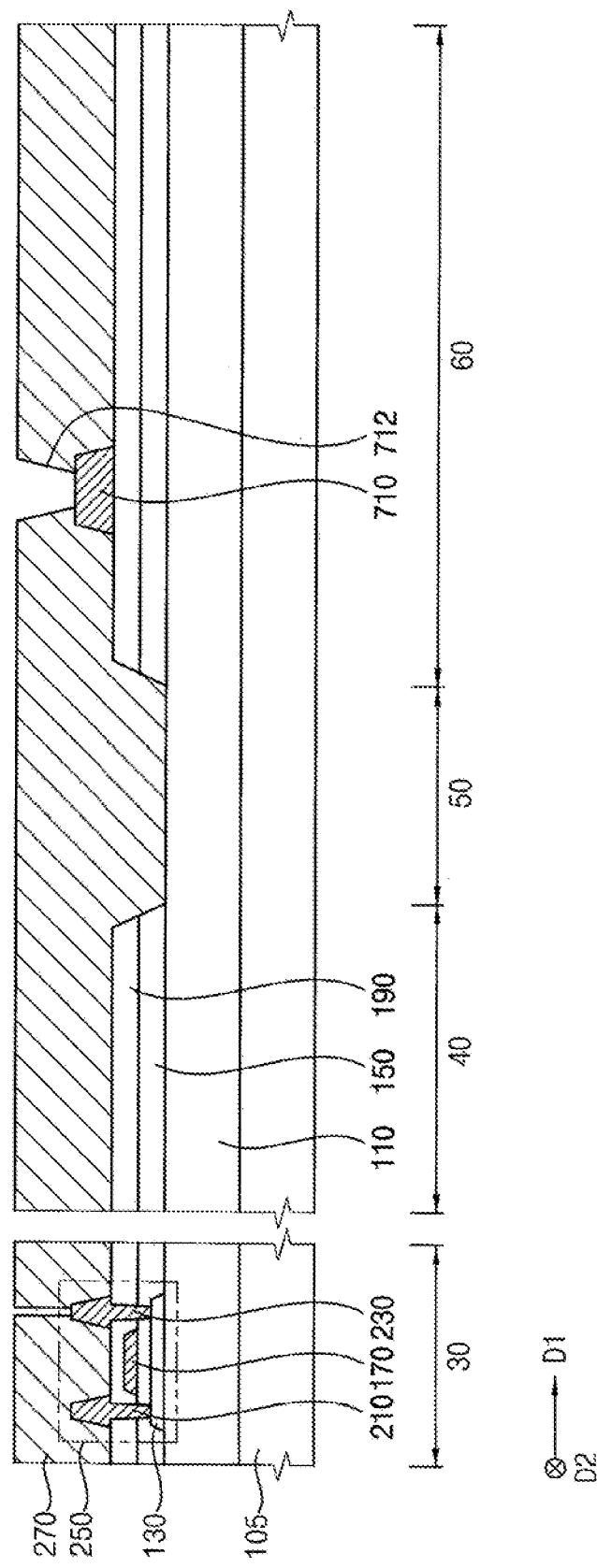
Figure 15C:
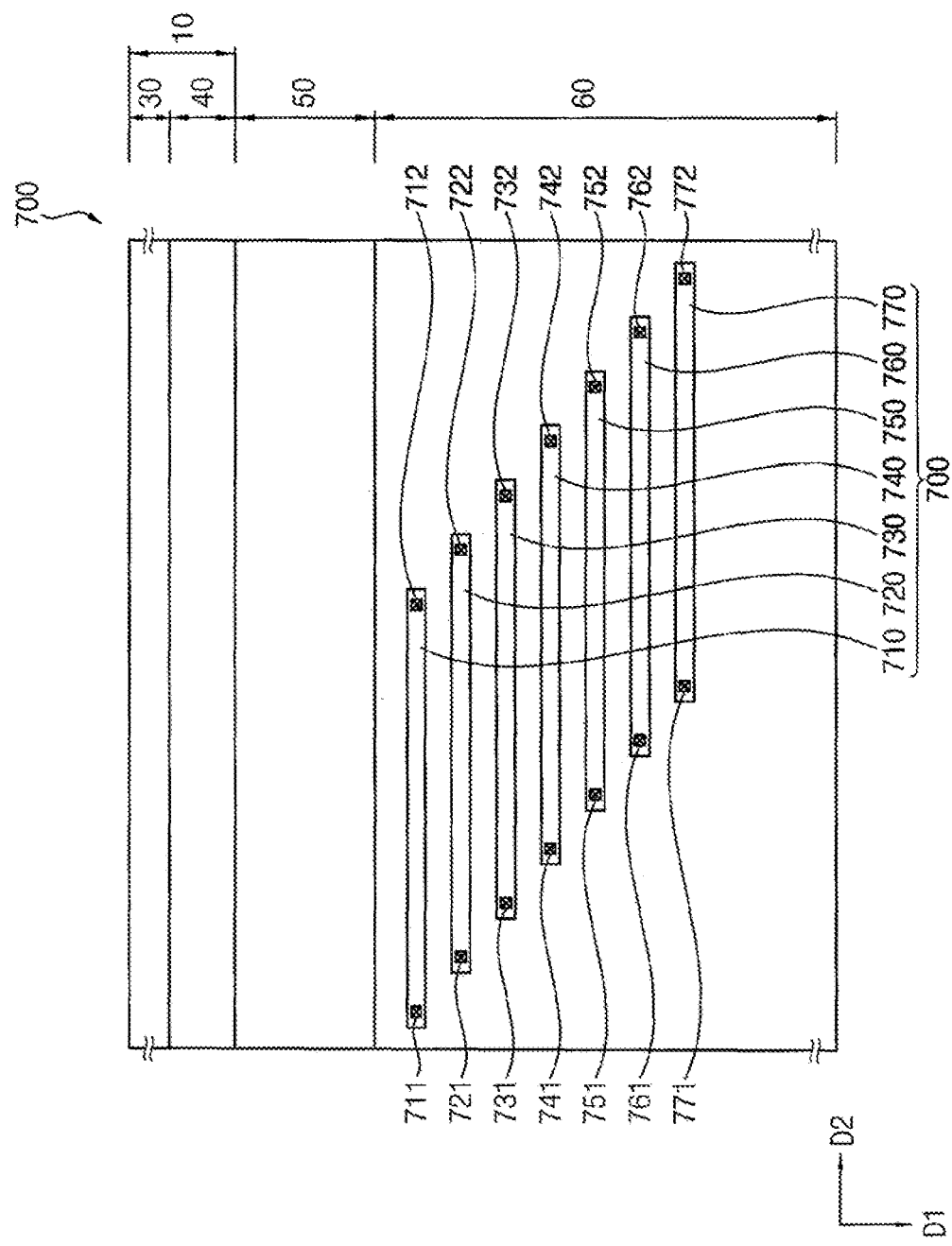
Figure 16:
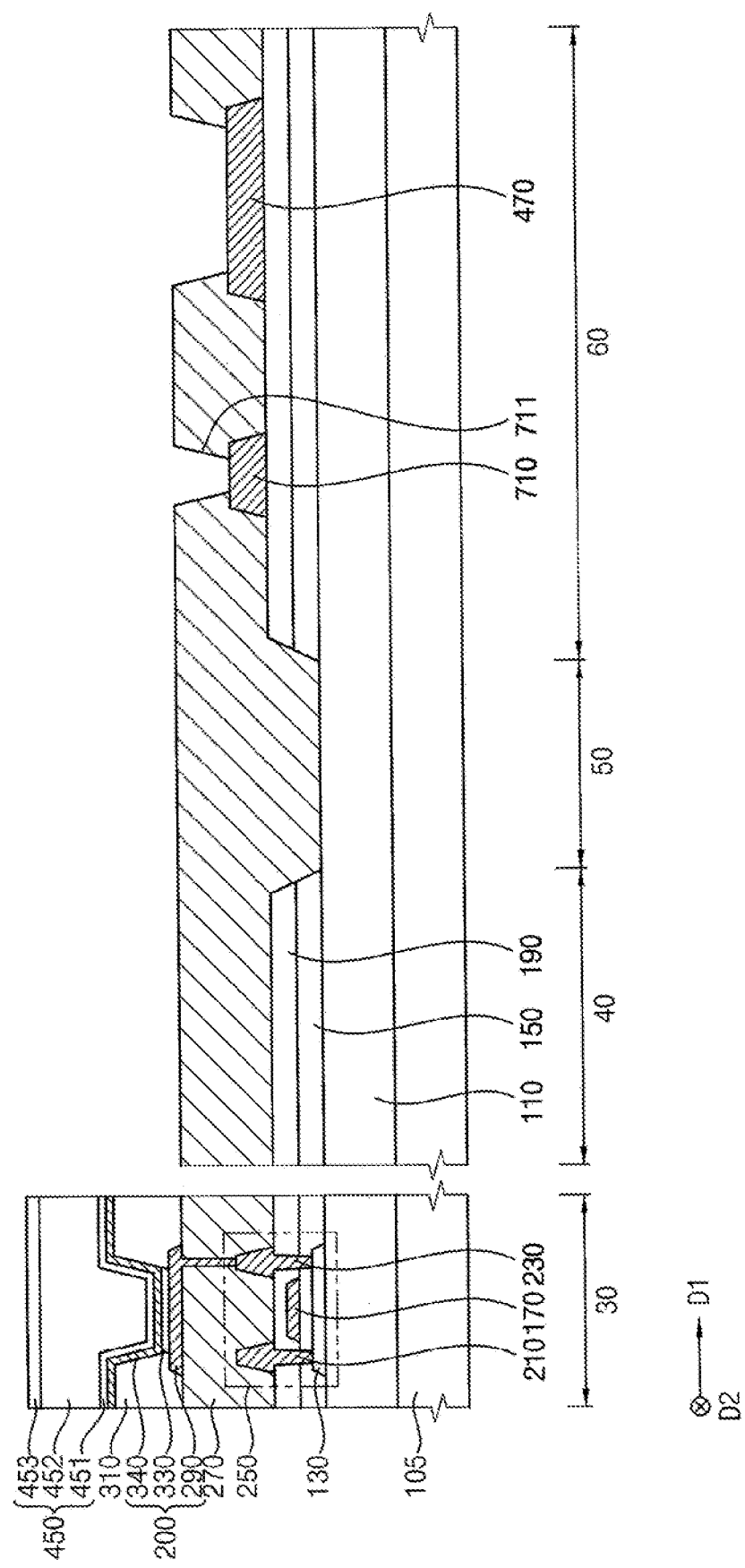

Referring to FIG. 14, a preliminary planarization layer 272 may be formed on the source electrode 210, the drain electrode 230, the connection electrode 710, and the pad electrode 470. The preliminary planarization layer 272 may substantially cover the source electrode 210 and the drain electrode 230 in the pixel region 30 on the insulating interlayer 190, and may substantially cover the connection electrode 710 and the pad electrode 470 in the pad region 60 on the insulating interlayer 190. In addition, the preliminary planarization layer 272 may be in direct contact with an upper surface of the substrate 110 located in the bending region 50. As an example, the preliminary planarization layer 272 may substantially fill an opening of the gate insulation layer 150 and the insulating interlayer 190 located in the bending region 50. The preliminary planarization layer 272 may be relatively thick. The preliminary planarization layer 272 may have a substantially flat upper surface, and a planarization process may be further performed on the preliminary planarization layer 272 to implement the flat upper surface of the preliminary planarization layer 272. Alternatively, the preliminary planarization layer 272 may be formed as a substantially uniform thickness along a profile (e.g., on an upper surface) of the source electrode 210, the drain electrode 230, the connection electrode 710, and the pad electrode 470. The preliminary planarization layer 272 may be formed using organic materials or inorganic materials. In an exemplary embodiment of the present invention, the preliminary planarization layer 272 may include organic materials such as a photoresist, a polyacryl-based resin, a polyimide-based resin, a polyamide-based resin, a siloxane-based resin, an acryl-based resin, or an epoxy-based resin.

Referring to FIGS. 15A, 15B, and 15C, a contact hole exposing a portion of the drain electrode 230, the first contact hole 711 exposing a first portion of the connection electrode 710, the second contact hole 712 exposing a second portion of the connection electrode 710, and a contact hole exposing a portion of the pad electrode 470 may be formed by selectively etching the preliminary planarization layer 272. The first contact hole 711 exposing a first portion of the connection electrode 710 and the second contact hole 712 exposing a second portion of the connection electrode 710 may (see, e.g., FIGS. 15A and 15B, respectively) may respectively correspond to the first contact hole 711 and the second contact hole 712, which is located on the connection electrode 710, among a plurality of contact holes illustrated in FIG. 15C.

The lower electrode 290 may be formed in the pixel region 30 on the planarization layer 270. The lower electrode 290 may be in direct contact with the drain electrode 230 via a contact hole formed by removing a portion of the planarization layer 270. The lower electrode 290 may be electrically connected to the semiconductor element 250. The lower electrode 290 may be formed using a metal, a metal alloy, a metal nitride, a conductive metal oxide, or transparent conductive materials. These may be used alone or in a combination thereof. In an exemplary embodiment of the present invention, the lower electrode 290 may have a multi-layered structure. Alternatively, the lower electrode 290 may have a single layer structure.

The pixel defining layer 310 may be formed in the pixel region 30 on the planarization layer 270, and may expose a portion of the lower electrode 290. As an example, the pixel defining layer 310 may substantially cover opposite lateral portions of the lower electrode 290. Alternatively, the pixel defining layer 310 may be disposed in the peripheral region 40. The pixel defining layer 310 may include organic materials or inorganic materials. In an exemplary embodiment of the present invention, the pixel defining layer 310 may be formed using organic materials.

The light emitting layer 330 may be formed in a portion where the portion of the lower electrode 290 is exposed by the pixel defining layer 310. The light emitting layer 330 may be formed using at least one of light emitting materials capable of generating different colors of light (e.g., a red color of light, a blue color of light, or a green color of light) according to sub-pixels. Alternatively, the light emitting layer 330 may generally generate a white color of light by stacking a plurality of light emitting materials capable of generating different colors of light such as a red color of light, a green color of light, or a blue color of light. A color filter may be disposed on the light emitting layer 330. The color filter may include at least one selected from a red color filter, a green color filter, or a blue color filter. Alternatively, the color filter may include a yellow color filter, a cyan color filter, or a magenta color filter. The color filter may be formed using a photosensitive resin (or color photoresist).

The upper electrode 340 may be formed in the pixel region 30 on the pixel defining layer 310 and the light emitting layer 330. The upper electrode 340 may be formed using a metal, a metal alloy, a metal nitride, a conductive metal oxide, or transparent conductive materials. These may be used alone or in a combination thereof. In an exemplary embodiment of the present invention, the upper electrode 340 may have a multi-layered structure. Alternatively, the upper electrode 340 may have a single layer structure. Accordingly, the pixel structure 200 including the lower electrode 290, the light emitting layer 330, and the upper electrode 340 may be formed.

The first TFE layer 451 may be formed in the pixel region 30 on the upper electrode 340. The first TFE layer 451 may substantially cover the upper electrode 340, and may have a substantially uniform thickness along a profile (e.g., on an upper surface) of the upper electrode 340. The first TFE layer 451 may prevent the pixel structure 200 from being deteriorated by a permeation of moisture, water, or oxygen. In addition, the first TFE layer 451 may protect the pixel structure 200 from external impacts. The first TFE layer 451 may be formed using inorganic materials having flexibility.

The second TFE layer 452 may be formed on the first TFE layer 451. The second TFE layer 452 may increase the flatness of the OLED device 100, and may protect the pixel structure 200. The second TFE layer 452 may be formed using organic materials having flexibility.

The third TFE layer 453 may be formed on the second TFE layer 452. The third TFE layer 453 may substantially cover the second TFE layer 452 (e.g., may substantially cover an upper surface of the second TFE layer 452), and may have a substantially uniform thickness along a profile (e.g., above the upper surface) of the second TFE layer 452. The third TFE layer 453 together with the first TFE layer 451 and the second TFE layer 452 may prevent the pixel structure 200 from being deteriorated by a permeation of moisture, water, or oxygen. In addition, the third TFE layer 453 together with the first TFE layer 451 and the second TFE layer 452 may protect the pixel structure 200 from external impacts. The third TFE layer 453 may be formed using inorganic materials having flexibility. Accordingly, the TFE structure 450 including the first TFE layer 451, the second TFE layer 452, and the third TFE layer 453 may be formed.

Referring to FIGS. 17A, 17B, 17C, and 17D, a plurality of sensing electrodes and a plurality of sub-sensing electrodes may be formed in the pixel region 30 on the TFE structure 450. The first sensing electrode 530 among the plurality of sensing electrodes is illustrated, for example, in FIG. 17A, and the second sensing electrode 535 among the plurality of sensing electrodes is illustrated, for example, in FIG. 17B. In an exemplary embodiment of the present invention, a same touch sensing signal from the external device 101 may be applied to the first sensing electrode 530 and the second sensing electrode 535. The first sensing electrode 530 may be spaced apart from the second sensing electrode 535 (e.g., in the first and/or second directions D1 and D2), and the sub-sensing electrodes may be formed between the first sensing electrode 530 and the second sensing electrode 535. Each of the first sensing electrode 530 and the second sensing electrode 535 may be formed using CNT, TCO, ITO, IGZO, ZnO, graphene, AgNW, Cu, or Cr. In an exemplary embodiment of the present invention, each of the first sensing electrode 530 and the second sensing electrode 535 may have a multi-layered structure. Alternatively, each of the first sensing electrode 530 and the second sensing electrode 535 may have a single layer structure. As an example, an inorganic insulation layer may be additionally formed between the first and second sensing electrodes 530 and 535 and the third TFE layer 453.

Referring to FIG. 17D, a plurality of touch screen wirings may be formed. For example referring to FIG. 17A, the first touch screen wiring 630 may be formed in the peripheral region 40, the bending region 50, and the pad region 60 on the planarization layer 270. In an exemplary embodiment of the present invention, the first touch screen wiring 630 (see, e.g., FIG. 17A) may be one of a plurality of touch screen wirings. Referring to FIG. 17C, the first touch screen wiring 630 (see, e.g., FIG. 17A) may be connected (e.g., electrically connected) to the first sensing electrode 530 (see, e.g., FIG. 17C) in the display region 10, and may extend in the first direction D1. Referring to FIG. 17D, the first touch screen wiring 630 may be formed in the peripheral region 40, the bending region 50, and the pad region 60. Referring to FIG. 17A, the first touch screen wiring 630 may substantially fill the first contact hole 711 in the pad region 60, and may be in direct contact with the connection electrode 710. The first touch screen wiring 630 may be in direct contact with the pad electrode 470 via a contact hole, which exposes a portion of the pad electrode 470, of the planarization layer 270.

For example, referring to FIG. 17B, the second touch screen wiring 635 may be formed in the peripheral region 40, the bending region 50, and a portion of the pad region 60 on the planarization layer 270. In an exemplary embodiment of the present invention, the second touch screen wiring 635 (see, e.g., FIG. 17B) may be one of a plurality of touch screen wirings. Referring to FIG. 17C, the second touch screen wiring 635 (see, e.g., FIG. 17B) may be connected to the second sensing electrode 535 (see, e.g., FIG. 17C) in the display region 10, and may extend in the first direction D1. Referring to FIG. 17D, the second touch screen wiring 635 may be formed in the peripheral region 40, the bending region 50, and a portion of the pad region 60. Referring to FIG. 17B, the second touch screen wiring 635 may substantially fill the second contact hole 712 in the pad region 60, and may be in direct contact with the connection electrode 710. Each of the first touch screen wiring 630 and the second touch screen wiring 635 may include a metal, an alloy of a metal, a metal nitride, a conductive metal oxide, or transparent conductive materials. These may be used alone or in a combination thereof. In an exemplary embodiment of the present invention, each of the first touch screen wiring 630 and the second touch screen wiring 635 may have a multi-layered structure. Alternatively, each of the first touch screen wiring 630 and the second touch screen wiring 635 may have a single layer structure.

In an exemplary embodiment of the present invention, the plurality of sensing electrodes, the plurality of sub-sensing electrodes, and the touch screen wirings may be substantially simultaneously formed using the same materials.

The protective insulation layer 790 may be formed on the first sensing electrode 530, the second sensing electrode 535, the first touch screen wiring 630, and the second touch screen wiring 635 to protect the first sensing electrode 530, the second sensing electrode 535, the first touch screen wiring 630, and the second touch screen wiring 635. The protective insulation layer 790 may substantially cover the first sensing electrode 530, the second sensing electrode 535, the first touch screen wiring 630, and the second touch screen wiring 635, and may have a substantially flat upper surface without a step around the first sensing electrode 530, the second sensing electrode 535, the first touch screen wiring 630, and the second touch screen wiring 635. Alternatively, the protective insulation layer 790 may substantially cover the first sensing electrode 530, the second sensing electrode 535, the first touch screen wiring 630, and the second touch screen wiring 635, and may have a substantially uniform thickness along of profile (e.g., on upper surfaces of) the first sensing electrode 530, the second sensing electrode 535, the first touch screen wiring 630, and the second touch screen wiring 635. The protective insulation layer 790 may be formed using organic materials or inorganic materials. Accordingly, a touch screen structure 500 including the first sensing electrode 530, the second sensing electrode 535, and the protective insulation layer 790 may be formed. After the touch screen structure 500 is formed, the rigid glass substrate 105 may be removed from the substrate 110.

Accordingly, an OLED device (e.g., the OLED device 100 illustrated in FIGS. 9 and 10) may be manufactured.

Figure 18:
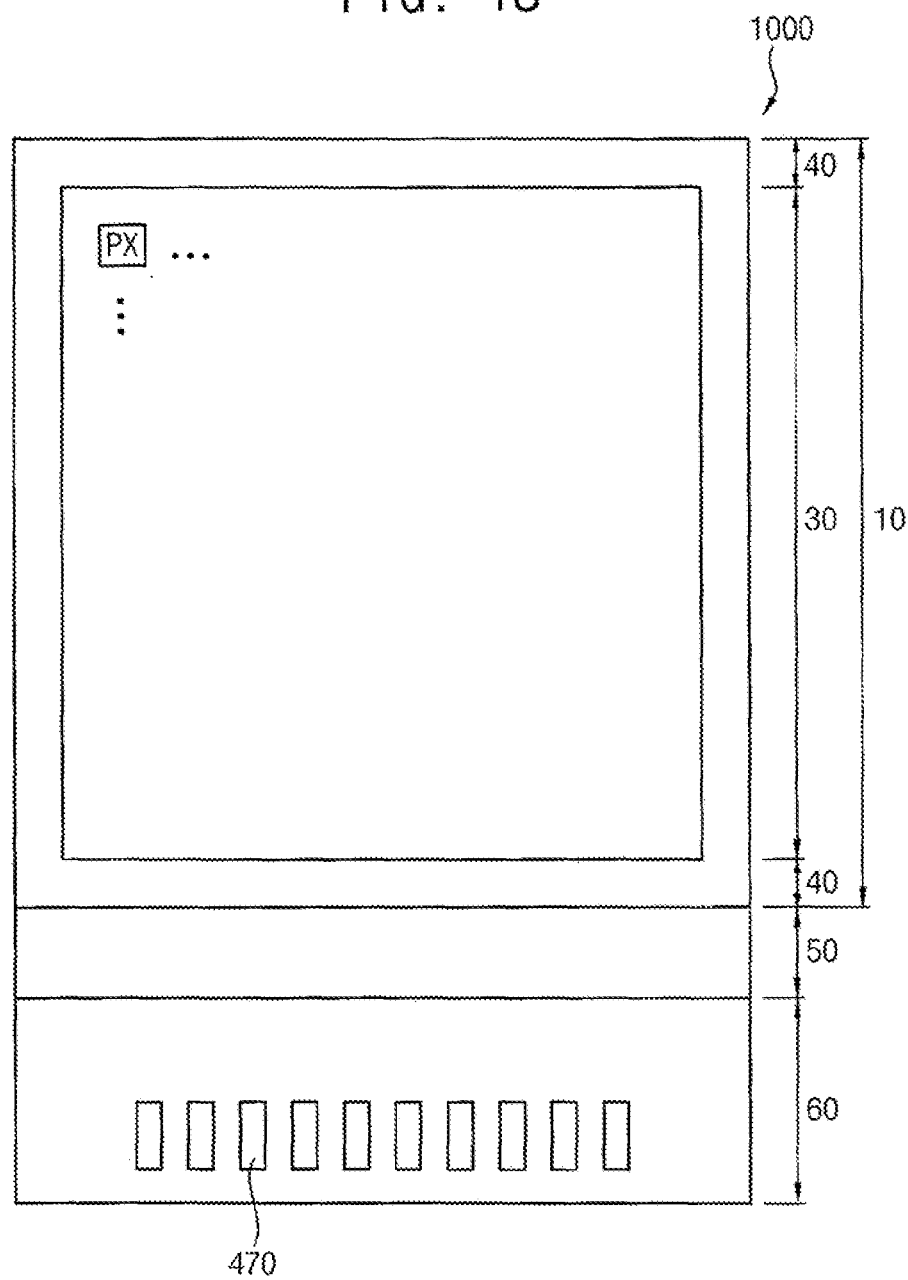
FIG. 18 is a plan view illustrating an OLED device in accordance with an exemplary embodiment of the present invention.
Figure 19B:
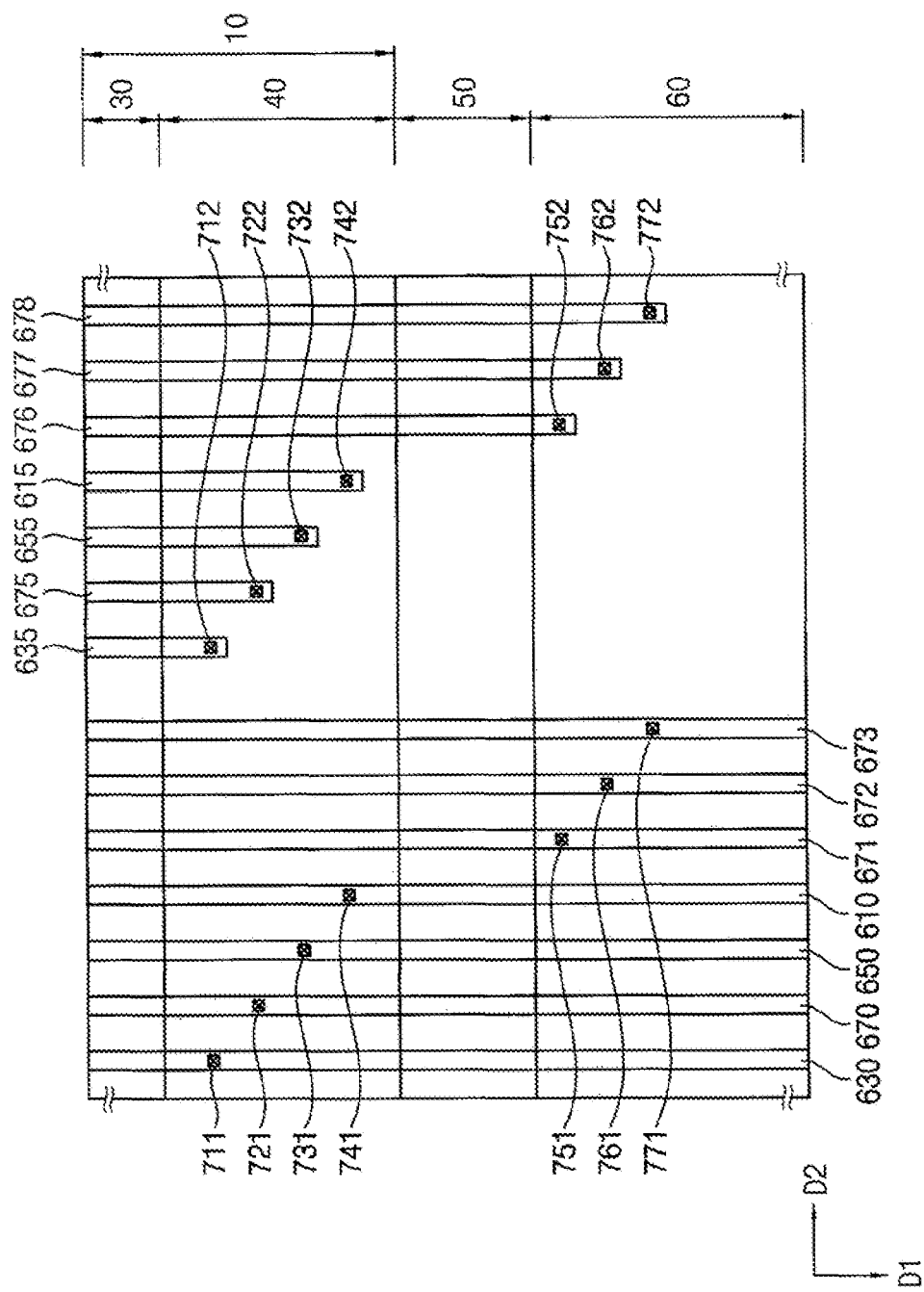
Figure 20:
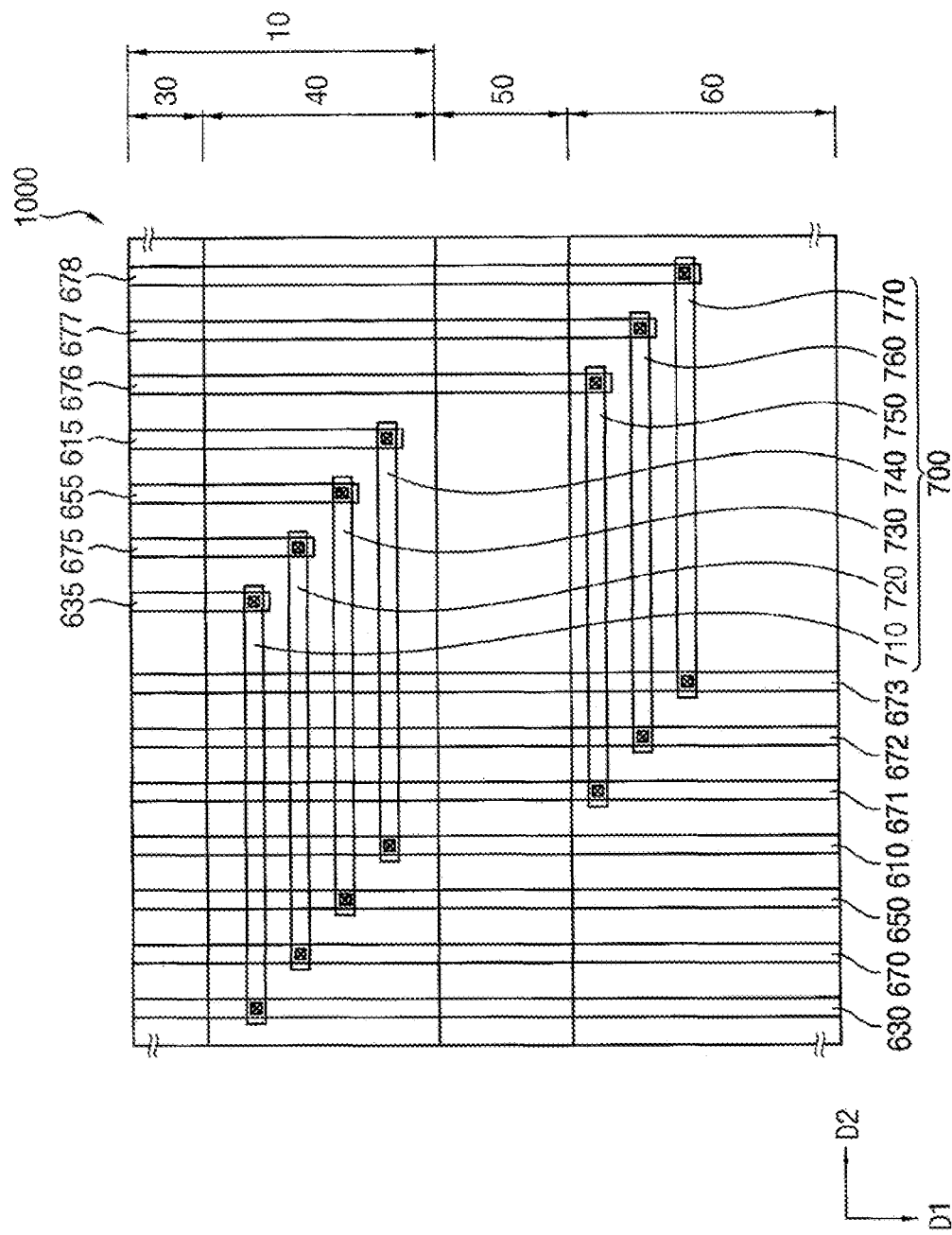

FIG. 18 is a plan view illustrating an OLED device in accordance an exemplary embodiment of the present invention. FIGS. 19A, 19B, and 20 are plan views of a connection structure and touch screen wirings included in the OLED device of FIG. 18. For example, FIG. 19A is a plan view of a connection structure, and FIG. 19B is a plan view of touch screen wirings. FIG. 20 is a plan view of the connection structure and the touch screen wirings included in the OLED device. An OLED device 1000 illustrated in FIGS. 18, 19A, 19B, and 20 may have a configuration substantially the same as or similar to that of the OLED device 100 described in more detail above with reference to FIGS. 1 through 10 except for a connection structure 1700. Thus, duplicative descriptions for elements that are substantially the same as or similar to elements described above with reference to FIGS. 1 through 10 may be omitted below.

Referring to FIGS. 18, 19A, 19B, and 20, an OLED device 1000 may include the display region 10, the bending region 50, and the pad region 60. The display region 10 may include the pixel region 30 and the peripheral region 40 surrounding the pixel region 30. A plurality of pixels PX may be disposed in the display region 10, and the pad region 60 may be spaced apart from the display region 10. Pad electrodes 470 that are electrically connected to the external device 101 may be disposed in the pad region 60. The bending region 50 may be disposed between the display region 10 and the pad region 60. The display region 10, the bending region 50, and the pad region 60 may be sequentially continuously arranged.

Referring to FIGS. 19A, 19B, and 20, a connection structure 1700 may include the first connection electrode 710, the second connection electrode 720, the third connection electrode 730, the fourth connection electrode 740, the fifth connection electrode 750, the sixth connection electrode 760, and the seventh connection electrode 770. In an exemplary embodiment of the present invention, the first through fourth connection electrodes 710, 720, 730, and 740 (e.g., a first connection structure) may be disposed in the peripheral region 40 located adjacent to the bending region 50, and the fifth through seventh connection electrodes 750, 760, and 770 (e.g., a second connection structure) may be disposed in the pad region 60.

As an example, a portion among the connection electrodes may be disposed in the peripheral region 40 located adjacent to the bending region 50, and a remaining portion among the connection electrodes may be disposed in the pad region 60.

Figure 21:
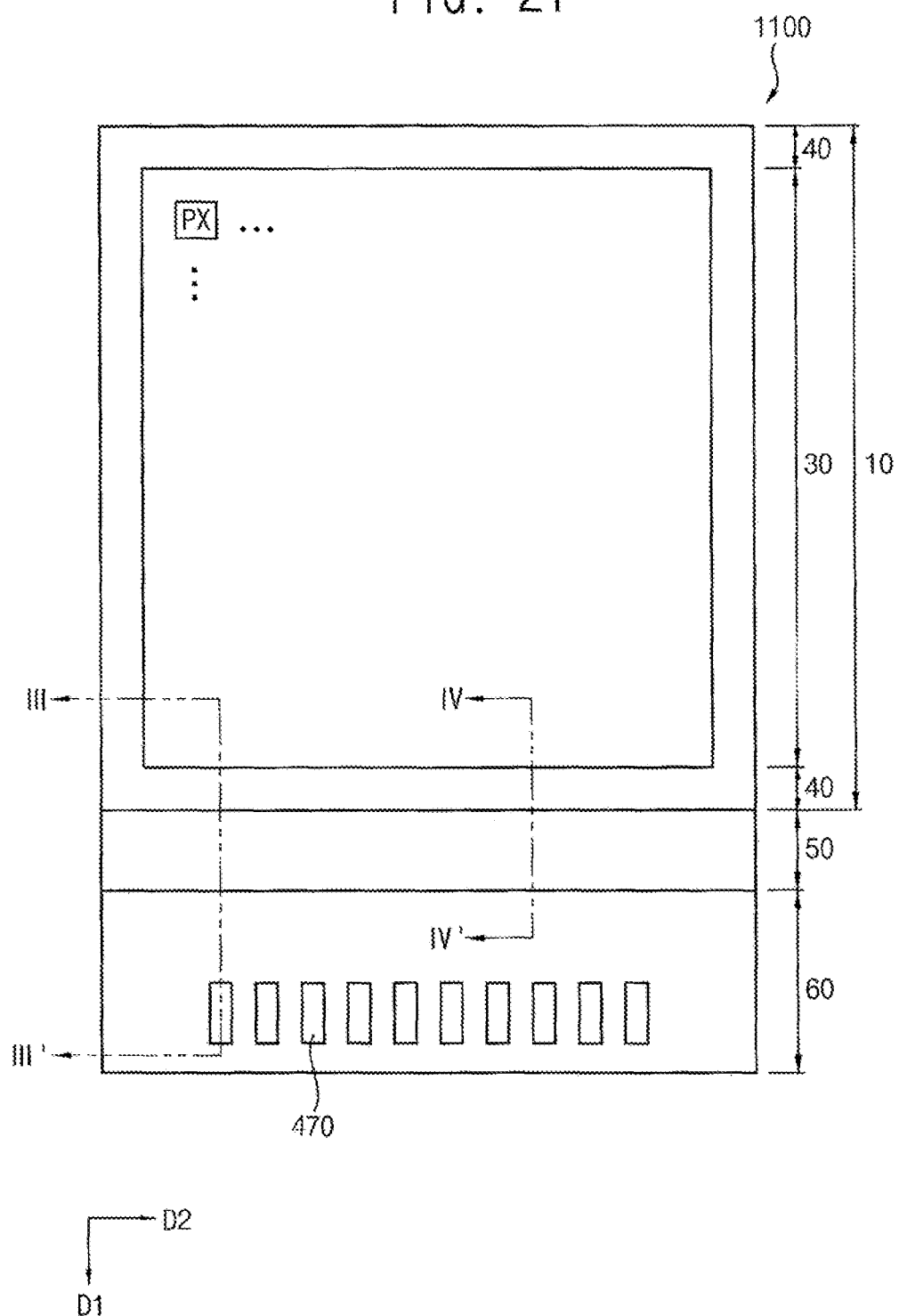
FIG. 21 is a plan view of an OLED device in accordance with an exemplary embodiment of the present invention.
Figure 22:
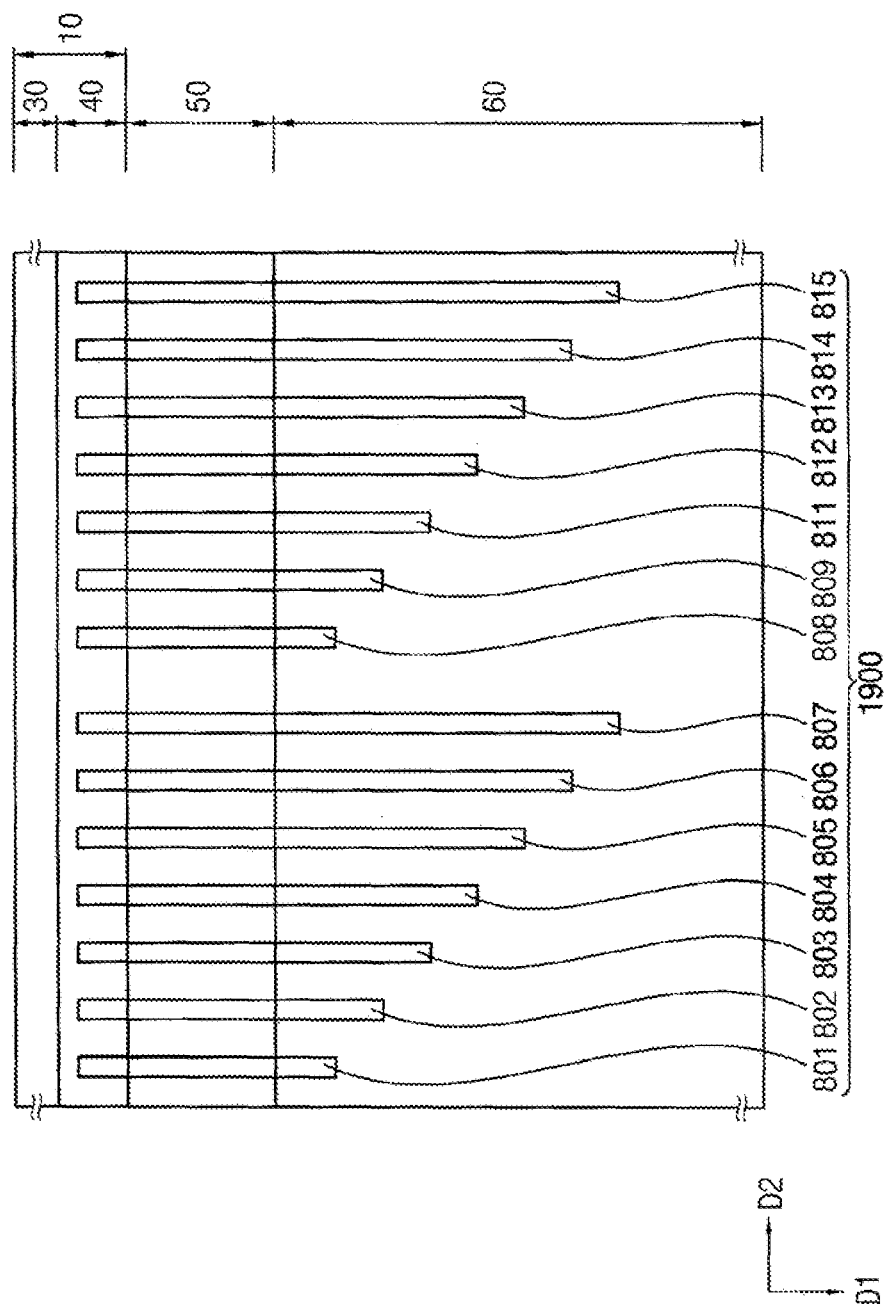
FIGS. 22, 23, and 24 are plan views of connection wirings, a connection structure, and touch screen wirings included in the OLED device of FIG. 21.
Figure 23:
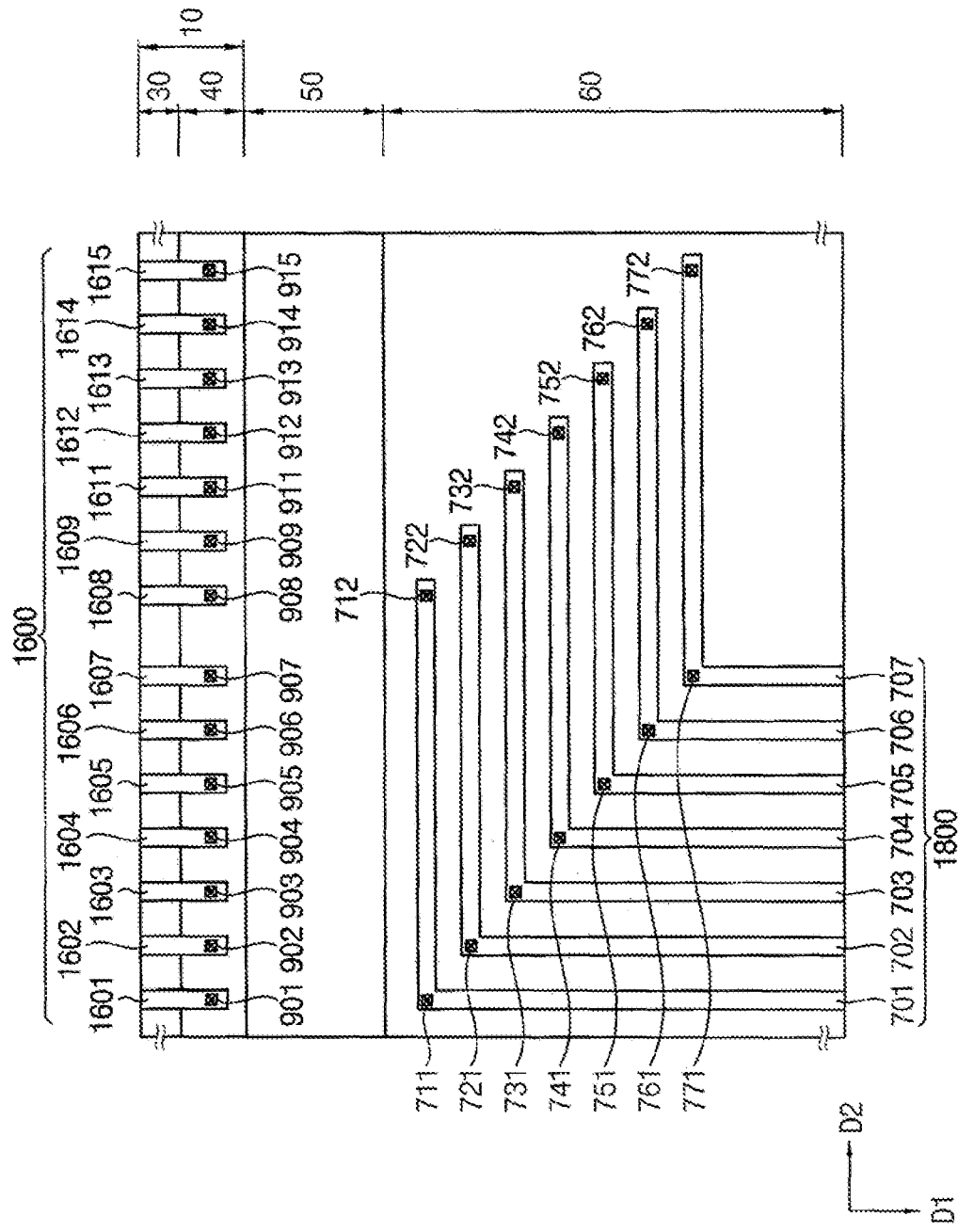
Figure 24:
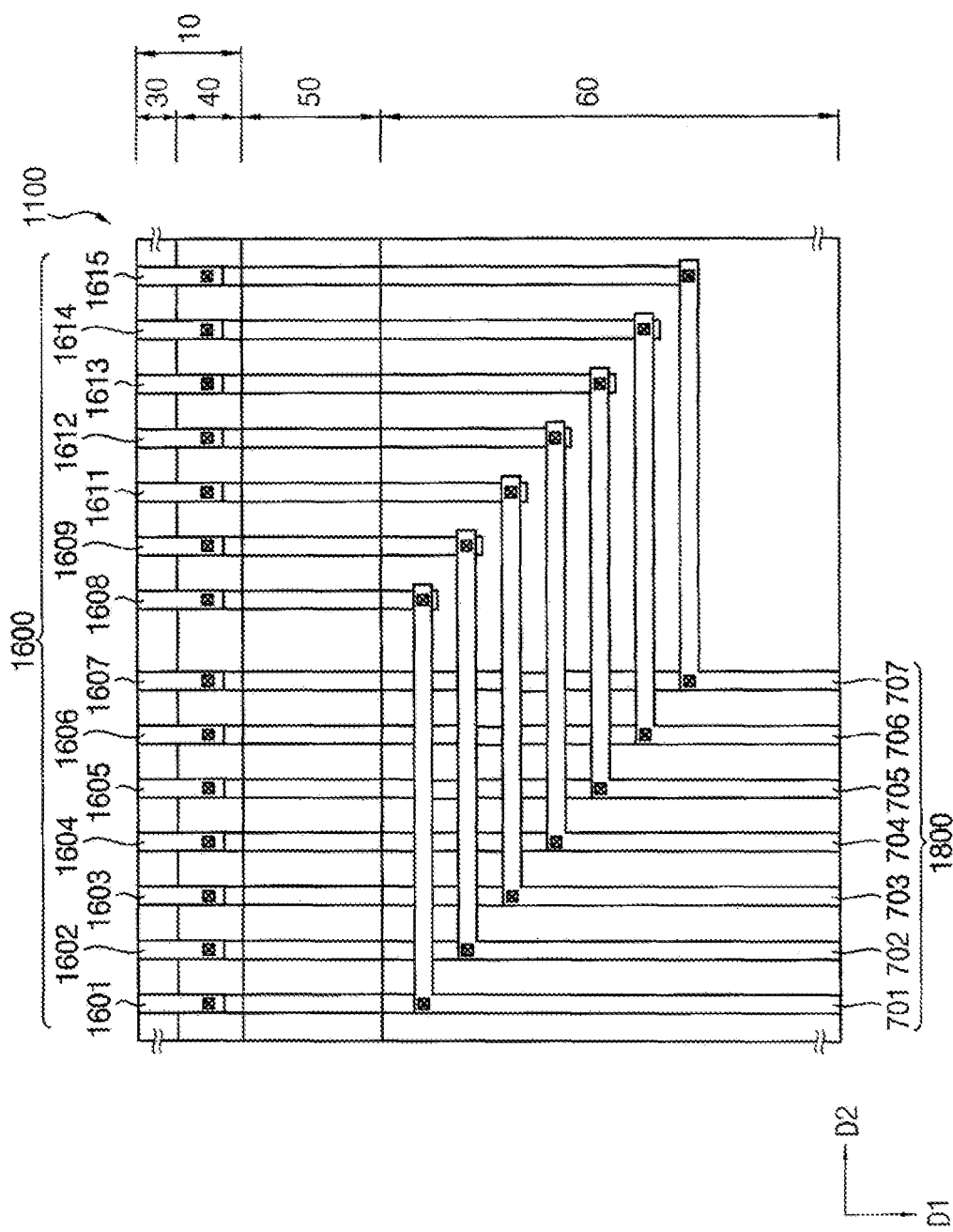

FIG. 21 is a plan view of an OLED device in accordance with an exemplary embodiment of the present invention. FIGS. 22, 23, and 24 are plan views of connection wirings, a connection structure, and touch screen wirings included in the OLED device of FIG. 21. For example, FIG. 22 is a plan view of connection wirings, and FIG. 23 is a plan view of a connection structure. FIG. 24 is a plan view of connection wirings, a connection structure, and touch screen wirings included in the OLED device. An OLED device 1100 illustrated in FIGS. 21, 22, 23, and 24 may have a configuration substantially the same as or similar to an that of the OLED device 100 described in more detail above with reference to FIGS. 1 through 8 except for touch screen wirings 1600, connection wirings 1900, and a connection structure 1800. Thus, duplicative descriptions for elements that are substantially the same as or similar to elements described above with reference to FIGS. 1 through 8 may be omitted below.

Referring to FIG. 21, an OLED device 1200 may include the display region 10, the bending region 50, and the pad region 60. The display region 10 may include the pixel region 30 and the peripheral region 40 surrounding the pixel region 30. A plurality of pixels PX may be disposed in the display region 10, and the pad region 60 may be spaced apart from the display region 10. Pad electrodes 470 that are electrically connected to an external device 101 may be disposed in the pad region 60. The bending region 50 may be disposed between the display region 10 and the pad region 60. The display region 10, the bending region 50, and the pad region 60 may be sequentially continuously arranged.

Referring to FIGS. 22, 23, and 24, a connection wiring 1900 may be disposed in the peripheral region 40, the bending region 50, and the pad region 60. In an exemplary embodiment of the present invention, the connection wiring 1900 may include first through fourteenth connection wirings 801, 802, 803, 804, 805, 806, 807, 808, 809, 811, 812, 813, 814, and 815. Touch screen wirings 1600 may be disposed in the pixel region 30 and the peripheral region 40. In an exemplary embodiment of the present invention, The touch screen wirings 1600 may include first through fourteenth touch screen wirings 1601, 1602, 1603, 1604, 1605, 1606, 1607, 1608, 1609, 1611, 1612, 1613, 1614, and 1615. A connection structure 1800 may be disposed in the pad region 60. The connection structure 1800 may be spaced apart from each of the other regions. Thus, the connection structure 1800 might not overlap the bending region 50 or the display region 10, for example. In an exemplary embodiment of the present invention, the connection structure 1800 may include first through seventh 701, 702, 703, 704, 705, 706, and 707. Each of the first through seventh connection electrodes may have a first extension extending in the first direction D1 and a second extension extending the second direction D2, and the first and second extensions may be integrally formed. Thus, the first and second extension may be a single continuous structure.

The connection wiring 1900 may be located under the touch screen wirings 1600 and the connection structure 1800, and the touch screen wirings 1600 and the connection structure 1800 may be located at the same layer.

Each of the first through fourteenth connection wirings 801, 802, 803, 804, 805, 806, 807, 808, 809, 811, 812, 813, 814, and 815 may be connected to the first through seventh connection electrodes 701, 702, 703, 704, 705, 706, and 707 in the pad region 60 via first through fourteenth contact holes 711, 712, 721, 722, 731, 732, 741, 742, 751, 752, 761, 762, 771, and 772.

Each of the first through fourteenth screen wirings 1601, 1602, 1603, 1604, 1605, 1606, 1607, 1608, 1609, 1611, 1612, 1613, 1614, and 1615 may be connected to the first through fourteen wirings 801, 802, 803, 804, 805, 806, 807, 808, 809, 811, 812, 813, 814, 815 in the peripheral region 40 via fifteenth through twenty-eighth contact holes 901, 902, 803.904, 905, 906, 907, 908, 909, 911, 912, 913, 914, and 915.

For example, the first and second contact holes 711 and 712 may be located in the first connection electrode 701, and each of the fifteenth and twenty-second contact holes 901 and 908 may be located in the first and eighth touch screen wirings 1601 and 1608. The first connection electrode 701 may electrically connect the first and eighth connection wirings 801 and 808 and the first and eighth touch screen wirings 1601 and 1608.

The third and fourth contact holes 721 and 722 may be located in the second connection electrode 702, and each of the sixteenth and twenty-third contact holes 902 and 909 may be located in the second and ninth touch screen wirings 1602, 1609. The second connection electrode 702 may electrically connect the second and ninth connection wirings 802 and 809 and the second and ninth touch screen wirings 1602 and 1609.

The fifth and sixth contact holes 731 and 732 may be located in the third connection electrode 703, and each of the seventeenth and the twenty-fourth contact holes 903 and 911 may be located in the third and tenth touch screen wirings 1603 and 1611. The third connection electrode 703 may electrically connect the third and tenth connection wirings 803 and 811 and the third and tenth touch screen wirings 1603 and 1611.

The seventh and eighth contact holes 741 and 742 may be located in the fourth connection electrode 704, and each of the eighteenth and the twenty-fifth contact holes 904 and 912 may be located in the fourth and eleventh touch screen wirings 1604 and 1612. The fourth connection electrode 704 may electrically connect the fourth and eleventh connection wirings 804 and 812 and the fourth and eleventh touch screen wirings 1604 and 1612.

The ninth and tenth contact holes 751 and 752 may be located in the fifth connection electrode 705, and each of the nineteenth and the twenty-sixth contact holes 905 and 913 may be located in the fifth and twelfth touch screen wirings 1605 and 1613. The fifth connection electrode 704 may electrically connect the fifth and twelfth connection wirings 805 and 813 and the fifth and twelfth touch screen wirings 1605 and 1613.

The eleventh and twelfth contact holes 761 and 762 may be located in the sixth connection electrode 706, and each of the twentieth and the twenty-seventh contact holes 906 and 914 may be located in the sixth and thirteenth touch screen wirings 1606 and 1614. The sixth connection electrode 706 may electrically connect the sixth and thirteenth connection wirings 806 and 814 and the sixth and thirteenth touch screen wirings 1606 and 1614.

The thirteenth and fourteenth contact holes 771 and 772 may be located in the seventh connection electrode 707, and each of the twenty-first and the twenty-eighth contact holes 907 and 915 may be located in the seventh and fourteenth touch screen wirings 1607 and 1615. The seventh connection electrode 707 may electrically connect the seventh and fourteenth connection wirings 807 and 815 and the seventh and fourteenth touch screen wirings 1607 and 1615.

Figure 25:
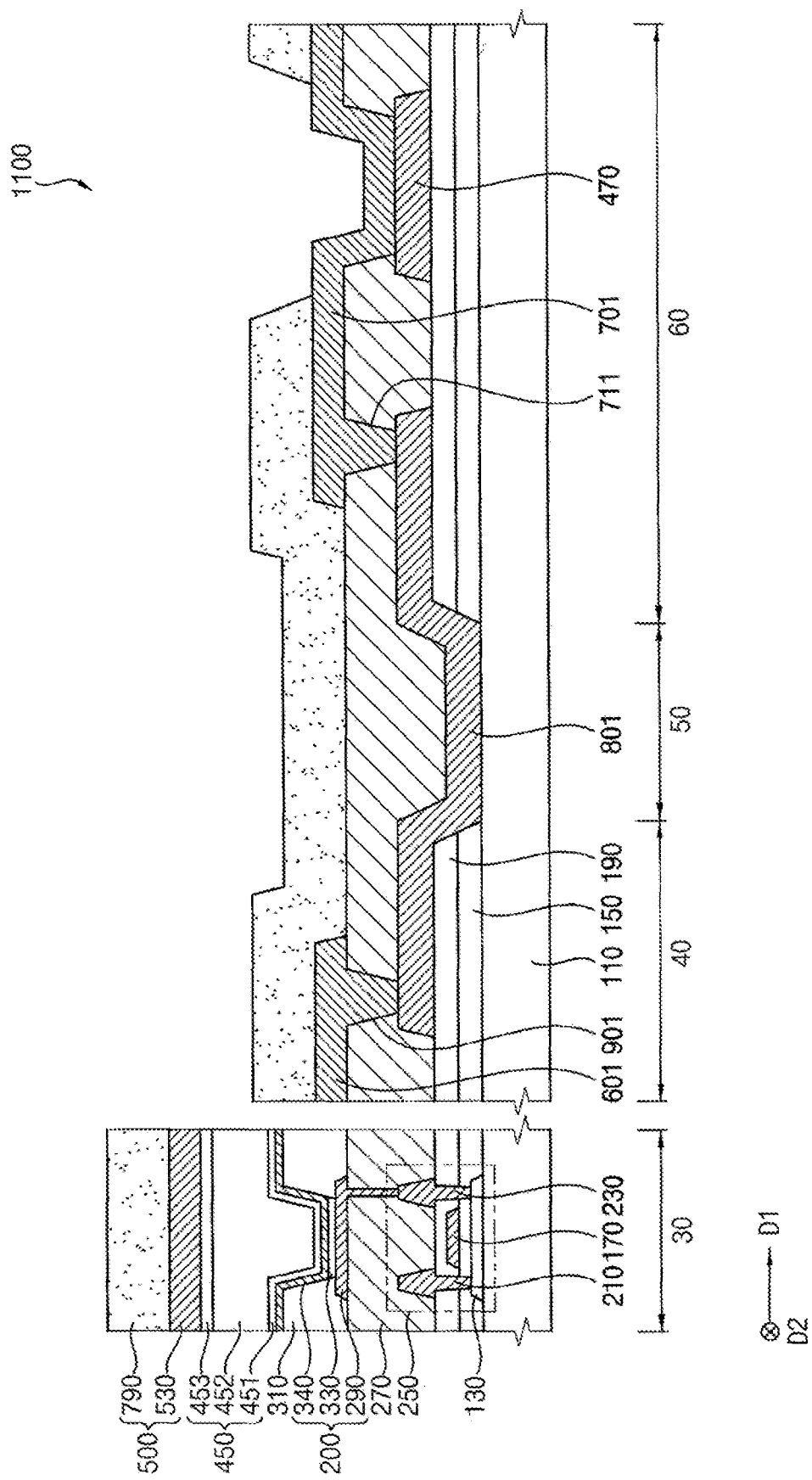
FIG. 25 is a cross-sectional view taken along a line II-III' of FIG. 21.
Figure 26:
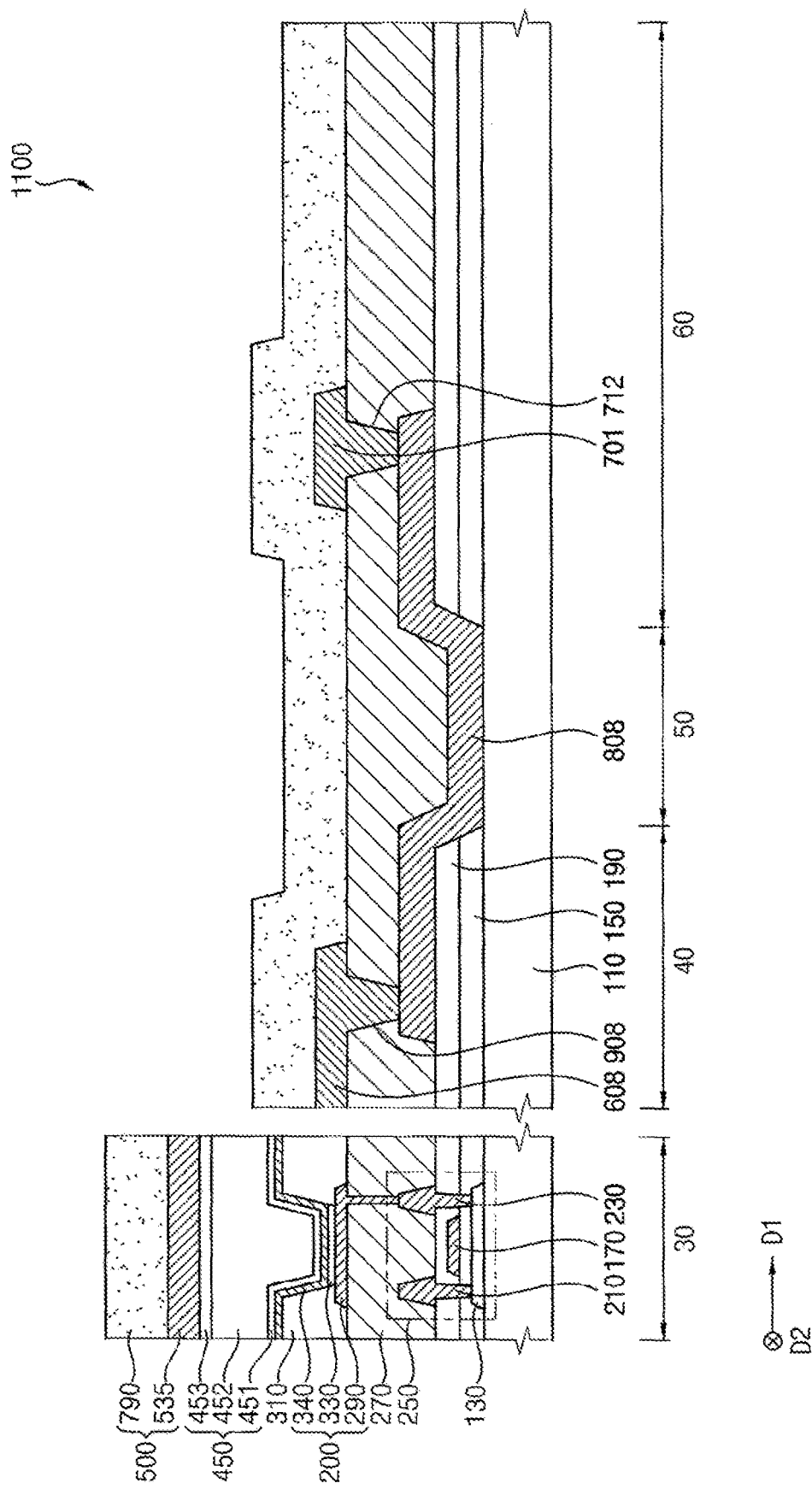
FIG. 26 is a cross-sectional view taken along a line IV-IV' of FIG. 21.

FIG. 25 is across-sectional view taken along a line III-III' of FIG. 21, and FIG. 26 is a cross-sectional view taken along a line IV-IV' of FIG. 21. An OLED device 1100 described with reference to FIGS. 25 and 26 may have a configuration substantially the same as or similar to that of the OLED device 100 described in more detail above with reference to FIGS. 9 and 10 except for touch screen wirings 1600, connection wirings 1900, and a connection structure 1800. Thus, duplicative descriptions for elements that are substantially the same as or similar to elements described above with reference to FIGS. 9 and 10 may be omitted below.

Referring to FIGS. 25 and 26, the OLED device 1100 may include the substrate 110, the semiconductor element 250, the planarization layer 270, the pad electrode 470, the pixel structure 200, the pixel defining layer 310, the TFE structure 450, the touch screen structure 500, the first touch screen wiring 1601, the second touch screen wiring 1608, the first connection wiring 801, the second connection wiring 808, and the connection structure 1800. The semiconductor element 250 may include the active layer 130, the gate insulation layer 150, the gate electrode 170, the insulating interlayer 190, the source electrode 210, and the drain electrode 230, and the connection structure 1800 may include the connection electrode 701. In addition, the pixel structure 200 may include the lower electrode 290, the light emitting layer 330, and the upper electrode 340, and the TFE structure 450 may include the first TFE layer 451, the second TFE layer 452, and the third TFE layer 453. Further, the touch screen structure 500 may include the first sensing electrode 530, the second sensing electrode 535, and the protective insulation layer 790. In an exemplary embodiment of the present invention, the first touch screen wiring 1601 described with reference to FIG. 25 may correspond to the first touch screen wiring 1601 described with reference to FIG. 24, and the second touch screen wiring 1608 described with reference to FIG. 25 may correspond to the eighth touch screen wiring 1608 described with reference to FIG. 24.

The first connection wiring 801 described with reference to FIG. 25 may correspond to the first connection wiring 801 described with reference to FIG. 22, and the second connection wiring 808 described with reference to FIG. 26 may correspond to the eighth connection wiring 808 described with reference to FIG. 22. The connection electrode 701 described with reference to FIGS. 25 and 26 may correspond to the first connection electrode 701 included in the connection structure 1800 described with reference to FIG. 24, and first, second, third, and fourth contact holes 711, 712, 901, and 906 described with reference to FIGS. 25 and 26 may respectively correspond to first, second, fifteenth, and twenty-second contact holes 711, 712, 901, and 908 described with reference to FIG. 23.

The first connection wiring 801 and the second connection wiring 808 may be disposed in a portion of the peripheral region 40, the bending region 50, and a portion of the pad region 60 on the substrate 110. The first connection wiring 801 and the second connection wiring 808 may be spaced apart from each other (e.g., in the second direction D2). Each of the first connection wiring 801 and the second connection wiring 808 may be disposed in the peripheral region 40 and the pad region 60 on the insulating interlayer 190, and may be in direct contact with an upper surface of the substrate 110 in the bending region 50. In an exemplary embodiment of the present invention, the OLED device 1100 may include an organic layer disposed between the first and second connection wirings 801 and 808 and the substrate 110 in the bending region 50. In this case, each of the first connection wiring 801 and the second connection wiring 808 need not be in contact with an upper surface of the substrate 110 in the bending region 50. Each of the first connection wiring 801 and the second connection wiring 808 may include a metal, an alloy of a metal, a metal nitride, a conductive metal oxide, or transparent conductive materials. These may be used alone or in combination thereof. In an exemplary embodiment of the present invention, each of the first connection wiring 801 and the second connection wiring 808 may have a multi-layered structure. Alternatively, each of the first connection wiring 801 and the second connection wiring 808 may have a single layer structure.

The first touch screen wiring 1601 and the second touch screen wiring 1608 may be disposed in the peripheral region 40 on the planarization layer 270. The first touch screen wiring 1601 and the second touch screen wiring 1608 may be spaced apart from each other (e.g., in the second direction D2). For example, the first touch screen wiring 1601 may be connected to the second sensing electrode 530, and the second touch screen wiring 1608 may be connected to the fifth sensing electrode 535 (see, e.g., FIGS. 4 and 6). The first touch screen wiring 1601 may be in direct contact with the first connection wiring 801 in the peripheral region 40 via the third contact hole 901, and the second touch screen wiring 1608 may be in direct contact with the second connection wiring 808 via the fourth contact hole 908. Each of the first touch screen wiring 1601 and the second touch screen wiring 1608 may include a metal, an alloy of a metal, a metal nitride, a conductive metal oxide, or transparent conductive materials. These may be used alone or in a combination thereof. In an exemplary embodiment of the present invention, each of the first touch screen wiring 1601 and the second touch screen wiring 1608 may have a multi-layered structure. Alternatively, each of the first touch screen wiring 1601 and the second touch screen wiring 1608 may have a single layer structure.

The connection electrode 701 may be disposed in the pad region 60 on the planarization layer 270. Referring to FIG. 25, the connection electrode 701 may be in direct contact with the first connection wiring 801 in the pad region 60 via the first contact hole 711, and may extend in the first direction D1 at the pad region 60. In addition, the connection electrode 701 may be in direct contact with the pad electrode 470. Referring to FIG. 26, the connection electrode 701 may extend in the second direction D2 at the pad region 60, and may be in direct contact with the second connection wiring 808 via the second contact hole 712 (see, e.g., FIG. 24).

Exemplary embodiments of the present invention may be applied to various display devices including an OLED device. For example, exemplary embodiments of the present invention may be applied to a vehicle-display device, a ship-display device, an aircraft-display device, a portable communication device, display devices for display or for information transfer, or a medical-display device.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. An organic light emitting display (OLED) device, comprising:
   a substrate having a display region including a pixel region and a peripheral region surrounding the pixel region, a pad region that is spaced apart from the display region, and a bending region that is disposed between the display region and the pad region;
   a plurality of pixel structures in the pixel region on the substrate;
   a touch screen structure on the plurality of pixel structures;
   a plurality of touch screen wirings in the pixel region and the peripheral region on the substrate, the touch screen wirings of the plurality of touch screen wirings electrically connected to the touch screen structure;
   a plurality of connection wirings in the peripheral region, the bending region, and the pad region on the substrate, the connection wirings of the plurality of connection wirings being connected to corresponding touch screen wirings of the plurality of touch screen wirings, wherein the plurality of connection wirings extend in a first direction from the peripheral region through the bending region to the pad region; and
   a connection structure in the pad region on the substrate, the connection structure electrically connecting connection wirings of the plurality of connection wirings to each other, wherein a same touch sensing signal among a plurality of touch sensing signals is applied to connection wirings of the plurality of connection wirings that are connected to each other,
   wherein the connection structure includes a plurality of connection electrodes, and wherein each of the connection electrodes of the plurality of connection electrodes includes:
a first extension extending in the first direction; and
a second extension extending in a second direction that is perpendicular to the first direction, the second extension being in contact with two different connection wirings that are spaced apart from each other by a plurality of other connection wirings.

2. The OLED device of claim 1, further comprising:
pad electrodes disposed in the pad region, the pad electrodes being spaced apart from the connection structure in a first direction,
wherein the pad electrodes are electrically connected to an external device.

3. The OLED device of claim 2, wherein the external device provides touch sensing signals to the touch screen structure through the pad electrodes.

4. The OLED device of claim 2, wherein each of the connection wirings of the plurality of connection wirings overlaps a portion of each of the plurality of touch screen wirings in the peripheral region located adjacent to the bending region.

5. The OLED device of claim 4, wherein each of the connection wirings of the plurality of connection wirings connects touch screen wirings of the plurality of touch screen wirings to each other through a contact hole.

6. The OLED device of claim 4, wherein touch screen wirings of the plurality of touch screen wirings are disposed directly on connection wirings of the plurality of connection wirings.

7. The OLED device of claim 2, wherein each of the connection wirings of the plurality of connection wirings overlaps a portion of each of the connection electrodes of the plurality of connection electrodes the in the pad region.

8. The OLED device of claim 7, wherein one connection electrode among the plurality of connection electrodes electrically connects connection wirings among the plurality of connection wirings to which the same touch sensing signal among the plurality of touch sensing signals is applied to each other, wherein the connection wirings among the plurality of connection wirings to which the same touch sensing signal among the plurality of touch sensing signals is applied are connected to each other via contact holes.

9. The OLED device of claim 8, wherein the one connection electrode is in direct contact with the connection wirings among the plurality of connection wirings to which the same touch sensing signal among the plurality of touch sensing signals is applied via at least two contact holes.

10. The OLED device of claim 8, wherein connection electrodes of the plurality of connection electrodes are disposed on connection wirings of the plurality of connection wirings.

11. The OLED device of claim 2, wherein the first extension of a connection electrode of the plurality of connection electrodes to which the same touch sensing signal among the plurality of touch sensing signals is applied extends in the first direction, and is in direct contact with a pad electrode of the pad electrodes.

* * * * *